United States Patent
Akiyama et al.

(10) Patent No.: US 11,872,605 B2
(45) Date of Patent: Jan. 16, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Katsuya Akiyama, Kyoto (JP); Yukifumi Yoshida, Kyoto (JP)

(73) Assignee: SCREEN Holdings Co., Ltd.

( * ) Notice: Subject to any disclaimer, the term of this patent is extended or adjusted under 35 U.S.C. 154(b) by 0 days.

(21) Appl. No.: 18/052,236

(22) Filed: Nov. 3, 2022

(65) Prior Publication Data

US 2023/0113052 A1    Apr. 13, 2023

Related U.S. Application Data

(62) Division of application No. 17/209,419, filed on Mar. 23, 2021, now Pat. No. 11,517,941.

(30) Foreign Application Priority Data

Mar. 24, 2020 (JP) ................. 2020-053309
Mar. 24, 2020 (JP) ................. 2020-053310

(51) Int. Cl.
*B08B 7/00* (2006.01)
*H01L 21/02* (2006.01)
(Continued)

(52) U.S. Cl.
CPC .............. *B08B 7/0014* (2013.01); *B08B 3/08* (2013.01); *B08B 3/10* (2013.01); *H01L 21/0206* (2013.01); *H01L 21/02068* (2013.01)

(58) Field of Classification Search
None
See application file for complete search history.

(56) References Cited

U.S. PATENT DOCUMENTS

| | | | |
|---|---|---|---|
| 9,105,696 | B1 | 8/2015 | Dow |
| 10,792,712 | B2 | 10/2020 | Yoshida |

(Continued)

FOREIGN PATENT DOCUMENTS

| | | |
|---|---|---|
| CN | 101840152 A | 9/2010 |
| JP | H07-130682 A | 5/1995 |

(Continued)

OTHER PUBLICATIONS

Office Action dated Mar. 29, 2022 in corresponding U.S. Appl. No. 17/209,419.

*Primary Examiner* — Eric W Golightly
*Assistant Examiner* — Arlyn I Rivera-Cordero
(74) *Attorney, Agent, or Firm* — OSTROLENK FABER LLP

(57) ABSTRACT

The substrate processing method includes a hydrophilization step of hydrophilizing a surface of a substrate, a processing liquid supplying step of supplying a processing liquid to the hydrophilized surface of the substrate, a processing film forming step in which the processing liquid supplied to the surface of the substrate is solidified or cured to form a processing film on the surface of the substrate, and a peeling step in which a peeling liquid is supplied to the surface of the substrate to peel the processing film from the surface of the substrate. The peeling step includes a penetrating hole forming step in which the processing film is partially dissolved in the peeling liquid to form a penetrating hole in the processing film.

7 Claims, 40 Drawing Sheets

(51) Int. Cl.
  B08B 3/10 (2006.01)
  B08B 3/08 (2006.01)

(56) References Cited

U.S. PATENT DOCUMENTS

| | | | |
|---|---|---|---|
| 11,020,776 B2 * | 6/2021 | Yoshida | H01L 21/67109 |
| 11,211,241 B2 | 12/2021 | Yoshida et al. | |
| 11,211,541 B2 | 12/2021 | Yoshida | |
| 2010/0159372 A1 | 6/2010 | Kanaoka | |
| 2010/0224215 A1 | 9/2010 | Mertens et al. | 134/6 |
| 2010/0233449 A1 | 9/2010 | Terai et al. | 428/195.1 |
| 2015/0064910 A1 * | 3/2015 | Kaneko | B05B 7/00 |
| | | | 156/345.24 |
| 2015/0128994 A1 | 5/2015 | Kaneko et al. | |
| 2015/0128995 A1 * | 5/2015 | Kaneko | C11D 11/0047 |
| | | | 134/4 |
| 2016/0035561 A1 | 2/2016 | Aibara et al. | |
| 2017/0345685 A1 | 11/2017 | Sekiguchi et al. | |
| 2019/0091737 A1 | 3/2019 | Yoshida | |
| 2019/0366394 A1 | 12/2019 | Yoshida et al. | |
| 2020/0194281 A1 | 6/2020 | Yoshida | |
| 2021/0237128 A1 * | 8/2021 | Yoshida | B08B 3/10 |
| 2022/0076941 A1 | 3/2022 | Yoshida | |

FOREIGN PATENT DOCUMENTS

| | | |
|---|---|---|
| JP | 2001-053050 A | 2/2001 |
| JP | 2005-052967 A | 3/2005 |
| JP | 2006-032416 A | 2/2006 |
| JP | 2009-158531 A | 7/2009 |
| JP | 2010-211153 A | 9/2010 |
| JP | 2010-212690 A | 9/2010 |
| JP | 2015-119164 A | 6/2015 |
| JP | 2016-036012 A | 3/2016 |
| JP | 201808474 A | 3/2018 |
| JP | 2019-212889 A | 12/2019 |
| JP | 2020-016699 A | 1/2020 |

* cited by examiner

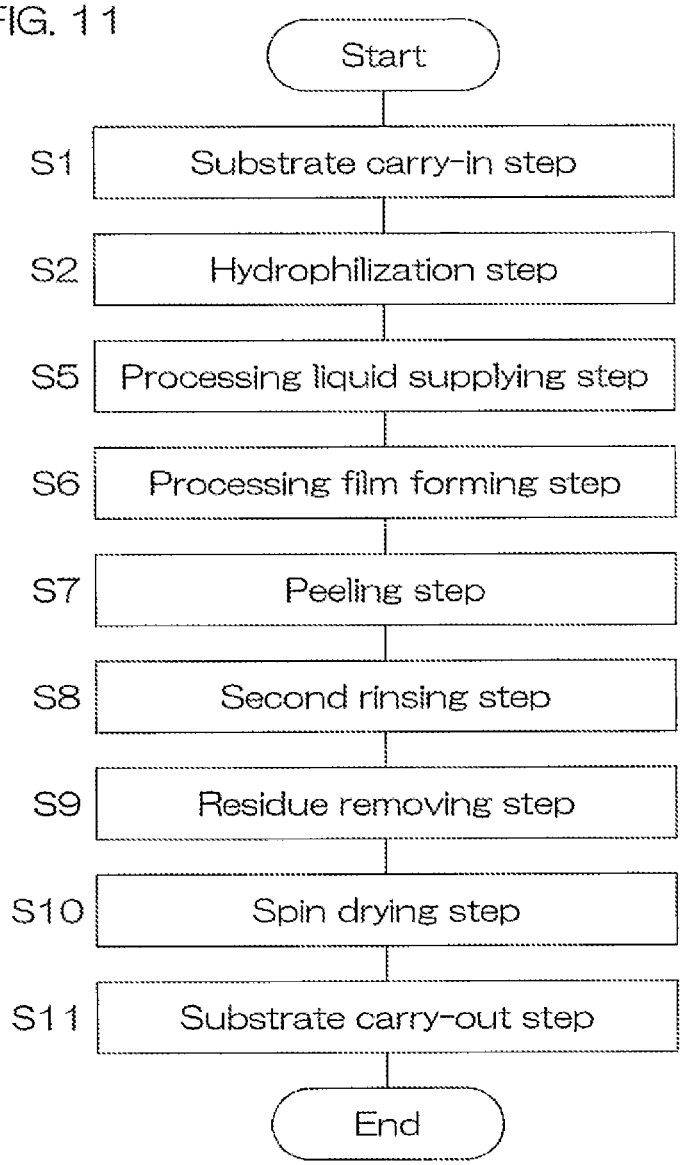

FIG. 13

| Front surface of substrate | Hydrophilizing liquid | Contact angle of pure water(°) | Peeling of processing film |
|---|---|---|---|
| SiN | HCl | 4.8 | OK |
| SiO2 | HF | 5.0 | OK |
| SiN | HF | 5.0 | OK |
| SiN | HF, HCl | 5.0 | OK |
| a-C | SPM | 5.3 | OK |
| Ru | SPM | 6.4 | OK |
| W | IPA | 7.0 | OK |
| TiN | HF | 15.2 | OK |
| Bare-Si | SC1 | 17.8 | OK |
| Co | IPA | 24.9 | OK |
| TiN | SC1 | 28.3 | OK |
| Cu | IPA | 32.7 | OK |
| TiN | IPA | 41.7 | NG |
| a-C | IPA | 49.9 | NG |
| Ru | SC1 | 55.8 | NG |
| Ru | IPA | 59.5 | NG |
| TiN | — | 59.6 | NG |
| Bare-Si | HF | 62.1 | NG |
| a-C | SC1 | 62.1 | NG |

FIG. 15

| Processing liquid | Contact angle of pure water(°) |
|---|---|
| PL1 | 60.3 |
| PL2 | 52.4 |
| PL3 | 57.9 |
| PL4 | 56.6 |

SUBSTRATE PROCESSING METHOD AND SUBSTRATE PROCESSING APPARATUS

CROSS REFERENCE TO RELATED APPLICATIONS

The present application is a Division of U.S. patent application Ser. No. 17/209,419, filed Mar. 23, 2021, now U.S. Pat. No. 11,517,941, issued on Dec. 6, 2022, which is based on Japanese Patent Application No. 2020-53310 filed on Mar. 24, 2020 and Japanese Patent Application No. 2020-53309 filed on Mar. 24, 2020, the contents of all of which are incorporated by reference herein.

BACKGROUND OF THE INVENTION

1. Field of the Invention

The present invention relates to a substrate processing method and a substrate processing apparatus for processing substrates. Examples of substrates to be processed include substrates such as semiconductor wafers, substrates for optical discs, substrates for magnetic discs, substrates for magneto-optical discs, substrates for photomasks, ceramic substrates, substrates for solar cells, and substrates for FPDs (Flat Panel Displays) such as liquid crystal display devices, plasma displays and organic EL (Electroluminescence) display devices, etc.

2. Description of the Related Art

In a manufacturing process of semiconductor devices, a step is executed in order to remove various types of contaminants adhered to a substrate, residue of a processing liquid or a resist, etc., used in a prior step, and various particles etc. (they may hereinafter be collectively referred to as "removal object.")

Specifically, it is general that deionized water (DIW), etc., is supplied to a substrate to remove a removal object by physical action of DIW, or that a chemical liquid which chemically reacts with the removal object is supplied to the substrate to chemically remove the removal object.

However, the pattern, having protrusions and recesses, formed on a substrate becomes finer and more complicated. Therefore, it is becoming more difficult to remove a removal object by using DIW or a chemical liquid, while suppressing damage to the pattern.

Thus, a method has been proposed in which a processing liquid is supplied to a surface of a substrate to solidify the processing liquid on the substrate, thereby forming a holding layer which holds a removal object present on the substrate, thereafter, a peeling liquid is supplied to an upper surface of the substrate, and the holding layer is peeled and removed from the surface of the substrate together with the removal object (refer to US Patent Application Publication No. 2019/091737).

SUMMARY OF THE INVENTION

In US Patent Application Publication No. 2019/091737, a peeling liquid entry path is formed by a peeling liquid, and the peeling liquid thereby enters a holding layer. However, there is a possibility that, depending on the condition of the surface of the substrate, the peeling liquid may not sufficiently enter an interface between the substrate and the holding layer, by which the peeling of the holding layer from the surface of the substrate is insufficient.

Therefore, there is a demand for a method for effectively peeling from a substrate a holding layer in a state of holding a removal object. Thus, one object of the present invention is to provide a substrate processing method and a substrate processing apparatus capable of effectively peeling from a surface of a substrate a processing film in a state of holding a removal object.

A preferred embodiment of the present invention provides a substrate processing method that includes a hydrophilization step of hydrophilizing a surface of a substrate, a processing liquid supplying step of supplying a processing liquid to the hydrophilized surface of the substrate, a processing film forming step in which the processing liquid supplied to the surface of the substrate is solidified or cured to form, on the surface of the substrate, a processing film which holds a removal object present on the surface of the substrate, and a peeling step in which a peeling liquid is supplied to the surface of the substrate, thereby peeling the processing film in a state of holding the removal object from the surface of the substrate. Therefore, the peeling step includes a penetrating hole forming step in which the processing film is partially dissolved in the peeling liquid to form a penetrating hole in the processing film.

The present inventors have found that, depending on the condition of a surface of a substrate, peeling action by which a peeling liquid peels a processing film from the substrate changes. Specifically, the higher the hydrophilicity of the surface of the substrate, the easier it is for the processing film to be peeled off by the peeling liquid. More specifically, the higher the hydrophilicity of the surface of the substrate, the easier it is for the peeling liquid to act on an interface between the processing film and the substrate, thus making it possible to effectively peel the processing film from the surface of the substrate.

Thus, if a method, in which a processing film is formed on a surface of a hydrophilized substrate to supply a peeling liquid toward the surface of the substrate on which the processing film is formed, is used, the processing film can be effectively peeled from the substrate.

Further, a penetrating hole is formed in the processing film by the peeling liquid supplied toward the surface of the substrate, by which the peeling liquid can reach the interface between the processing film and the substrate via the penetrating hole. Thereby, the peeling liquid acts on an interface between a portion of the processing film which surrounds the penetrating hole and the substrate. Therefore, in comparison to a method in which, with no penetrating hole formed in a processing film, through infiltration of a peeling liquid into the processing film, the peeling liquid reaches an interface between the processing film and the substrate, the peeling liquid can act quickly on the interface between the processing film and the substrate. Although the processing film is partially dissolved by the peeling liquid due to formation of the penetrating hole, a remaining portion thereof is kept in a solid state. Therefore, it is possible to effectively peel the processing film in a state of holding a removal object from the surface of the substrate.

In this way, while the peeling liquid acts quickly on the interface between the processing film and the substrate, a large portion of the processing film can be kept in a solid state. Therefore, it is possible to effectively peel the processing film from the substrate in a state of holding a removal object.

In a preferred embodiment of the present invention, the peeling step includes a peeling liquid entry step in which the peeling liquid enters between the surface of the substrate and the processing film.

The present inventors have found that the higher the hydrophilicity of a surface of a substrate, the higher the wettability (affinity) of a peeling liquid for the substrate, and the easier it is for the peeling liquid to enter between the substrate and the processing film. Thus, by a method in which a processing film is formed on a surface of a hydrophilized substrate to supply a peeling liquid toward the surface of the substrate in which the processing film is formed, the peeling liquid effectively enters between the substrate and the processing film. Thereby, it is possible to effectively peel the processing film from the surface of the substrate.

In a preferred embodiment of the present invention, the hydrophilization step includes a step in which a hydrophilizing liquid is supplied to the surface of the substrate to hydrophilize the surface of the substrate. The hydrophilizing liquid is supplied to the surface of the substrate, by which the hydrophilizing liquid spreads on the surface of the substrate, thus enabling the hydrophilizing liquid to spread over an entire surface of the substrate. Therefore, it is possible to uniformly hydrophilize the entire surface of the substrate. Since the entire surface of the substrate is hydrophilized, in a subsequent peeling step, the peeling liquid easily acts on the interface between the processing film and the substrate on the entire surface of the substrate. Therefore, it is possible to reduce uneven peeling of the processing film on the surface of the substrate.

In a preferred embodiment of the present invention, the hydrophilizing liquid is an oxidizing liquid or an organic solvent. Where these liquids are used as the hydrophilizing liquid, a hydrophobic organic substance present on the surface of the substrate is removed, thus making it possible to hydrophilize the surface of the substrate. Where an organic solvent is used as the hydrophilizing liquid, a hydrophobic organic substance present on the surface of the substrate is dissolved in the organic solvent to hydrophilize the surface of the substrate.

On the other hand, where an oxidizing liquid is used as the hydrophilizing liquid, a portion of the substrate near the surface thereof is oxidized. The portion of the substrate near the surface thereof is oxidized to improve the hydrophilicity of the surface of the substrate.

Where an oxidizing liquid is used as the hydrophilizing liquid, the surface of the substrate can be hydrophilized, regardless of whether an organic substance is present. In other words, even where an organic substance which is less likely to be dissolved by an organic solvent is present on the surface of the substrate, the surface of the substrate can be hydrophilized. Therefore, where an oxidizing liquid is used as the hydrophilizing liquid, it is possible to further enhance the hydrophilicity of the surface of the substrate.

In a preferred embodiment of the present invention, at least any one of Si, SiN, $SiO_2$, SiGe, Ge, SiCN, W, TiN, Co, Cu, Ru and amorphous carbon is exposed from the surface of the substrate. If these substances are exposed from the surface of the substrate, the surface of the substrate can be hydrophilized by the hydrophilization step.

In a preferred embodiment of the present invention, a surface layer of the substrate includes a TiN layer which is exposed from a surface of a substrate, and the hydrophilizing liquid is an oxidizing liquid. The oxidizing liquid such as hydrofluoric acid (HF, DHF) or ammonia hydrogen peroxide mixture (APM) is supplied as the hydrophilizing liquid to the surface of the substrate, by which an oxide film can be formed on the surface of the TiN layer. APM is also called SC1 (Standard Clean 1). The oxide film is formed on the surface of the TiN layer, by which the surface of the substrate can be hydrophilized.

In a preferred embodiment of the present invention, the hydrophilization step includes a contact angle reducing step in which the contact angle is reduced such that a contact angle of pure water for the surface of the substrate is smaller than 41.7°. The higher the hydrophilicity of the surface of the substrate, the smaller the contact angle of pure water for the surface of the substrate becomes. The present inventors have found that, where the contact angle of pure water for the surface of the substrate is smaller than 41.7°, a peeling liquid sufficiently acts on the interface between the substrate and the processing film.

Then, the surface of the substrate is hydrophilized to reduce the contact angle such that the contact angle of pure water for the surface of the substrate is smaller than 41.7°, thus enabling the peeling liquid to sufficiently act on the interface between the substrate and the processing film. Thereby, the processing film in a state of holding a removal object can be effectively peeled from the substrate.

In a preferred embodiment of the present invention, a contact angle of pure water for the processing film is larger than 52° and smaller than 61°. The present inventors have found that, where the contact angle of pure water for the processing film is larger than 52° and smaller than 61°, the peeling liquid sufficiently acts on the interface between the substrate and the processing film.

Thus, where the contact angle of pure water for the processing film is larger than 52° and smaller than 61°, the peeling liquid sufficiently acts on the interface between the substrate and processing film, thus making it possible to effectively peel the processing film.

In a preferred embodiment of the present invention, the processing liquid contains a solvent and a solute. The solute has a high solubility component and a low solubility component which is lower in solubility in the peeling liquid than the high solubility component. The processing film forming step includes a step which forms the processing film having a high solubility solid formed by the high solubility component and a low solubility solid formed by the low solubility component. Then, in the peeling step, the high solubility solid is dissolved in the peeling liquid to peel the processing film in a state of holding the removal object from the surface of the substrate.

According to the above-described method, the solubility of the high solubility component in the peeling liquid is higher than that of the low solubility component in the peeling liquid. Therefore, the high solubility solid formed by the high solubility component is more easily dissolved in the peeling liquid than the low solubility solid formed by the low solubility component.

Therefore, the peeling liquid is supplied to the surface of the substrate to dissolve the high solubility solid in the peeling liquid, by which a space is formed in the processing film. On the other hand, the low solubility solid is not dissolved in the peeling liquid but kept in a solid state.

Therefore, while the high solubility solid is dissolved in the peeling liquid, the low solubility solid is not dissolved in the peeling liquid but can be kept in a solid state. Accordingly, the peeling liquid passes through the space (gap, path) formed by dissolution of the high solubility solid and reaches an interface between the substrate and the low solubility solid.

Therefore, while a removal object is held by the low solubility solid, the peeling liquid acts on the interface between the low solubility solid and the substrate. As a result, while the processing film is quickly peeled from the substrate, the removal object can be removed efficiently from the substrate together with the processing film.

A preferred embodiment of the present invention provides a substrate processing method that includes a hydrophilization step of hydrophilizing a surface of a substrate, a processing liquid supplying step of supplying a processing liquid to the hydrophilized surface of the substrate, a processing film forming step in which the processing liquid supplied to the surface of the substrate is solidified or cured to form, on the surface of the substrate, a processing film which holds a removal object present on the surface of the substrate, and a peeling step in which a peeling liquid is supplied to the surface of the substrate to peel the processing film in a state of holding the removal object from the surface of the substrate, and that the hydrophilization step includes a contact angle reducing step in which the contact angle is reduced so that a contact angle of pure water for the surface of the substrate is smaller than 41.7°.

According to the above-described method, the processing film is formed on the hydrophilized surface of the substrate, and the peeling liquid is supplied toward the surface of the substrate on which the processing film is formed. As described previously, the higher the hydrophilicity of the surface of the substrate, the more easily the peeling liquid acts on an interface between the processing film and the substrate, and the processing film can be effectively peeled from the surface of the substrate. In this method, the surface of the substrate is hydrophilized so that the contact angle of pure water for the surface of the substrate is smaller than 41.7°. Therefore, the peeling liquid sufficiently acts on the interface between the substrate and the processing film. Thereby, it is possible to effectively peel from the substrate the processing film in a state of holding a removal object.

In a preferred embodiment of the present invention, the contact angle of pure water for the processing film is larger than 52° and smaller than 61°. Therefore, the peeling liquid sufficiently acts on the interface between the substrate and the processing film, and the processing film can be effectively peeled.

A preferred embodiment of the present invention provides a substrate processing method that includes a hydrophilization step of hydrophilizing a surface of a substrate, a processing liquid supplying step of supplying a processing liquid to the hydrophilized surface of the substrate, a processing film forming step in which the processing liquid supplied to the surface of the substrate is solidified or cured to form, on the surface of the substrate, a processing film which holds a removal object present on the surface of the substrate, and a peeling step in which a peeling liquid is supplied to the surface of the substrate to peel, from the surface of the substrate, the processing film in a state of holding the removal object, and that the processing liquid contains a solvent and a solute, and the solute has a high solubility component and a low solubility component lower in solubility in the peeling liquid than the high solubility component. In the substrate processing method, the processing film forming step includes a step which forms the processing film having a high solubility solid formed by the high solubility component and a low solubility solid formed by the low solubility component. Then, in the peeling step, the high solubility solid is dissolved in the peeling liquid to peel the processing film in a state of holding the removal object from the surface of the substrate.

According to the above-described method, the processing film is formed on the hydrophilized surface of the substrate, and the peeling liquid is supplied toward the surface of the substrate on which the processing film is formed. As described previously, the higher the hydrophilicity of the surface of the substrate is, the more easily the peeling liquid acts on the interface between the processing film and the substrate, and the processing film can be effectively peeled from the surface of the substrate. Therefore, it is possible to effectively peel the processing film from the substrate.

According to the above-described method, the solubility of the high solubility component in the peeling liquid is higher than that of the low solubility component in the peeling liquid. Therefore, the high solubility solid formed by the high solubility component is more easily dissolved in the peeling liquid than the low solubility solid formed by the low solubility component.

Therefore, the peeling liquid is supplied to the surface of the substrate to dissolve the high solubility solid in the peeling liquid, thereby forming a space in the processing film. On the other hand, the low solubility solid is not dissolved in the peeling liquid but kept in a solid state.

Therefore, while the high solubility solid is dissolved in the peeling liquid, the low solubility solid is not dissolved in the peeling liquid but can be kept in a solid state. Accordingly, the peeling liquid passes through the space (gap, path) formed by dissolution of the high solubility solid and can reach an interface between the substrate and the low solubility solid.

Therefore, while a removal object is held by the low solubility solid, the peeling liquid acts on the interface between the low solubility solid and the substrate. Thereby, it is possible to effectively peel from the substrate the processing film in a state of holding the removal object.

As a result, while the processing film is quickly peeled from the substrate, the removal object can be removed efficiently from the substrate together with the processing film.

In this substrate processing method, at least any one of Si, SiN, $SiO_2$, SiGe, Ge, SiCN, W, TiN, Co, Cu, Ru and amorphous carbon is exposed from the surface of the substrate. Where these substances are exposed from the surface of the substrate, the surface of the substrate can be hydrophilized by the hydrophilization step.

In this substrate processing method, the hydrophilization step includes the contact angle reducing step in which the contact angle is reduced such that a contact angle of pure water for the surface of the substrate is smaller than 41.7°. Therefore, the peeling liquid sufficiently acts on an interface between the substrate and the processing film. Thereby, it is possible to effectively peel from the substrate the processing film in a state of holding a removal object.

A preferred embodiment of the present invention provides a substrate processing apparatus that includes a hydrophilizing liquid supplying unit which supplies a hydrophilizing liquid, which hydrophilizes a surface of a substrate to the surface of the substrate, a processing liquid supplying unit which supplies a processing liquid to the surface of the substrate, a processing film forming unit in which the processing liquid in contact with the surface of the substrate is solidified or cured to form a processing film, a peeling liquid supplying unit which supplies a peeling liquid, which peels the processing film formed on the surface of the substrate, to the surface of the substrate, and a controller which controls the hydrophilizing liquid supplying unit, the processing liquid supplying unit, the processing film forming unit and the peeling liquid supplying unit.

Then, the controller that is included in the substrate processing apparatus is programmed such that the hydrophilizing liquid is supplied from the hydrophilizing liquid supplying unit to the surface of the substrate to hydrophilize the surface of the substrate, the processing liquid is supplied from the processing liquid supplying unit to the hydrophilized surface of the substrate, the processing liquid supplied to the surface of the substrate is solidified or cured by the processing film forming unit to form, on the surface of the substrate, a processing film which holds a removal object present on the surface of the substrate, a peeling liquid is supplied to the surface of the substrate from the peeling liquid supplying unit to peel the processing film in a state of holding the removal object from the surface of the substrate, and the processing film is partially dissolved by the peeling liquid to form a penetrating hole on the processing film.

According to the present configuration, the same effects as those of the above-described substrate processing method are obtained.

A preferred embodiment of the present invention provides a substrate processing apparatus that includes a hydrophilizing liquid supplying unit which supplies a hydrophilizing liquid, which hydrophilizes a surface of a substrate, to the surface of the substrate, a processing liquid supplying unit which supplies a processing liquid to the surface of the substrate, a processing film forming unit in which the processing liquid in contact with the surface of the substrate is solidified or cured to form a processing film, a peeling liquid supplying unit which supplies a peeling liquid, which peels the processing film formed on the surface of the substrate, to the surface of the substrate, and a controller which controls the hydrophilizing liquid supplying unit, the processing liquid supplying unit, the processing film forming unit and the peeling liquid supplying unit, and that the processing liquid contains a solvent and a solute, the solute has a high solubility component and a low solubility component lower in solubility in the peeling liquid than the high solubility component, and the processing film has a high solubility solid formed by the high solubility component and a low solubility solid formed by the low solubility component.

Then, the controller included in the substrate processing apparatus is programmed so that the hydrophilizing liquid is supplied from the hydrophilizing liquid supplying unit to the surface of the substrate to hydrophilize the surface of the substrate, the processing liquid is supplied from the processing liquid supplying unit to the hydrophilized surface of the substrate, the processing liquid supplied to the surface of the substrate is solidified or cured by the processing film forming unit to form, on the surface of the substrate, a processing film which holds a removal object present on the surface of the substrate, a peeling liquid is supplied from the peeling liquid supplying unit to the surface of the substrate to dissolve the high solubility solid in the peeling liquid, thereby peeling the processing film in a state of holding the removal object from the surface of the substrate.

According to the present configuration, the same effects as those of the above-described substrate processing method are obtained.

A preferred embodiment of the present invention provides a substrate processing method that includes a processing liquid supplying step which supplies a processing liquid toward a surface of a substrate, a processing film forming step in which the processing liquid supplied to the surface of the substrate is solidified or cured to form, on the surface of the substrate, a processing film which holds a removal object present on the surface of the substrate, a peeling removal step in which a peeling liquid is supplied toward the surface of the substrate, to partially dissolve the processing film in the peeling liquid, to peel the processing film in a state of holding the removal object from the surface of the substrate and to remove the peeled processing film outside the substrate, and a residue removing step in which, after the peeling removal step, a residue removing liquid is supplied toward the surface of the substrate to remove a residue of the processing film remaining on the surface of the substrate. The peeling liquid is a liquid mixture of an organic solvent and water, and the residue removing liquid is an organic solvent which is composed of the same substance as the organic solvent contained in the liquid mixture.

According to the above-described method, the processing liquid supplied to the surface of the substrate is solidified or cured to form the processing film which holds a removal object. Thereafter, the peeling liquid is supplied toward the surface of the substrate. The peeling liquid is supplied to partially dissolve the processing film, the processing film in a state of holding the removal object is peeled from the surface of the substrate, and the processing film which has been thus peeled is removed outside the substrate.

According to the above-described method, the peeling liquid is a liquid mixture of an organic solvent and water. The processing film is more easily dissolved in an organic solvent than in water. Therefore, the peeling liquid which is a liquid mixture of an organic solvent and water is less likely to dissolve the processing film than an organic solvent. Therefore, the processing film is partially dissolved by the peeling liquid to form a space (gap, path) in the processing film.

The peeling liquid can reach the surface of the substrate through the space. The peeling liquid which has reached the surface of the substrate acts on an interface between the processing film and the substrate. Therefore, in comparison to a method in which, with no space formed in the processing film, through infiltration of a peeling liquid into the processing film, the peeling liquid reaches the interface between the processing film and the substrate, a large amount of the peeling liquid quickly reaches the interface between the processing film and the substrate.

The processing film is more easily dissolved in an organic solvent than in water. Therefore, a liquid mixture of an organic solvent and water easily dissolves the processing film in comparison to water. Although the processing film is partially dissolved for formation of the space, a remaining portion thereof is kept in a solid state. Therefore, the peeling liquid appropriately dissolves a surface of the processing film, the portion of which is kept in a solid state. Therefore, the processing film in a state of holding a removal object can be effectively peeled from the surface of the substrate and removed from the substrate.

The peeling liquid is continuously supplied to remove the processing film from the surface of the substrate. There may be a case in which, even after the processing film has been removed from the surface of the substrate, a residue of the processing film adheres to the surface of the substrate. Even in this case, the residue of the processing film is removed by the residue removing liquid. Thereby, it is possible to satisfactorily clean the surface of the substrate.

According to the above-described method, the residue removing liquid is an organic solvent which is composed of the same substance as an organic solvent contained in a liquid mixture. That is, the organic solvent in the liquid mixture used as the peeling liquid and the organic solvent used as the residue removing liquid are the same organic compound. In comparison to a method in which the organic solvent in the liquid mixture used as the peeling liquid is a substance different from the organic solvent used as the residue removing liquid, types of the liquid to be used can be reduced. Therefore, it is possible to reduce costs necessary for removing a removal object from the substrate.

In a preferred embodiment of the present invention, the peeling removal step includes a step of forming a penetrating hole in the processing film by partially dissolving the processing film in the peeling liquid.

According to the above-described method, the peeling liquid forms the penetrating hole in the processing film. Therefore, the peeling liquid passes through the penetrating hole and reaches the surface of the substrate. The peeling liquid which has reached the surface of the substrate acts on an interface between a portion of the processing film which surrounds the penetrating hole and the substrate. Therefore, in comparison to a method in which, with no penetrating hole formed in a processing film, through infiltration of a peeling liquid into the processing film, the peeling liquid reaches an interface between the processing film and the substrate, a large amount of the peeling liquid quickly reaches the interface between the processing film and the substrate.

In a preferred embodiment of the present invention, the processing liquid contains a solvent and a solute which is dissolved by the solvent. The solute has a high solubility component and a low solubility component which is lower in solubility in the peeling liquid than the high solubility component. The processing film forming step includes a step which forms the processing film having a high solubility solid formed by the high solubility component and a low solubility solid formed by the low solubility component. Therefore, the peeling removal step includes a step in which the high solubility solid is dissolved in the peeling liquid to peel from the surface of the substrate the processing film in a state of holding the removal object.

According to the above-described method, the solubility of the high solubility component in the peeling liquid is higher than that of the low solubility component in the peeling liquid. Therefore, the high solubility solid formed by the high solubility component is more easily dissolved in the peeling liquid than the low solubility solid formed by the low solubility component. Therefore, the high solubility solid is dissolved by the peeling liquid to form a space in the processing film. On the other hand, the low solubility solid is not dissolved by the peeling liquid but kept in a solid state.

Therefore, while the high solubility solid is dissolved in the peeling liquid, the low solubility solid is not dissolved in the peeling liquid but can be kept in a solid state. Accordingly, the peeling liquid passes through the space formed by dissolution of the high solubility solid and reaches an interface between the substrate and the low solubility solid.

As a result, while a removal object is held by the low solubility solid, the peeling liquid acts on the interface between the low solubility solid and the substrate. Thereby, while the processing film is quickly peeled from the substrate, the removal object can be effectively removed from the substrate.

In a preferred embodiment of the present invention, the peeling removal step includes a peeling liquid entry step in which the peeling liquid enters between the surface of the substrate and the processing film. Therefore, the peeling liquid acts on an interface between the processing film and the substrate to more efficiently peel the processing film from the surface of the substrate.

In a preferred embodiment of the present invention, the peeling removal step includes a hydrophilization step which hydrophilizes the surface of the substrate by the peeling liquid.

The higher the hydrophilicity of an upper surface of the substrate, the more easily the peeling liquid acts on the interface between the substrate and the processing film, and the processing film can be effectively peeled from the surface of the substrate. Therefore, the surface of the substrate is hydrophilized by the peeling liquid and, thereby, the processing film can be effectively peeled.

In a preferred embodiment of the present invention, the organic solvent is IPA, and a mass percent concentration of IPA in the liquid mixture is not less than 12% and not more than 33%. Where the mass percent concentration of IPA in the liquid mixture is not less than 12% and not more than 33%, the surface of the processing film can be appropriately dissolved. Therefore, with no removal object detached from the processing film, the processing film in a state of holding the removal object can be peeled from the surface of the substrate.

In a preferred embodiment of the present invention, the substrate processing method further includes a prior hydrophilization step in which the surface of the substrate is hydrophilized prior to the supply of the processing liquid to the surface of the substrate.

According to the above-described method, prior to the supply of the processing liquid to the surface of the substrate, the surface of the substrate is hydrophilized. That is, the surface of the substrate is hydrophilized in advance. Therefore, the processing film is formed on the hydrophilized surface of the substrate. Accordingly, it is possible to effectively peel the processing film from the substrate by the peeling liquid.

A preferred embodiment of the present invention provides a substrate processing method that includes a processing liquid supplying step of supplying a processing liquid toward a surface of a substrate, a processing film forming step in which the processing liquid supplied to the surface of the substrate is solidified or cured to form, on the surface of the substrate, a processing film which holds a removal object present on the surface of the substrate, a penetrating hole forming step in which a dissolving liquid is supplied toward the surface of the substrate to partially dissolve the processing film in the dissolving liquid, thereby forming a penetrating hole in the processing film, and a peeling step in which a peeling liquid is supplied toward the surface of the substrate and, thereby, the peeling liquid passes through the penetrating hole to peel the processing film in a state of holding the removal object from the surface of the substrate.

According to the above-described method, the processing liquid supplied to the surface of the substrate is solidified or cured to form the processing film which holds the removal object. Thereafter, the dissolving liquid is supplied toward the surface of the substrate. Thereby, the processing film is partially dissolved to form the penetrating hole on the processing film. After that, the peeling liquid is supplied toward the surface of the substrate. Thereby, the peeling liquid passes through the penetrating hole and reaches an interface between the substrate and the peeling liquid, and the processing film in a state of holding the removal object is peeled from the surface of the substrate by the peeling liquid.

The penetrating hole is formed on the processing film by the dissolving liquid and, therefore, the peeling liquid reaches the surface of the substrate through the penetrating hole. The peeling liquid which has reached the surface of the substrate acts on an interface between a portion of the processing film which surrounds the penetrating hole and the substrate. Therefore, in comparison to a method in which, with no penetrating hole formed in the processing film, the peeling liquid passes through the processing film and the peeling liquid reaches an interface between the processing film and the substrate, a large amount of the peeling liquid quickly reaches the interface between the processing film and the substrate.

Although the processing film is partially dissolved for formation of the penetrating hole, a remaining portion thereof is kept in a solid state. Therefore, it is possible to effectively peel the processing film in a state of holding the removal object from the surface of the substrate.

Further, according to the above-described method, the formation of the penetrating hole and peeling of the processing film are executed by using different liquids (a dissolving liquid and a peeling liquid). Therefore, the peeling liquid and the dissolving liquid can be selected from liquids suitable for individual roles. That is, a liquid suitable for partial dissolution of the processing film can be selected as the dissolving liquid, and a liquid suitable for peeling of the processing film can be selected as the peeling liquid. Accordingly, it is possible to suppress dissolution of the processing film by the dissolving liquid and suppress detachment of a removal object from the processing film. Therefore, it is possible to effectively peel the processing film in a state of holding the removal object.

In a preferred embodiment of the present invention, the processing liquid contains a solvent and a solute which is dissolved by the solvent. The solute has a high solubility component and a low solubility component lower in solubility in the dissolving liquid than the high solubility component. The processing film forming step includes a step which forms the processing film which has a high solubility solid formed by the high solubility component and a low solubility solid formed by the low solubility component. Therefore, the penetrating hole forming step includes a step in which the high solubility solid is dissolved in the dissolving liquid to form the penetrating hole on the processing film.

According to the above-described method, the solubility of the high solubility component in the dissolving liquid is higher than that of the low solubility component in the dissolving liquid. Therefore, the high solubility solid formed by the high solubility component is more easily dissolved in the dissolving liquid than the low solubility solid formed by the low solubility component. Therefore, the high solubility solid is dissolved by the dissolving liquid to form the penetrating hole on the processing film. On the other hand, the low solubility solid is not dissolved in the dissolving liquid but kept in a solid state.

Therefore, while the high solubility solid is dissolved in the dissolving liquid, the low solubility solid can be kept in a solid state without being dissolved in the dissolving liquid. Accordingly, the peeling liquid reaches an interface between the substrate and the low solubility solid through the penetrating hole formed by dissolution of the high solubility solid.

As a result, while the removal object is held by the low solubility solid, the peeling liquid acts on the interface between the low solubility solid and the substrate. The processing film is, thereby, quickly peeled from the substrate and the removal object can be effectively removed from the substrate, together with the processing film.

In a preferred embodiment of the present invention, the peeling step includes a peeling liquid entry step in which the peeling liquid enters between the surface of the substrate and the processing film. Therefore, the peeling liquid acts on an interface between the processing film and the substrate, and the processing film can be more efficiently peeled from the surface of the substrate.

In a preferred embodiment of the present invention, the peeling liquid is a liquid mixture of an organic solvent and water. The processing film is more easily dissolved in an organic solvent and less likely to be dissolved in water. Where the peeling liquid is a liquid mixture of an organic solvent and water, with a removal object held, the surface of the processing film can be slightly dissolved to such an extent that the processing film can be peeled from the surface of the substrate. For example, where the organic solvent is IPA and the mass percent concentration of IPA in the liquid mixture is not less than 12% and not more than 33%, the surface of the processing film can be appropriately dissolved. Therefore, the processing film in a state of holding the removal object can be peeled from the surface of the substrate, with no removal object detached from the processing film.

In a preferred embodiment of the present invention, the substrate processing method further includes a removal step in which, even after the peeling of the processing film from substrate, the peeling liquid is continuously supplied to the surface of the substrate and the processing film which has been peeled from the surface of the substrate is thereby removed outside the substrate, and a residue removing step in which, after the removal step, a residue removing liquid is supplied toward the surface of the substrate, thereby removing a residue of the processing film remaining on the surface of the substrate. Then, the residue removing liquid is an organic solvent which is composed of the same substance as the organic solvent in the liquid mixture.

According to the above-described method, the peeling liquid is continuously supplied to remove the processing film from the surface of the substrate. There may be a case in which, even after removal of the processing film from the surface of the substrate, a residue of the processing film adheres to the surface of the substrate. Even in this case, the residue of the processing film can be removed by the residue removing liquid. Thereby, it is possible to satisfactorily clean the surface of the substrate.

According to the above-described method, the residue removing liquid is an organic solvent which is composed of the same substance as an organic solvent in a liquid mixture. That is, the organic solvent in the liquid mixture used as the peeling liquid and the organic solvent used as the residue removing liquid are the same organic compound. In comparison to a case in which the organic solvent in the liquid mixture used as the peeling liquid is different from the organic solvent used as the residue removing liquid, it is possible to reduce types of the liquid to be used. Therefore, it is possible to reduce costs necessary for removing the removal object from the substrate.

In a preferred embodiment of the present invention, the substrate processing method further includes a removal step in which, even after the processing film has been peeled from the substrate, the peeling liquid is continuously supplied to the surface of the substrate, thereby removing the processing film which has been peeled from the surface of the substrate outside the substrate and a residue removing step in which, after the removal step, a residue removing liquid is supplied to the surface of the substrate, thereby removing a residue of the processing film remaining on the surface of the substrate.

According to the above-described method, the peeling liquid is continuously supplied to remove the processing film outside the substrate. There may be a case in which, even after removal of the processing film from the surface of the substrate, a residue of the processing film adheres to the surface of the substrate. Even in this case, the residue of the processing film is removed by the residue removing liquid. Thereby, it is possible to satisfactorily clean the surface of the substrate.

In a preferred embodiment of the present invention, the peeling step includes a hydrophilization step which hydrophilizes the surface of the substrate by the peeling liquid.

According to the above-described method, the surface of the substrate is hydrophilized by the peeling liquid. Therefore, a portion of the surface of the substrate which is exposed by formation of a penetrating hole is hydrophilized by the peeling liquid and at the same time, the peeling liquid also acts on an interface between a portion of the processing film which surrounds the penetrating hole and the substrate. Accordingly, the processing film in a state of holding the removal object can be effectively peeled from the surface of the substrate.

In a preferred embodiment of the present invention, the substrate processing method further includes a hydrophilization step in which, before the peeling step, a hydrophilizing liquid is supplied toward the surface of the substrate and, thereby, the hydrophilizing liquid passes through the penetrating hole to hydrophilize the surface of the substrate.

According to the above-described method, the hydrophilizing liquid is supplied toward the surface of the substrate. The hydrophilizing liquid passes through the penetrating hole and reaches the surface of the substrate, thereby hydrophilizing a portion of the surface of the substrate which is exposed by formation of the penetrating hole.

The higher the hydrophilicity of the upper surface of the substrate, the more easily the peeling liquid acts on an interface between the substrate and the processing film, and the processing film can be effectively peeled from the surface of the substrate. Therefore, if a portion of the surface of the substrate which is exposed by formation of the penetrating hole is hydrophilized before the supply of the peeling liquid toward the surface of the substrate, the peeling liquid acts on an interface between a portion of the processing film which surrounds the penetrating hole and the substrate, and the processing film can thereby be effectively peeled.

In a preferred embodiment of the present invention, the hydrophilizing liquid is an oxidizing liquid which oxidizes the surface of the substrate. Where the oxidizing liquid is used as the hydrophilizing liquid, a portion of the substrate near the surface thereof (surface layer) is oxidized. The surface layer of the substrate is oxidized, by which oxygen atoms bond to a substance exposed from the surface of the substrate. Oxygen atoms bond to the substance exposed from the surface of the substrate, thereby hydrophilizing the surface of the substrate.

In a preferred embodiment of the present invention, the dissolving liquid, the hydrophilizing liquid and the peeling liquid contain a substance which is different from each other.

In a preferred embodiment of the present invention, the peeling liquid and the dissolving liquid contain a substance which is different from each other.

In a preferred embodiment of the present invention, the dissolving liquid is an alkaline liquid.

In a preferred embodiment of the present invention, the substrate processing method further includes a prior hydrophilization step in which, prior to the supply of the processing liquid to the surface of the substrate, the surface of the substrate is hydrophilized.

According to the above-described method, prior to the supply of the processing liquid to the surface of the substrate, that is, the surface of the substrate is hydrophilized in advance. The processing film is, therefore, formed on the hydrophilized surface of the substrate. Accordingly, it is possible to effectively peel the processing film from the substrate by the peeling liquid.

A preferred embodiment of the present invention provides a substrate processing method that includes a processing liquid supplying step of supplying a processing liquid toward a surface of a substrate, a processing film forming step in which the processing liquid supplied to the surface of the substrate is solidified or cured to form, on the surface of the substrate, a processing film which holds a removal object present on the surface of the substrate, a dissolving step in which a dissolving liquid is supplied toward the surface of the substrate and the processing film is partially dissolved in the dissolving liquid, and a peeling step in which, after the dissolving step, a peeling liquid is supplied toward the surface of the substrate and the processing film in a state of holding the removal object is thereby peeled from the surface of the substrate by the peeling liquid, and that the processing liquid contains a solvent and a solute which is dissolved by the solvent, the solute has a high solubility component and a low solubility component lower in solubility in the dissolving liquid than the high solubility component, the processing film forming step includes a step which forms the processing film having a high solubility solid formed by the high solubility component and a low solubility solid formed by the low solubility component, and the dissolving step includes a step which dissolves the high solubility solid in the dissolving liquid.

According to the above-described method, the processing liquid supplied to the surface of the substrate is solidified or cured to form a processing film which holds a removal object. After that, the dissolving liquid is supplied toward the surface of the substrate. Thereby, the processing film is partially dissolved to form a space inside the processing film. After that, the peeling liquid is supplied to the surface of the substrate. Thereby, the peeling liquid passes through the space inside the processing film and reaches an interface between the substrate and the peeling liquid. The processing film in a state of holding the removal object is peeled from the surface of the substrate by the peeling liquid.

The solubility of the high solubility component in the dissolving liquid is higher than that of the low solubility component in the dissolving liquid. Therefore, the high solubility solid formed by the high solubility component is more easily dissolved in the dissolving liquid than the low solubility solid formed by the low solubility component. Accordingly, the high solubility solid is dissolved by the dissolving liquid to form a space in the processing film. On the other hand, the low solubility solid is not dissolved in the peeling liquid but kept in a solid state.

Therefore, while the high solubility solid is dissolved in the dissolving liquid, the low solubility solid can be kept in a solid state without being dissolved in the dissolving liquid. Accordingly, the peeling liquid passes through the space formed by dissolution of the high solubility solid and reaches an interface between the substrate and the low solubility solid.

As a result, while a removal object is held by the low solubility solid, the peeling liquid acts on the interface between the low solubility solid and the substrate. Thereby, the processing film is quickly peeled from the substrate, and the removal object can be effectively removed from the substrate, together with the processing film.

Further, according to the above-described method, the dissolution of the high solubility solid and the peeling of the processing film are carried out by different liquids (a dissolving liquid and a peeling liquid). Therefore, each of the peeling liquid and the dissolving liquid can be selected from liquids suitable for individual roles. That is, a liquid suitable for partial dissolution of the high solubility solid can be selected as the dissolving liquid, and a liquid suitable for the peeling of the processing film can be selected as the peeling liquid.

For example, if a liquid having a larger difference in solubility between the high solubility solid and the low solubility solid than the peeling liquid is used as the dissolving liquid, it is possible to suppress loss of the low solubility solid by the dissolving liquid and suppress detachment of a removal object from the low solubility solid. Therefore, it is possible to effectively peel the processing film in a state of holding the removal object.

A preferred embodiment of the present invention provides a substrate processing apparatus that includes a processing liquid supplying unit which supplies a processing liquid to a surface of a substrate, a processing film forming unit in which the processing liquid in contact with the surface of the substrate is solidified or cured to form a processing film, a peeling liquid supplying unit which supplies a peeling liquid, which peels the processing film formed on the surface of the substrate, to the surface of the substrate, a residue removing liquid supplying unit which supplies, a residue removing liquid, which removes a residue of the processing film present on the surface of the substrate, to the surface of the substrate, and a controller which controls the processing liquid supplying unit, the processing film forming unit, the peeling liquid supplying unit and the residue removing liquid supplying unit.

Then, the controller is programmed so that a processing liquid is supplied to the substrate from the processing liquid supplying unit, the processing liquid supplied toward the surface of the substrate is solidified or cured by the processing film forming unit to form, on the surface of the substrate, a processing film which holds a removal object present on the surface of the substrate, the peeling liquid is supplied toward the substrate from the peeling liquid supplying unit, thereby partially dissolving the processing film in the peeling liquid, the processing film in a state of holding the removal object is peeled from the surface of the substrate, the peeled processing film is removed outside the substrate, and a residue removing liquid is supplied toward the surface of the substrate from the residue removing liquid supplying unit, thereby removing a residue of the processing film remaining on the surface of the substrate. Further, the peeling liquid is a liquid mixture of an organic solvent and water, and the residue removing liquid is an organic solvent which is composed of the same substance as the organic solvent in the liquid mixture.

According to the present apparatus, the same effects as those of the above-described substrate processing method are obtained.

A preferred embodiment of the present invention provides a substrate processing apparatus that includes a processing liquid supplying unit which supplies a processing liquid to a surface of a substrate, a processing film forming unit in which the processing liquid in contact with the surface of the substrate is solidified or cured to form a processing film, a dissolving liquid supplying unit which supplies a dissolving liquid which partially dissolves the processing film formed on the surface of the substrate, to the surface of the substrate, a peeling liquid supplying unit which supplies, to the surface of the substrate, a peeling liquid for peeling the processing film formed on the surface of the substrate, and a controller which controls the processing liquid supplying unit, the processing film forming unit, the dissolving liquid supplying unit and the peeling liquid supplying unit.

Then, the controller is programmed so that a processing liquid is supplied to the substrate from the processing liquid supplying unit, the processing liquid supplied toward the surface of the substrate is solidified or cured by the processing film forming unit to form, on the surface of the substrate, a processing film which holds a removal object present on the surface of the substrate, a dissolving liquid is supplied toward the substrate from the dissolving liquid supplying unit, thereby partially dissolving the processing film in the dissolving liquid to form a penetrating hole on the processing film, a peeling liquid is supplied toward the substrate from the peeling liquid supplying unit and the peeling liquid passes through the penetrating hole, by which the processing film in a state of holding the removal object is peeled from the surface of the substrate.

According to the present apparatus, the same effects as those of the above-described substrate processing method are obtained.

A preferred embodiment of the present invention provides a substrate processing apparatus that includes a processing liquid supplying unit which supplies a processing liquid to a surface of a substrate, a processing film forming unit in which the processing liquid in contact with the surface of the substrate is solidified or cured to form a processing film, a dissolving liquid supplying unit which supplies a dissolving liquid which partially dissolves the processing film formed on the surface of the substrate, to the surface of the substrate, a peeling liquid supplying unit which supplies, to the surface of the substrate, a peeling liquid for peeling the processing film formed on the surface of the substrate, and a controller which controls the processing liquid supplying unit, the processing film forming unit, the dissolving liquid supplying unit and the peeling liquid supplying unit, and that the processing liquid contains a solvent and a solute which is dissolved by the solvent, and the solute has a high solubility component and a low solubility component lower in solubility in the peeling liquid supplied from the peeling liquid supplying unit than the high solubility component.

Further, the controller included in the substrate processing apparatus is programmed so that the processing liquid is supplied toward the substrate from the processing liquid supplying unit, the processing liquid supplied to the surface of the substrate is solidified or cured by the processing film forming unit to form, on the surface of the substrate, a processing film which has a high solubility solid formed by the high solubility component and a low solubility solid formed by the low solubility component and holds a removal object present on the surface of the substrate, the dissolving liquid is supplied toward the substrate from the dissolving liquid supplying unit, the high solubility solid of the processing film is dissolved by the dissolving liquid, the peeling liquid is supplied toward the substrate from the peeling liquid supplying unit, and the processing film in a state of holding the removal object is peeled from the surface of the substrate.

According to the present apparatus, the same effects as those of the above-described substrate processing method are obtained.

The aforementioned and other objects, features, and effects of the present invention will be clarified by the following description of preferred embodiments, with reference to the accompanying drawings.

BRIEF DESCRIPTION OF THE DRAWINGS

FIG. 11 is a flowchart for describing another example of the substrate processing by the substrate processing apparatus.

FIG. 13 is a table which shows a contact angle of pure water for the surface of the experimental substrate and whether the processing film is peeled off by a peeling liquid.

FIG. 15 is a table which shows the contact angle of pure water for the surface of the processing film.

DETAILED DESCRIPTION OF THE PREFERRED EMBODIMENTS

<Configuration of Substrate Processing Apparatus According to First Preferred Embodiment>

Figure 1:
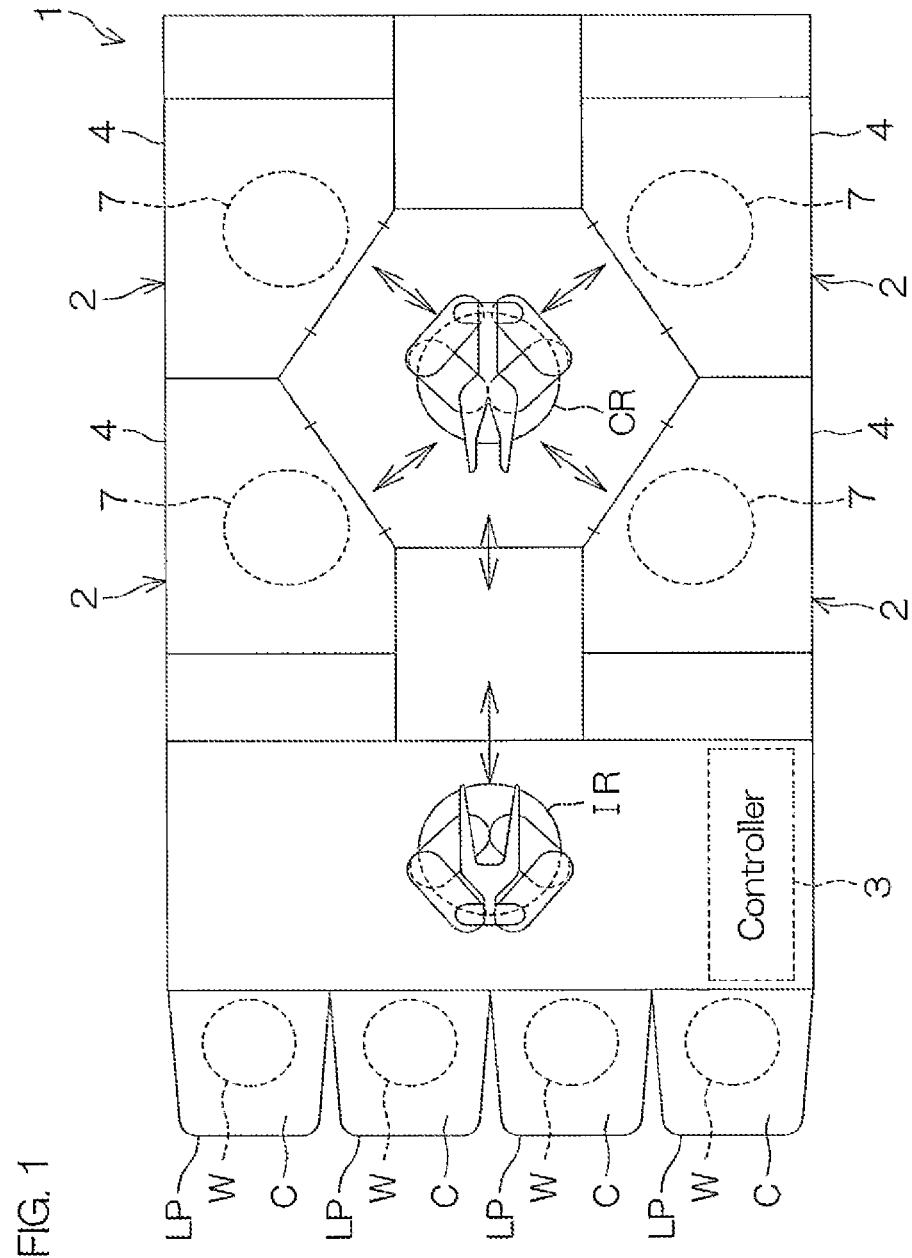
FIG. 1 is a schematic plan view which shows a layout of a substrate processing apparatus according to a first preferred embodiment of the present invention.

FIG. 1 is a schematic plan view which shows a layout of a substrate processing apparatus 1 according to a preferred embodiment of the present invention.

The substrate processing apparatus 1 is a single substrate processing type apparatus that processes a substrate W such as a silicon wafer, etc., one at a time. In the present preferred embodiment, the substrate W is a disc-shaped substrate.

As the substrate W, there may be used a substrate in which, at least any one of Si (silicon), SiN (silicon nitride), $SiO_2$ (silicon oxide), SiGe (silicon germanium), Ge (germanium), SiCN (silicon carbonitride), W (tungsten), TiN (titanium nitride), Co (cobalt), Cu (copper), Ru (ruthenium) and a-C (amorphous carbon), is exposed on the surface thereof. That is, only one type of the above substances may be exposed on the surface of the substrate W or, of the above-described substances, plural types of them may be exposed.

The substrate processing apparatus 1 includes a plurality of processing units 2 for processing substrates W with fluids, load ports LP on which are placed carriers C that house a plurality of the substrates W to be processed by the processing units 2, transfer robots IR and CR that transfer the substrates W between the load ports LP and the processing units 2, and a controller 3 which controls the substrate processing apparatus 1.

The transfer robot IR transfers the substrates W between the carriers C and the transfer robot CR. The transfer robot CR transfers the substrates W between the transfer robot IR and the processing units 2. The plurality of processing units 2 have, for example, the same configuration. Although the details will be described later, processing fluids supplied to the substrate W inside the processing unit 2 include a hydrophilizing liquid, a rinse liquid, a replacing liquid, a processing liquid, a peeling liquid, a residue removing liquid, a dissolving liquid, a heating medium, an inert gas (a gas), etc.

Each processing unit 2 includes a chamber 4 and a processing cup 7 disposed inside the chamber 4 and executes processing of the substrate W inside the processing cup 7. An inlet/outlet (not shown) for carrying-in the substrate W and carrying-out the substrate W by the transfer robot CR is formed at the chamber 4. The chamber 4 is provided with a shutter unit (not shown) for opening and closing the inlet/outlet.

Figure 2:
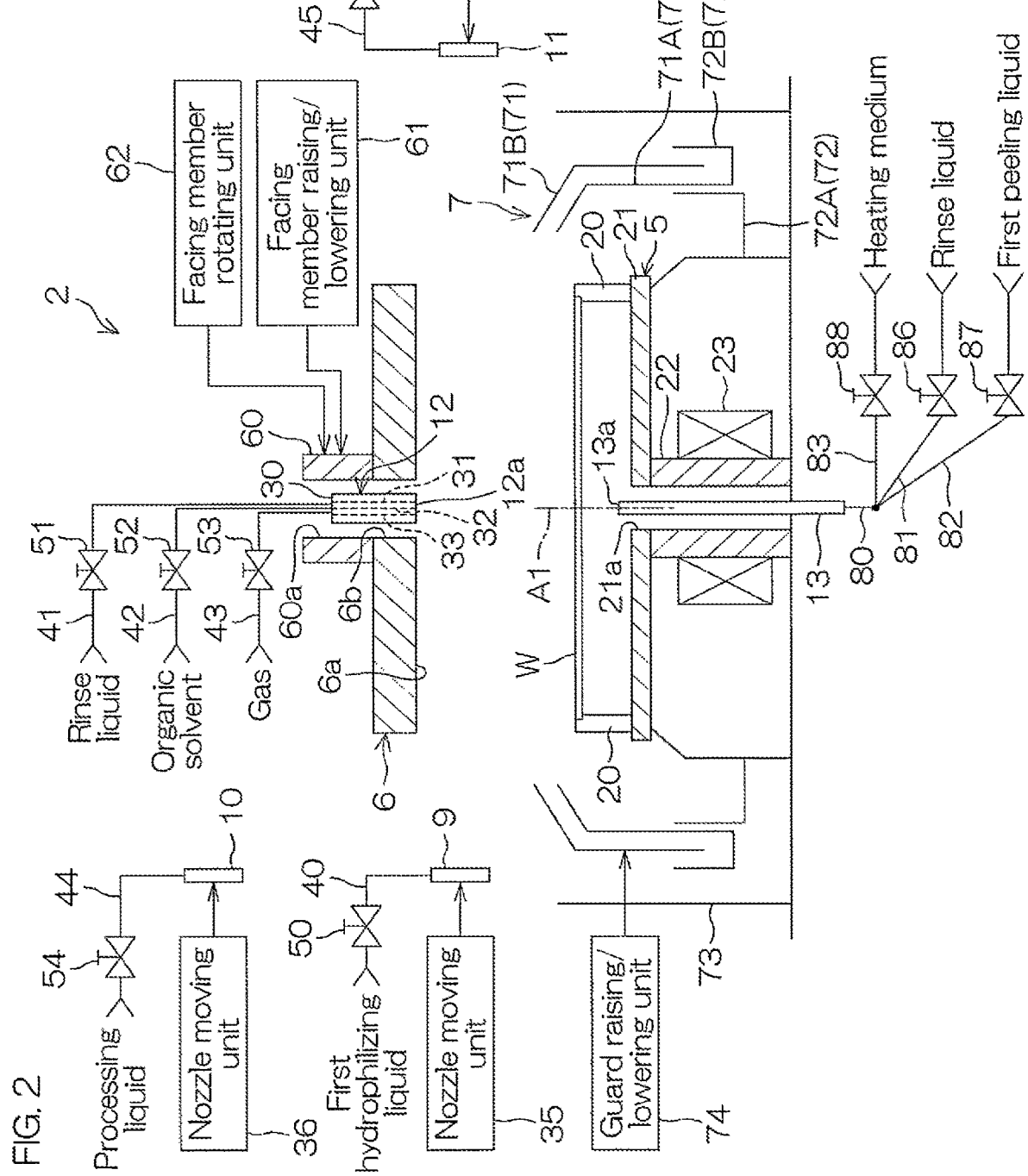
FIG. 2 is a schematic partial sectional view which shows a general configuration of a processing unit included in the substrate processing apparatus.

FIG. 2 is a schematic view for describing an configuration example of the processing unit 2. The processing unit 2 includes a spin chuck 5, a facing member 6, a processing cup 7, a first moving nozzle 9, a second moving nozzle 10, a third moving nozzle 11, a central nozzle 12 and a lower surface nozzle 13.

The spin chuck 5 is an example of a substrate holding/rotating unit which rotates the substrate W around a rotation axis A1 (a vertical axis) while holding the substrate W horizontally. The rotation axis A1 is a vertical straight line passing through a central portion of the substrate W. The spin chuck 5 includes a plurality of chuck pins 20, a spin base 21, a rotating shaft 22 and a spin motor 23.

The spin base 21 has a disc shape oriented along a horizontal direction. On an upper surface of the spin base 21, a plurality of chuck pins 20 which grip a peripheral edge of the substrate W are disposed at intervals in a circumferential direction of the spin base 21. The spin base 21 and the plurality of chuck pins 20 form a substrate holding unit which holds the substrate W horizontally. The substrate holding unit is also referred to as a substrate holder.

The rotating shaft 22 extends in a vertical direction along the rotation axis A1. An upper end portion of the rotating shaft 22 is coupled to a lower surface center of the spin base 21. The spin motor 23 applies a rotating force to the rotating shaft 22. The spin base 21 is rotated by the rotating shaft 22 being rotated by the spin motor 23. The substrate W is thereby rotated around the rotation axis A1. The spin motor 23 is an example of a substrate rotating unit which rotates the substrate W around the rotation axis A1.

The spin chuck 5 is not limited to a sandwiching type chuck which allows the plurality of chuck pins 20 to be in contact with a circumferential edge surface of the substrate W but may also include a vacuum type chuck by which a lower surface of the substrate W is adsorbed on an upper surface of the spin base 21 to hold the substrate W horizontally.

The facing member 6 faces the substrate W held by the spin chuck 5 from above. The facing member 6 is formed in a disc shape having the diameter substantially equal to, or larger than the substrate W. The facing member 6 has a facing surface 6a which faces an upper surface (surface on the upper side) of the substrate W. The facing surface 6a is disposed substantially along a horizontal surface higher than the spin chuck 5.

A hollow shaft 60 is fixed to the facing member 6 at an opposite side to the facing surface 6a. A communicating hole 6b which penetrates up and down through the facing member 6 is formed at a portion of the facing member 6 which overlaps with the rotation axis A1 in plan view. The communicating hole 6b communicates with an internal space 60a of the hollow shaft 60.

The facing member 6 blocks an atmosphere inside a space between the facing surface 6a and the upper surface of the substrate W from an atmosphere outside the space. Therefore, the facing member 6 is also referred to as a blocking plate.

The processing unit 2 further includes a facing member raising/lowering unit 61 which drives raising and lowering of the facing member 6 and a facing member rotating unit 62 which rotates the facing member 6 around the rotation axis A1.

The facing member raising/lowering unit 61 is capable of moving the facing member 6 at any position (height) from a lower position to an upper position in a vertical direction. The lower position is a position within a movable range of the facing member 6 at which the facing surface 6a is positioned closest to the substrate W. The upper position is a position within the movable range of the facing member 6 at which the facing surface 6a is separated farthest from the substrate W. When the facing member 6 is positioned at the upper position, the transfer robot CR accesses the spin chuck 5 for carrying-in and carrying-out the substrate W.

The facing member raising/lowering unit 61 includes, for example, a ball-screw mechanism (not shown) coupled to a supporting member (not shown) which supports the hollow shaft 60 and an electric motor (not shown) which applies a driving force to the ball-screw mechanism. The facing member raising/lowering unit 61 is also referred to as a facing member lifter (blocking plate lifter). The facing member rotating unit 62 includes a motor (not shown) which rotates, for example, the hollow shaft 60.

The processing cup 7 includes a plurality of guards 71 which receive a liquid splashed outside from the substrate W held by the spin chuck 5, a plurality of cups 72 which receive a liquid guided downward by the plurality of guards 71 and a circular-cylindrical outer wall member 73 which surrounds the plurality of guards 71 and the plurality of cups 72.

In the present preferred embodiment, an example where two guards 71 (a first guard 71A and a second guard 71B) and two cups 72 (a first cup 72A and a second cup 72B) are provided is shown.

Each of the first cup 72A and the second cup 72B has an annular groove shape which is opened upward.

The first guard 71A is disposed so as to surround the spin base 21. The second guard 71B is disposed so as to surround the spin base 21 at further outside than the first guard 71A.

Each of the first guard 71A and the second guard 71B has a substantially circular-cylindrical shape. An upper end portion of each of the guards 71 is inclined inward so as to be directed toward the spin base 21.

The first cup 72A receives a liquid guided downward by the first guard 71A. The second cup 72B is formed integral to the first guard 71A to receive a liquid guided downward by the second guard 71B.

The processing unit 2 includes a guard raising/lowering unit 74 which raises and lowers each of the first guard 71A and the second guard 71B separately in a vertical direction. The guard raising/lowering unit 74 raises and lowers the first guard 71A between the lower position and the upper position. The guard raising/lowering unit 74 raises and lowers the second guard 71B between the lower position and the upper position.

When the first guard 71A and the second guard 71B are both positioned at the upper position, a liquid splashed from the substrate W is received by the first guard 71A. When the first guard 71A is positioned at the lower position and the second guard 71B is positioned at the upper position, a liquid splashed from the substrate W is received by the second guard 71B. When the first guard 71A and the second guard 71B are both positioned at the lower position, the transfer robot CR accesses the spin chuck 5 for carrying-in and carrying-out the substrate W.

The guard raising/lowering unit 74 includes, for example, a first ball-screw mechanism (not shown) coupled to the first guard 71A, a first motor (not shown) which applies a driving force to the first ball-screw mechanism, a second ball-screw mechanism (not shown) coupled to the second guard 71B, and a second motor (not shown) which applies a driving force to the second ball-screw mechanism. The guard raising/lowering unit 74 is also referred to as a guard lifter.

The first moving nozzle 9 is an example of a hydrophilizing liquid nozzle (hydrophilizing liquid supplying unit) which supplies (discharges) a hydrophilizing liquid toward the upper surface of the substrate W held by the spin chuck 5.

The first moving nozzle 9 is moved in a horizontal direction and in a vertical direction by a first nozzle moving unit 35. The first moving nozzle 9 is capable of moving between a center position and a home position (retract position) in the horizontal direction. When positioned at the center position, the first moving nozzle 9 faces a central region of the upper surface of the substrate W. The central region of the upper surface of the substrate W is a region that includes a rotation center of the substrate W and a periphery thereof on the upper surface of the substrate W.

When positioned at the home position, the first moving nozzle 9 does not face the upper surface of the substrate W but is positioned outside the processing cup 7 in plan view. By moving in the vertical direction, the first moving nozzle 9 can move close to the upper surface of the substrate W and retract upward from the upper surface of the substrate W.

The first nozzle moving unit 35 includes, for example, an arm (not shown) which is coupled to the first moving nozzle 9 and extends horizontally, a turning shaft (not shown) which is coupled to the arm and extends along the vertical direction and a turning shaft driving unit (not shown) which raises, lowers and turns the turning shaft.

The turning shaft driving unit turns the turning shaft around a vertical turning axis, thereby swinging the arm. Further, the turning shaft driving unit raises and lowers the turning shaft along the vertical direction, thereby raising and lowering the arm. The first moving nozzle 9 moves in the horizontal direction and in the vertical direction in accordance with the swinging and raising/lowering of the arm.

The first moving nozzle 9 is connected to a hydrophilizing liquid piping 40 which guides a hydrophilizing liquid. When a hydrophilizing liquid valve 50 interposed in the hydrophilizing liquid piping 40 is opened, the hydrophilizing liquid is discharged continuously downward from the first moving nozzle 9. When the first moving nozzle 9 is positioned at a central position and the hydrophilizing liquid valve 50 is opened, the hydrophilizing liquid is supplied to the central region of the upper surface of the substrate W.

The hydrophilizing liquid discharged from the first moving nozzle 9 is, for example, an oxidizing liquid such as hydrofluoric acid (HF, DHF), an ammonia-hydrogen peroxide mixture (SC1) and a sulfuric acid/hydrogen peroxide mixture (SPM), an organic solvent such as isopropyl alcohol (IPA), and a first hydrophilizing liquid such as hydrochloric acid (HCl). The hydrophilizing liquid is a liquid for hydrophilizing (enhancing hydrophilicity of) the surface of the substrate W.

The oxidizing liquid is a liquid which contains a substance (oxidizing agent) having an oxidation power. For example, SC1 contains hydrogen peroxide as an oxidizing agent, and hydrofluoric acid contains hydrogen fluoride as an oxidizing agent. SPM contains persulfuric acid as an oxidizing agent.

Hydrophilicity means an affinity for water. Hydrophilicity is also referred to as wettability. A contact angle is given for indicating hydrophilicity. The contact angle is such that an extent of swelling of a droplet (height of liquid) formed when a liquid is dropped on a certain solid is expressed in numerals. Specifically, the contact angle is an angle formed between a liquid surface and a solid surface, when the liquid adhering to the surface of the solid is viewed from the side. The larger the contact angle is, the lower the wettability of the surface of the solid is. The smaller the contact angle is, the higher the wettability of the surface of the solid is.

Figure 3:
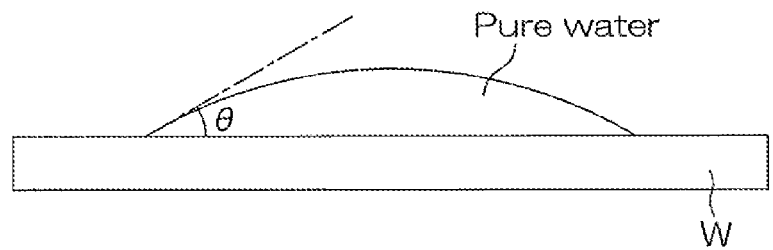
FIG. 3 is a schematic view which shows a droplet of pure water on a substrate and a periphery thereof.

FIG. 3 is a schematic view which shows a droplet of pure water on the substrate W and a periphery thereof. As shown in FIG. 3, a contact angle θ of pure water for the surface of the substrate W is preferably larger than 0° and smaller than 41.7°. In the present preferred embodiment, DIW is used as pure water. Where the contact angle of pure water for the surface of the substrate W is larger than 0° and smaller than 41.7°, a processing film (described later) is easily peeled from the surface of the substrate W by a peeling liquid (described later). The contact angle θ of pure water for the surface of the substrate W is more preferably larger than 0° and not more than 36.0°. The contact angle θ of pure water for the surface of the substrate W is even more preferably larger than 0° and not more than 32.7°.

Figure 4A:
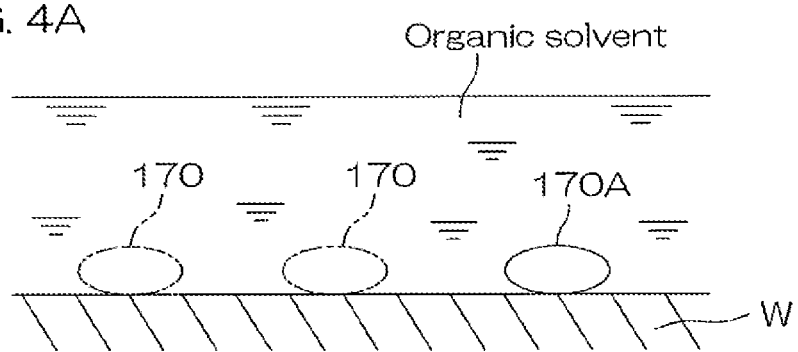
FIG. 4A is a schematic view for describing conditions of a surface of a substrate which is hydrophilized by an organic solvent.
Figure 4B:
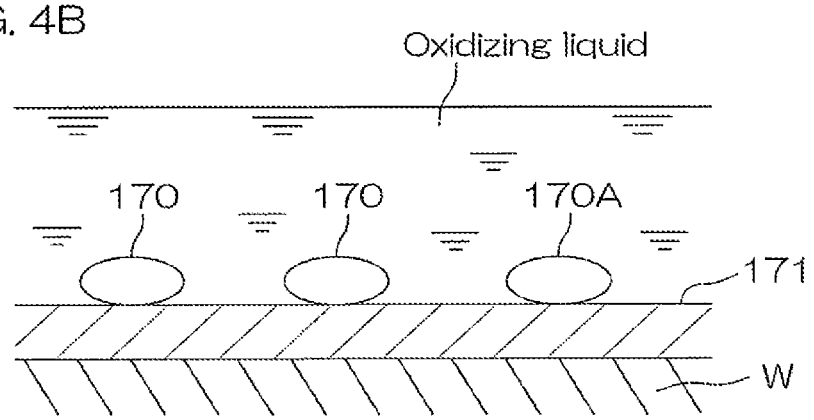
FIG. 4B is a schematic view for describing conditions of the surface of the substrate which is hydrophilized by an oxidizing liquid.

Next, a description will be given of conditions in which the surface of the substrate W is hydrophilized. FIG. 4A and FIG. 4B are each a schematic view for describing conditions in which the surface of the substrate W is hydrophilized by a first hydrophilizing liquid.

Where an organic solvent such as IPA is used as the first hydrophilizing liquid, a hydrophobic organic substance 170 adhering to the surface of the substrate W is removed, thereby hydrophilizing the surface of the substrate W. Specifically, as shown in FIG. 4A, the hydrophobic organic substance 170 present on the surface of the substrate W is dissolved in an organic solvent to hydrophilize the surface of the substrate W. Therefore, there may be a case in which an organic substance 170A which is less likely to be dissolved in the first hydrophilizing liquid remains on the surface of the substrate W. Accordingly, hydrophilization by an organic solvent is influenced by the type of the organic substance 170 present on the surface of the substrate W.

An organic substance is one of a removal objects present on the surface of the substrate W, and even removal of the organic substance by an organic solvent will not realize a sufficient removal of the removal object. Therefore, even where the surface of the substrate W is hydrophilized by the organic solvent, as described later, it is necessary to remove the removal object by peeling a processing film.

On the other hand, where an oxidizing liquid such as hydrofluoric acid and SC1 is used as the first hydrophilizing liquid, as shown in FIG. 4B, the surface of the substrate W is oxidized to form an oxide film 171 on the surface of the substrate W. Due to oxidization of the surface of the substrate W, oxygen atoms bond to a substance exposed from the surface of the substrate W. Oxygen atoms bond to the substance exposed from the surface of the substrate W, thereby improving the hydrophilicity of the surface of the substrate W.

Where an oxidizing liquid is used as the first hydrophilizing liquid, regardless of whether the organic substance 170 is present, it is possible to hydrophilize the surface of the substrate W. In other words, even where the organic substance 170A which is less likely to be dissolved by an organic solvent is present on the surface of the substrate W, it is possible to hydrophilize the surface of the substrate W. Therefore, the use of the oxidizing liquid as the first hydrophilizing liquid enhances more efficiently the hydrophilicity of the surface of the substrate W than the use of the organic solvent as the first hydrophilizing liquid.

Where the substrate W has the surface from which at least any one of Si, SiN, $SiO_2$, SiGe, Ge, SiCN, W, TiN, Co, Cu, Ru and a-C is exposed, the surface can be hydrophilized by the first hydrophilizing liquid. Where the substrate W has the surface from which at least any one of Si, SiN, $SiO_2$, W, TiN, Co, Cu, Ru and a-C in particular is exposed, the surface is easily hydrophilized by the first hydrophilizing liquid, and where the substrate W has the surface from which any one of Si, SiN, $SiO_2$, W, TiN, Co and Cu is exposed, the surface is more likely to be hydrophilized by the first hydrophilizing liquid.

Again, with reference to FIG. 2, the second moving nozzle 10 is an example of a processing liquid nozzle (processing liquid supplying unit) which supplies (discharges) a processing liquid toward the upper surface of the substrate W held by the spin chuck 5.

The second moving nozzle 10 is moved in the horizontal direction and in the vertical direction by the second nozzle moving unit 36. The second moving nozzle 10 moves in the horizontal direction between the center position and the home position (retract position). The second moving nozzle 10 faces the central region of the upper surface of the substrate W when positioned at the center position.

When positioned at the home position, the second moving nozzle 10 does not face the upper surface of the substrate W and is positioned outside the processing cup 7 in plan view. The second moving nozzle 10 moves close to the upper surface of the substrate W or retracts upward from the upper surface of the substrate W by moving in the vertical direction.

The second nozzle moving unit 36 has the same configuration as the first nozzle moving unit 35. That is, the second nozzle moving unit 36 may include an arm (not shown) which is coupled to the second moving nozzle 10 and extends horizontally, a turning shaft (not shown) coupled to the arm and extends along the vertical direction and a turning shaft driving unit (not shown) which raises, lowers and turns the turning shaft.

The second moving nozzle 10 is connected to a processing liquid piping 44 which guides a processing liquid. When a processing liquid valve 54 interposed in the processing liquid piping 44 is opened, the processing liquid is continuously discharged downward from the second moving nozzle 10. When the second moving nozzle 10 is positioned at the central position and the processing liquid valve 54 is opened, the processing liquid is supplied to the central region of the upper surface of the substrate W.

The processing liquid contains a solute and a solvent. The processing liquid undergoes solidification or curing by volatilization (evaporation) of at least a portion of the solvent contained in the processing liquid. The processing liquid is solidified or cured on the substrate W to form a solid processing film which holds a removal object such as particles, etc., present on the substrate W.

Here, "solidification" refers, for example, to hardening of the solute due to forces acting between molecules or between atoms, etc., in association with volatilization of the solvent. "Curing" refers, for example, to hardening of the solute due to a chemical change such as polymerization, crosslinking, etc. Therefore, "solidification or curing" expresses "hardening" of the solute due to various causes.

The processing liquid contains, as the solute, a low solubility component and a high solubility component.

The processing liquid discharged from the second moving nozzle 10 may contain a corrosion preventive component. Although the details will be described later, the corrosion preventive component is, for example, BTA (benzotriazole).

As the low solubility component and the high solubility component, there may be used a substance which is different from each other in solubility in a peeling liquid which will be described later. The low solubility component is, for example, novolac. The high solubility component is, for example, 2,2-bis(4-hydroxyphenyl)propane.

The solvent contained in the processing liquid may be a liquid which dissolves the low solubility component and the high solubility component. The solvent contained in the processing liquid is preferably a liquid having compatibility (miscible) with a peeling liquid. Compatibility is a property in which two types of liquids are mutually dissolved and mixed.

The processing film is mainly composed of a low solubility component in a solid state and a high solubility component in a solid state. The solvent may remain in the processing film. Details of each of the components contained in the processing liquid (solvent, low solubility component, high solubility component and corrosion preventive component) will be described later.

Where the contact angle of pure water for the processing film is larger than 52° and smaller than 61°, the peeling liquid which will be described later fully acts on an interface between the substrate W and the processing film. The use of the processing liquid which will be described later forms the processing film with the contact angle of pure water larger than 52° and smaller than 61°.

The third moving nozzle 11 is an example of a peeling liquid nozzle (peeling liquid supplying unit) which continuously supplies (discharges) a peeling liquid such as ammonia water toward the upper surface of the substrate W held by the spin chuck 5. The peeling liquid is a liquid for peeling the processing film in a state of holding a removal object from the upper surface of the substrate W.

The third moving nozzle 11 is moved in the horizontal direction and in the vertical direction by a third nozzle moving unit 37. The third moving nozzle 11 moves between the center position and the home position (retract position) in the horizontal direction.

When positioned at the center position, the third moving nozzle 11 faces the central region of the upper surface of the substrate W. When positioned at the home position, the third moving nozzle 11 does not face the upper surface of the substrate W and is positioned outside the processing space 7 in plan view. The third moving nozzle 11 moves close to the upper surface of the substrate W and retracts upward from the upper surface of the substrate W by moving in the vertical direction.

The third nozzle moving unit 37 has the same configuration as the first nozzle moving unit 35. That is, the third nozzle moving unit 37 may include an arm (not shown) which is coupled to the third moving nozzle 11 and extends horizontally, a turning shaft (not shown) which is coupled to the arm and extends along the vertical direction and a turning shaft driving unit (not shown) which raises, lowers and turns the turning shaft.

The third moving nozzle 11 is connected to an upper peeling liquid piping 45 which guides a peeling liquid to the third moving nozzle 11. When an upper peeling liquid valve 55 interposed in the upper peeling liquid piping 45 is opened, the peeling liquid is continuously discharged downward from a discharge port of the third moving nozzle 11. When the third moving nozzle 11 is positioned at the central position and the upper peeling liquid valve 55 is opened, the peeling liquid is supplied to the central region of the upper surface of the substrate W.

In the present preferred embodiment, as the peeling liquid, a first peeling liquid is used. As the first peeling liquid, a liquid which is more likely to dissolve a high solubility component contained in the processing liquid than a low solubility component contained in the processing liquid is used. The first peeling liquid is, for example, ammonia water and a mass percent concentration of ammonia in the peeling liquid is 0.4%.

The first peeling liquid may be, for example, an alkaline aqueous solution (alkaline liquid) other than ammonia water. Specific examples of the alkaline aqueous solution other than ammonia water include TMAH (tetramethylammonium hydroxide) aqueous solution, a choline aqueous solution and a combination of any of them. The first peeling liquid may be pure water (preferably DIW) or may be a neutral or an acidic aqueous solution (non-alkaline aqueous solution).

The first peeling liquid is preferably alkaline. The first peeling liquid is preferably 7~13 in pH. In detail, the first peeling liquid is preferably 8~13 in pH, more preferably 10~13 and even more preferably 11~12.5. The pH is preferably measured after degassing for avoiding influence due to dissolution of carbon dioxide in air.

A large portion of the solvent of the first peeling liquid is pure water. A percentage of pure water contained in the solvent of the first peeling liquid is 50~100 mass % (preferably 70 mass %~100 mass %, more preferably 90 mass %~100 mass %, even more preferably 95 mass %~100 mass % and yet even more preferably 99~100 mass %). "Mass %" is a percentage of a mass of a certain component with respect to a total mass of a liquid. A mass percent concentration of the solute of the first peeling liquid is 0.1%~10% (preferably 0.2%~8% and more preferably 0.3%~6%).

The central nozzle 12 is housed in the internal space 60a of the hollow shaft 60 of the facing member 6. A discharge port 12a provided at a tip of the central nozzle 12 is exposed from a communicating hole 6b and faces the central region of the upper surface of the substrate W from above.

The central nozzle 12 includes a plurality of tubes (a first tube 31, a second tube 32 and a third tube 33) which discharge a fluid downward and a cylindrical casing 30 which surrounds the plurality of tubes. The plurality of tubes and the casing 30 extend in an up/down direction along the rotation axis A1. The discharge port 12a of the central nozzle 12 also serves as a discharge port of the first tube 31, a discharge port of the second tube 32 and a discharge port of the third tube 33.

The first tube 31 (central nozzle 12) is an example of a rinse liquid supplying unit which supplies a rinse liquid such as DIW to the upper surface of the substrate W. The second tube 32 (central nozzle 12) is an example of an organic solvent supplying unit which supplies an organic solvent such as IPA to the upper surface of the substrate W. The third tube 33 (central nozzle 12) is an example of a gas supplying unit which supplies a gas such as nitrogen gas ($N_2$) between the upper surface of the substrate W and a facing surface 6a of the facing member 6. The central nozzle 12 serves also as a rinse liquid nozzle, an organic solvent nozzle and a gas nozzle.

The first tube 31 is connected to an upper rinse liquid piping 41 which guides a rinse liquid to the first tube 31. When an upper rinse liquid valve 51 which is interposed in the upper rinse liquid piping 41 is opened, the rinse liquid is continuously discharged toward the central region of the upper surface of the substrate W from the first tube 31 (central nozzle 12).

The rinse liquid is a liquid for washing away a liquid adhering to the surface of the substrate W. As the rinse liquid, included are DIW, carbonated water, electrolyzed ion water, hydrochloric acid water with a dilution concentration (for example, approximately 1 ppm~100 ppm), ammonia water with a dilution concentration (for example, approximately 1 ppm~100 ppm) and reduced water (hydrogen water).

The second tube 32 is connected to an organic solvent piping 42 which guides an organic solvent such as IPA to the second tube 32. When an organic solvent valve 52 interposed in the organic solvent piping 42 is opened, the organic solvent is continuously discharged toward the central region of the upper surface of the substrate W from the second tube 32 (central nozzle 12).

The organic solvent discharged from the second tube 32 preferably has compatibility with the rinse liquid and the processing liquid. The organic solvent discharged from the second tube 32 functions as a residue removing liquid which dissolves and removes a residue of the processing film remaining on the upper surface of the substrate W, after the processing film is peeled and removed from the upper surface of the substrate W by a peeling liquid. Thus, the residue removing liquid is also referred to as a residue dissolving liquid.

In the substrate processing which will be described later, an organic solvent discharged from the second tube 32 is supplied to the upper surface of the substrate W covered with a liquid film of the rinse liquid, and a processing liquid is supplied to the upper surface of the substrate W covered with a liquid film of the organic solvent. When the organic solvent is supplied to the upper surface of the substrate W covered with the liquid film of the rinse liquid, a large portion of the rinse liquid on the substrate W is rinsed by the organic solvent and expelled from the substrate W. A trace amount of the remaining rinse liquid dissolves in the organic solvent and diffuses into the organic solvent. The diffused rinse liquid is expelled from the substrate W together with the organic solvent. Therefore, it is possible to efficiently replace the rinse liquid on the substrate W with the organic solvent. Due to the same reason, it is possible to efficiently replace the organic solvent on the substrate W with the processing liquid. Thereby, it is possible to reduce an amount of the rinse liquid contained in the processing liquid on the substrate W. The organic solvent which is discharged from the second tube 32 functions as a replacing liquid for replacing the rinse liquid.

Further, the organic solvent discharged from the second tube 32 is preferably a low surface tension liquid which is lower in surface tension than the rinse liquid. In the substrate processing which will be described later, the upper surface of the substrate W is not dried by spinning off the rinse liquid on the substrate W, but the rinse liquid on the substrate W is replaced with an organic solvent and, thereafter, the organic solvent on the substrate W is spun off to dry the upper surface of the substrate W. Therefore, if the organic solvent is a low surface tension liquid, it is possible to lower a surface tension which acts on the upper surface of the substrate W upon drying of the upper surface of the substrate W.

As the organic solvent which functions as a residue removing liquid, a low surface tension liquid and a replacing liquid, a liquid, etc., that contains at least one of IPA, HFE (hydrofluoroether), methanol, ethanol, acetone, PGEE (propylene glycol monoethyl ether) and trans-1,2-dichloroethylene can be cited.

The organic solvent which functions as a residue removing liquid, a low surface tension liquid and a replacing liquid is not necessarily composed of a single component alone but may be a liquid which is mixed with other components. It may be, for example, a liquid mixture of IPA and DIW or a liquid mixture of IPA and HFE.

The third tube 33 is connected to a gas piping 43 which guides a gas to the third tube 33. When a gas valve 53 which is interposed in the gas piping 43 is opened, the gas is continuously discharged downward from the third tube 33 (central nozzle 12).

The gas discharged from the third tube 33 is, for example, an inert gas such as nitrogen gas. The gas discharged from the third tube 33 may be air. The inert gas is not limited to nitrogen gas but is a gas inert to the upper surface of the substrate W. As examples of the inert gas, rare gases such as argon are cited, in addition to nitrogen gas.

The lower surface nozzle 13 is inserted into a penetrating hole 21a which is opened at the central portion of the upper surface of the spin base 21. A discharge port 13a of the lower surface nozzle 13 is exposed from an upper surface of the spin base 21. The discharge port 13a of the lower surface nozzle 13 opposes a central region of a lower surface (a surface on the lower side) of the substrate W from below. The central region of the lower surface of the substrate W is a region of the lower surface of the substrate W which includes a rotation center of the substrate W.

One end of a common piping 80 which commonly guides a rinse liquid, a peeling liquid and a heating medium to the lower surface nozzle 13 is connected to the lower surface nozzle 13. The other end of the common piping 80 is connected to a lower rinse liquid piping 81 which guides the rinse liquid to the common piping 80, a lower peeling liquid piping 82 which guides the peeling liquid to the common piping 80 and a heating medium piping 83 which guides the heating medium to the common piping 80.

When a lower rinse liquid valve 86 which is interposed in the lower rinse liquid piping 81 is opened, the rinse liquid is continuously discharged toward the central region of the lower surface of the substrate W from the lower surface nozzle 13. When a lower peeling liquid valve 87 which is interposed in the lower peeling liquid piping 82 is opened, the peeling liquid is continuously discharged toward the central region of the lower surface of the substrate W from the lower surface nozzle 13. When a heating medium valve 88 which is interposed in the heating medium piping 83 is opened, the heating medium is continuously discharged toward the central region of the lower surface of the substrate W from the lower surface nozzle 13.

The lower surface nozzle 13 is an example of a lower rinse liquid supplying unit which supplies the rinse liquid to the lower surface of the substrate W. Further, the lower surface nozzle 13 is an example of a lower peeling liquid supplying unit which supplies the peeling liquid to the lower surface of the substrate W. Still further, the lower surface nozzle 13 is an example of a heating medium supplying unit which supplies the heating medium to the substrate W for heating the substrate W. The lower surface nozzle 13 is also a substrate heating unit which heats the substrate W.

The rinse liquid discharged from the lower surface nozzle 13 is the same as the rinse liquid discharged from the central nozzle 12 and, therefore, a description thereof is omitted. The peeling liquid discharged from the lower surface nozzle 13 is the same as the first peeling liquid discharged from the third moving nozzle 11 and, therefore, a description thereof is omitted.

The heating medium discharged from the lower surface nozzle 13 is, for example, high temperature DIW, the temperature of which is higher than room temperature and lower than a boiling point of the solvent contained in the processing liquid. Where the solvent contained in the processing liquid is IPA, for example, DIW with a temperature of 60° C.~80° C. is used as the heating medium. The heating medium discharged from the lower surface nozzle 13 is not limited to high temperature DIW and may be a high temperature inert gas and a high temperature gas such as high temperature air, the temperature of which is higher than room temperature and lower than a boiling point of the solvent contained in the processing liquid.

Figure 5:
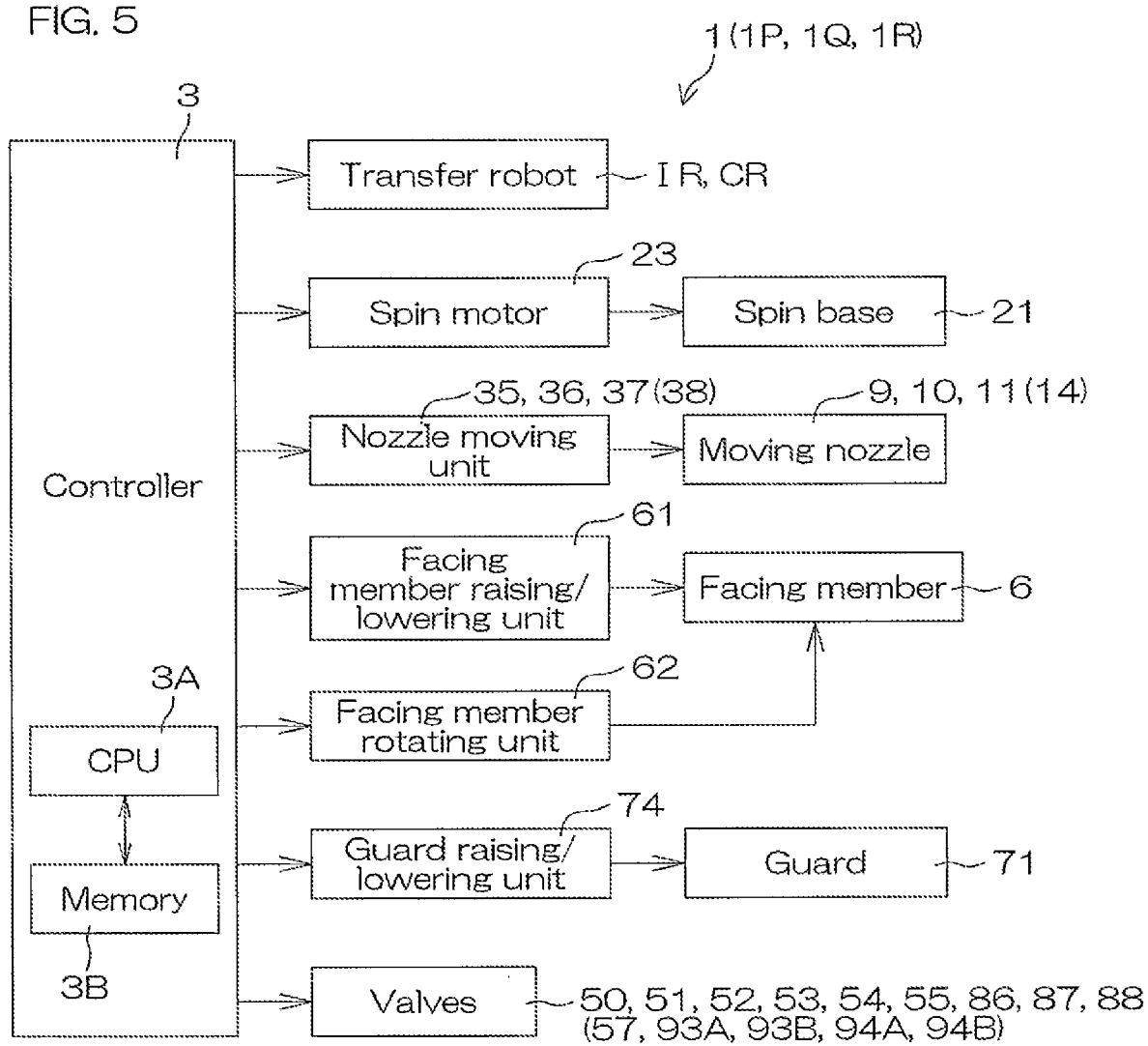
FIG. 5 is a block diagram which shows an electrical configuration of a main portion of the substrate processing apparatus.

FIG. 5 is a block diagram which shows an electrical configuration of a main portion of the substrate processing apparatus 1. The controller 3 is provided with a microcomputer and controls a control target installed in the substrate processing 5 apparatus 1 according to predetermined control programs.

Specifically, the controller 3 includes a processor (SPACE) 3A and a memory 3B in which the control programs are housed. The controller 3 is configured so as to provide various types of control for substrate processing according to the control programs executed by the processor 3A.

The controller 3 is programmed, in particular, so as to control the transfer robots IR, CR, the spin motor 23, the first nozzle moving unit 35, the second nozzle moving unit 36, the third nozzle moving unit 37, the facing member raising/lowering unit 61, the facing member rotating unit 62, the guard raising/lowering unit 74, the hydrophilizing liquid valve 50, the upper rinse liquid valve 51, the organic solvent valve 52, the gas valve 53, the processing liquid valve 54, the upper peeling liquid valve 55, the lower rinse liquid valve 86, the lower peeling liquid valve 87 and the heating medium valve 88. The controller 3 controls valves, thereby controlling the presence/non-presence of a processing fluid discharged from a corresponding nozzle and a flow rate of the processing fluid discharged from the corresponding nozzle.

<Configuration of Substrate to be Processed>

Figure 6:
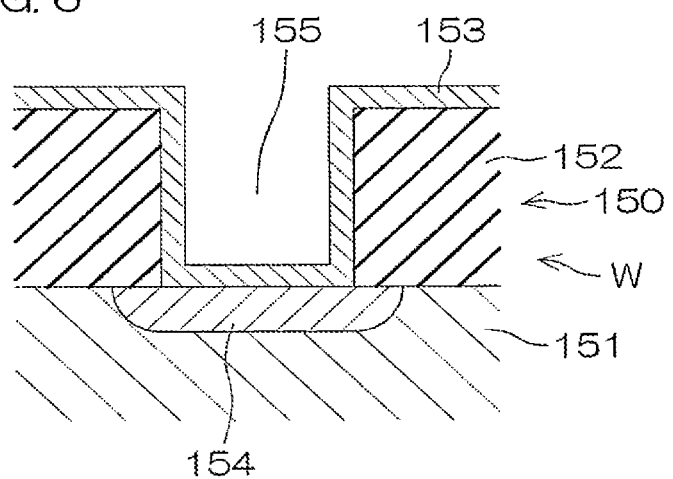
FIG. 6 is an configuration example of a surface layer of a substrate to be processed.

FIG. 6 shows an example of details of a surface layer of the substrate W which is to be processed by the substrate processing apparatus 1. A semiconductor layer 151, an insulation layer 152 and a barrier layer 153 are provided on a surface layer 150 of the substrate W. The semiconductor layer 151 is formed, for example, with Si (silicon). An impurity region 154 is formed in a surface layer portion of the semiconductor layer 151.

The insulation layer 152 is formed, for example, with $SiO_2$ (silicon oxide). A contact hole 155 which penetrates through the insulation layer 152 is provided above the impurity region 154.

The barrier layer 153 is formed on an upper surface of the insulation layer 152 and an inner surface of the contact hole 155. The barrier layer 153 is a TiN layer formed with TiN (titanium nitride) and formed by an ALD (atomic layer deposition) method, etc. Therefore, TiN is exposed on the surface of the substrate W.

The contact holes 155 may be provided at equal intervals on the insulation layer 152, and a fine pattern, having protrusions and recesses, may be formed by the insulation layer 152 and the contact hole 155. In this case, the barrier layer 153 has a shape which follows the pattern.

Figure 7:
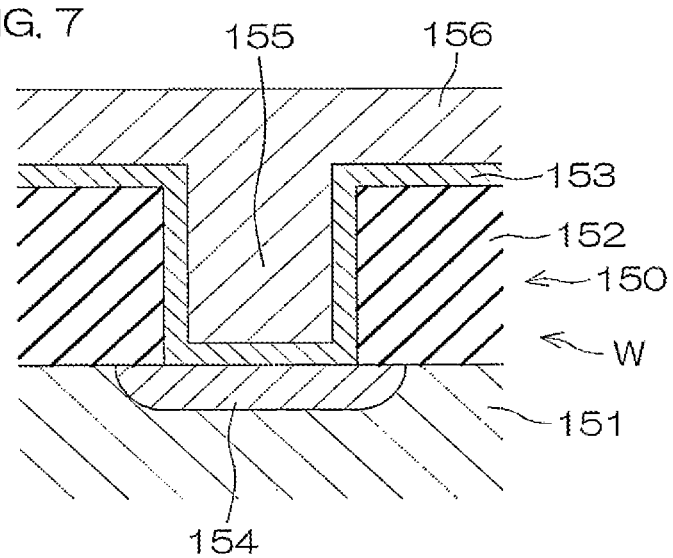
FIG. 7 is another configuration example of the surface layer of the substrate to be processed.

FIG. 7 shows another example of details of the surface layer of the substrate W which is to be processed by the substrate processing apparatus 1. On the surface layer 150 of the substrate W which is to be processed by the substrate processing apparatus 1, as shown in FIG. 7, in addition to the semiconductor layer 151, the insulation layer 152 and the barrier layer 153, a metal layer 156 may be provided. The metal layer 156 is, for example, a tungsten layer formed with W (tungsten) and formed by a CVD (chemical vapor deposition) method, etc. The metal layer 156 fills the contact hole 155 and covers the barrier layer 153. Therefore, the surface of the metal layer 156 is a flat surface. A metal which forms the metal layer 156 is exposed on the surface of the substrate W shown in FIG. 7. Where the metal layer 156 is formed with tungsten, tungsten is exposed on the surface of the substrate W.

<Substrate Processing According to First Preferred Embodiment>

Figure 8:
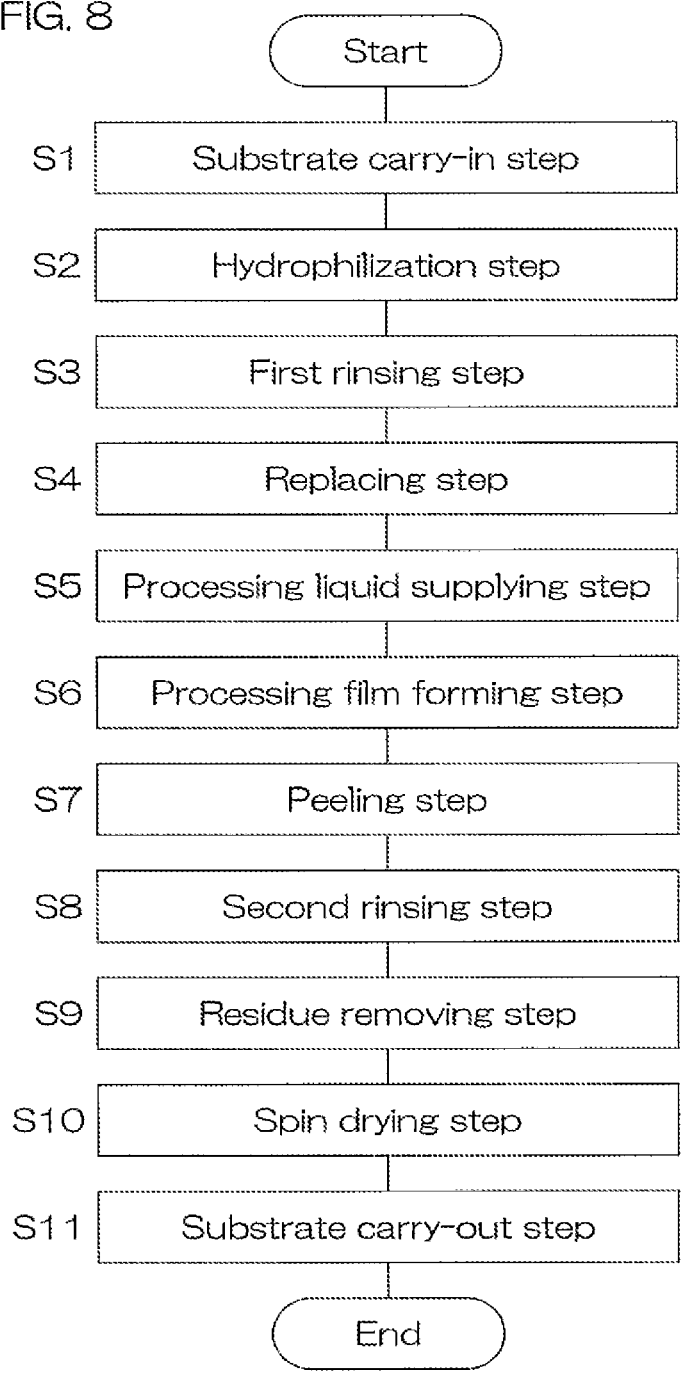
FIG. 8 is a flowchart for describing an example of substrate processing by the substrate processing apparatus.

FIG. 8 is a flowchart for describing an example of substrate processing by the substrate processing apparatus 1. FIG. 8 mainly shows processing which is realized by execution of programs by the controller 3. FIG. 9A~FIG. 9I are each a schematic view for describing conditions in individual steps of the substrate processing.

In the substrate processing by the substrate processing apparatus 1, for example, as shown in FIG. 8, a substrate carry-in step (Step S1), a hydrophilization step (Step S2), a first rinsing step (Step S3), a replacing step (Step S4), a processing liquid supplying step (Step S5), a processing film forming step (Step S6), a peeling step (Step S7), a second rinsing step (Step S8), a residue removing step (Step S9), a spin drying step (Step S10) and a substrate carry-out step (Step S11) are executed in this order.

Hereinafter, reference is made mainly to FIG. 2 and FIG. 8. Reference is made to FIG. 9A~FIG. 9I, whenever necessary.

First, an unprocessed substrate W is carried from a carrier C to the processing unit 2 by the transfer robots IR, CR (refer to FIG. 1) and transferred to the spin chuck 5 (Step S1). The substrate W is thereby held horizontally by the spin chuck 5 (substrate holding step). When the substrate W is carried in, the facing member 6 is retracted at the upper position.

The holding of the substrate W by the spin chuck 5 is continued until the spin drying step (Step S10) ends. During a period from the start of the substrate holding step to the end of the spin drying step (Step S10), the guard raising/lowering unit 74 adjusts a height position of the first guard 71A and that of the second guard 71B so that at least one of the guards 71 is positioned at the upper position.

In a state that the substrate W is held by the spin chuck 5, the spin motor 23 rotates the spin base 21. Thereby, the rotation of the substrate W which is held horizontally is started (substrate rotating step). The facing member rotating unit 62 may rotate the facing member 6 synchronously with the spin base 21. Synchronous rotation is to rotate the facing member 6 in the same rotating direction and at the same rotational speed as the spin base 21.

Next, after the transfer robot CR has been retracted outside the processing unit 2, the hydrophilization step (Step S2) is started. In the hydrophilization step, first, in a state that the facing member 6 is positioned at the retract position, the first nozzle moving unit 35 moves the first moving nozzle 9 to a processing position. The processing position of the first moving nozzle 9 is, for example, a central position. When the facing member 6 is positioned at the retract position, each moving nozzle moves horizontally between the facing member 6 and the substrate W. The retract position may be an upper position.

Figure 9A:
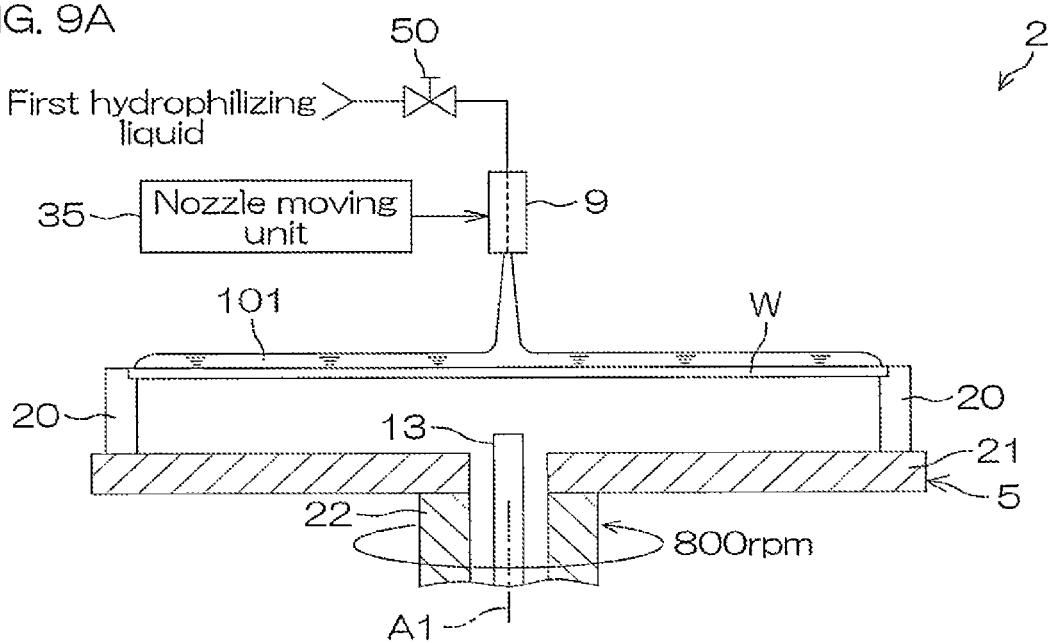
FIG. 9A is a schematic view for describing conditions of a hydrophilization step (Step S2) in the substrate processing.

Then, the hydrophilizing liquid valve 50 is opened. Thereby, as shown in FIG. 9A, the first hydrophilizing liquid such as hydrofluoric acid is supplied (discharged) from the first moving nozzle 9 toward the central region of the upper surface of the substrate W in the rotating state (hydrophilizing liquid supplying step, hydrophilizing liquid discharging step). The first hydrophilizing liquid supplied to the upper surface of the substrate W spreads radially by receiving a centrifugal force and spreads over the entire upper surface of the substrate W. The upper surface of the substrate W is thereby hydrophilized, and the contact angle of pure water for the upper surface of the substrate W becomes smaller than 41.7° (contact angle reducing step).

The supply of the first hydrophilizing liquid from the first moving nozzle 9 is continued for a predetermined time of, for example, 30 seconds. In the hydrophilization step, the substrate W is rotated at a predetermined hydrophilization rotational speed of, for example, 800 rpm.

Next, the first rinsing step (Step S3) which washes away the first hydrophilizing liquid on the substrate W is executed.

Specifically, the hydrophilizing liquid valve 50 is closed. Thereby, the supply of the first hydrophilizing liquid to the substrate W is stopped. Then, the first nozzle moving unit 35 moves the first moving nozzle 9 to the home position. The facing member raising/lowering unit 61 then moves the facing member 6 to the processing position between the upper position and the lower position. When the facing member 6 is positioned at the processing position, a distance between the upper surface of the substrate W and the facing surface 6a is, for example, 30 mm.

Figure 9B:
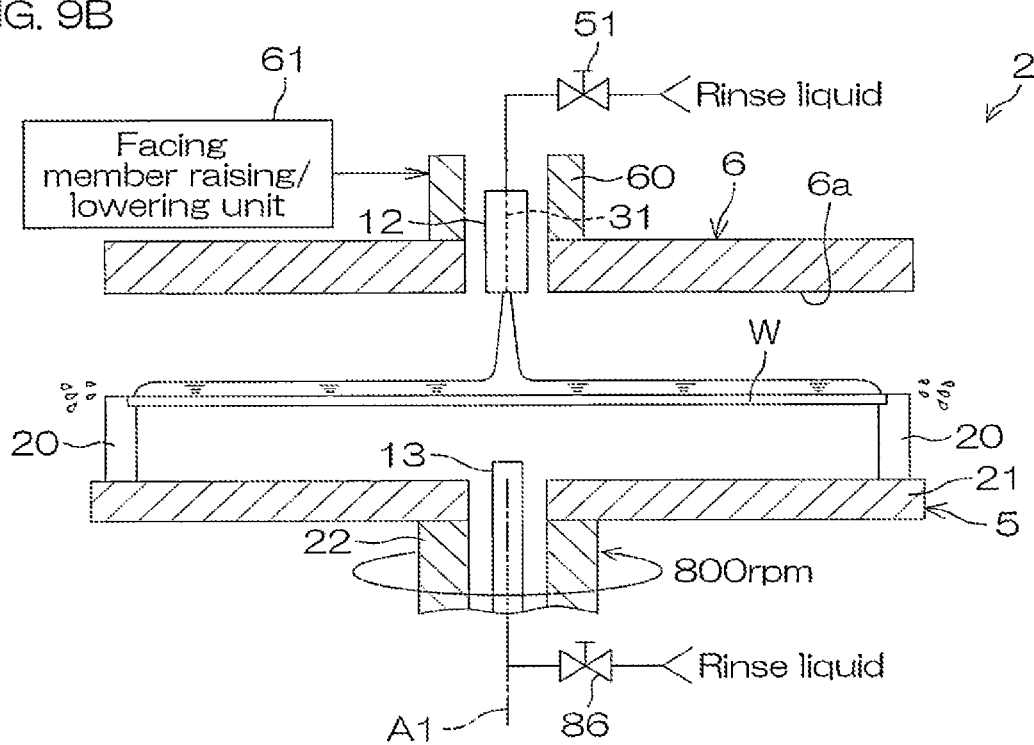
FIG. 9B is a schematic view for describing conditions of a first rinsing step (Step S3) in the substrate processing.

In a state that the facing member 6 is positioned at the processing position, the upper rinse liquid valve 51 is opened. As shown in FIG. 9B, the rinse liquid is thereby supplied (discharged) from the central nozzle 12 toward the central region of the upper surface of the substrate W in the rotating state. The rinse liquid which is supplied from the central nozzle 12 to the upper surface of the substrate W spreads radially by receiving a centrifugal force and spreads over the entire upper surface of the substrate W. Thereby, the first hydrophilizing liquid on the upper surface of the substrate W is washed away outside the substrate W.

Almost at the same time with opening of the upper rinse liquid valve 51, the lower rinse liquid valve 86 is opened. As shown in FIG. 9B, the rinse liquid is supplied (discharged) from the lower surface nozzle 13 toward the central region of the lower surface of the substrate W in the rotating state. The rinse liquid supplied from the lower surface nozzle 13 to the lower surface of the substrate W spreads radially by receiving a centrifugal force and spreads over the entire lower surface of the substrate W. In the hydrophilization step which has been described previously, even where the first hydrophilizing liquid adhering to the upper surface of the substrate W is splashed from the substrate W and adheres to the lower surface of the substrate W, the first hydrophilizing liquid adhering to the lower surface is washed away by the rinse liquid supplied from the lower surface nozzle 13.

The discharge of the rinse liquid from the central nozzle 12 and the lower surface nozzle 13 is continued for a predetermined time of, for example, 30 seconds. In the first rinsing step, the substrate W is rotated at a predetermined first rinsing rotational speed of, for example, 800 rpm.

Next, the replacing step (Step S4) is started. In the replacing step, the rinse liquid on the substrate W is replaced with the organic solvent (for example, IPA) as a replacing liquid.

Specifically, the upper rinse liquid valve 51 and the lower rinse liquid valve 86 are closed. Thereby, the supply of the rinse liquid to the upper surface and the lower surface of the substrate W is stopped. The facing member 6 is kept at the processing position.

Figure 9C:
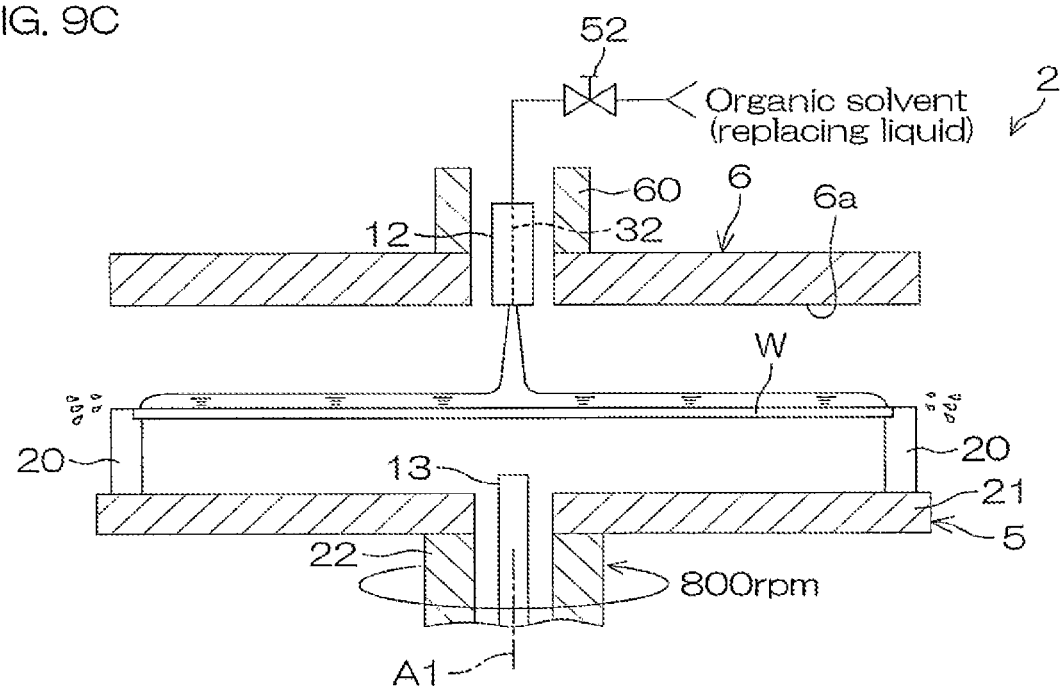
FIG. 9C is a schematic view for describing conditions of a replacing step (Step S4) in the substrate processing.

In a state that the facing member 6 is kept at the processing position, the organic solvent valve 52 is opened. Thereby, as shown in FIG. 9C, the organic solvent as the replacing liquid is supplied (discharged) from the central nozzle 12 toward the central region of the upper surface of the substrate W in the rotating state (replacing liquid supplying step, replacing liquid discharging step). The central nozzle 12 is an example of a replacing liquid nozzle.

The organic solvent supplied from the central nozzle 12 to the upper surface of the substrate W spreads radially by receiving a centrifugal force and spreads over the entire upper surface of the substrate W. The rinse liquid on the substrate W is thereby replaced with the organic solvent.

In the replacing step, the discharge of the organic solvent from the central nozzle 12 is continued for a predetermined time of, for example, 10 seconds. In the replacing step, the substrate W is rotated at a predetermined replacing rotational speed of, for example, 300 rpm~1500 rpm. In the replacing step, it is not necessary to rotate the substrate W at a fixed rotational speed. For example, the spin motor 23 may rotate the substrate W at 300 rpm at the start of supplying the organic solvent and may accelerate the rotation of the substrate W until the rotational speed of the substrate W reaches 1500 rpm while the organic solvent is being supplied to the substrate W.

Figure 9D:
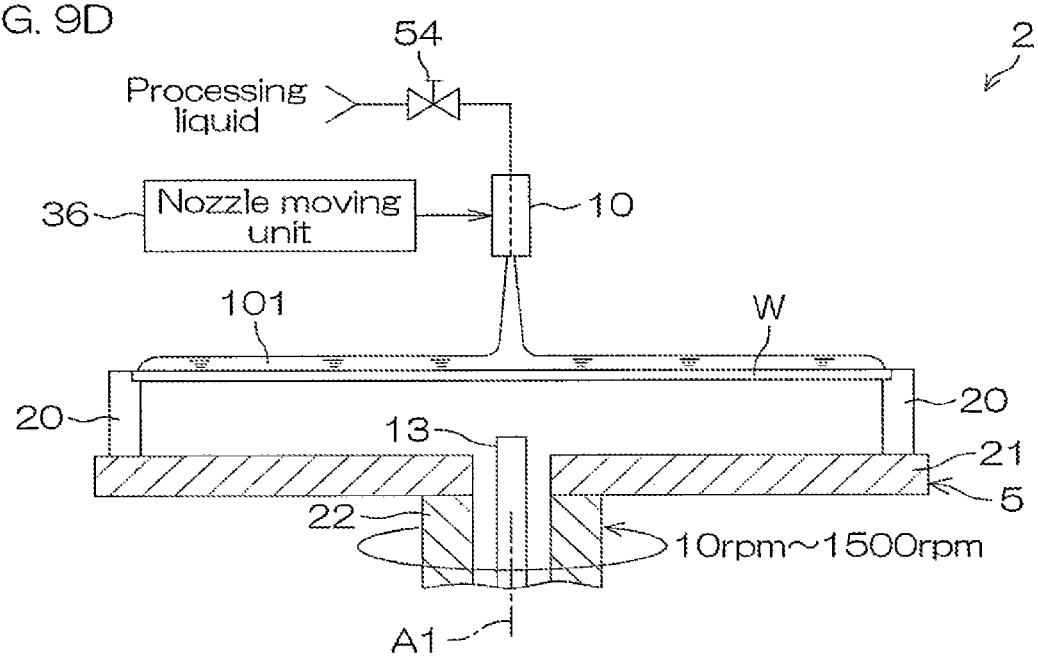
FIG. 9D is a schematic view for describing conditions of a processing liquid supplying step (Step S5) in the substrate processing.

Next, the processing liquid supplying step (Step S5) which supplies the processing liquid to the upper surface of the substrate W is executed. Specifically, the organic solvent valve 52 is closed, and the facing member raising/lowering unit 61 moves the facing member 6 to the retract position. In a state that the facing member 6 is positioned at the retract position, the second nozzle moving unit 36 moves the second moving nozzle 10 to the processing position. The processing position of the second moving nozzle 10 is, for example, a central position. Then, the processing liquid valve 54 is opened. As shown in FIG. 9D, a processing liquid is thereby supplied (discharged) from the second moving nozzle 10 toward the central region of the upper surface of the substrate W in the rotating state (processing liquid supplying step, processing liquid discharging step). The processing liquid supplied to the upper surface of the substrate W spreads over the entire substrate W by a centrifugal force. Thereby, a liquid film 101 (processing liquid film) of the processing liquid is formed on the substrate W (processing liquid film forming step).

The supply of the processing liquid from the second moving nozzle 10 is continued for a predetermined time of, for example, 2 seconds~4 seconds. In the processing liquid supplying step, the substrate W is rotated at a predetermined processing liquid rotational speed of, for example, 10 rpm~1500 rpm.

Figure 9E:
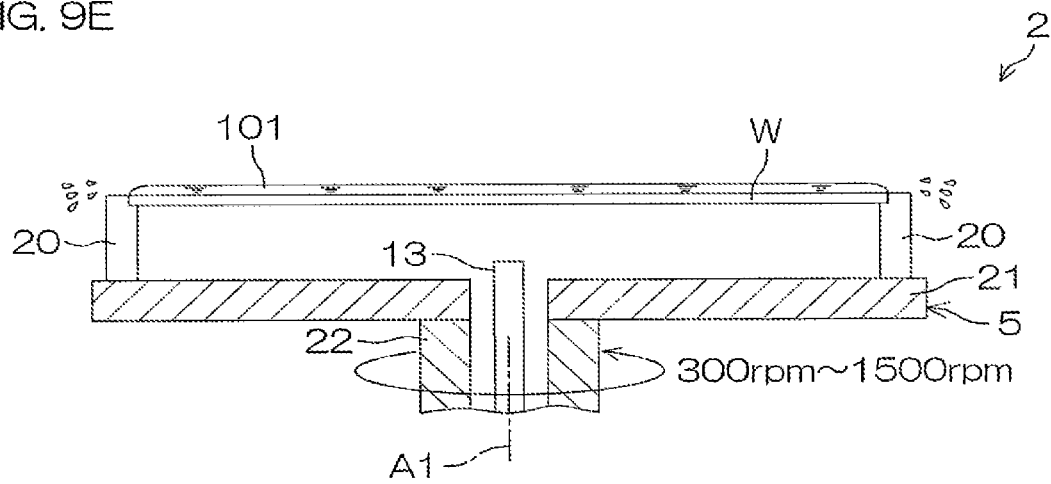
FIG. 9E is a schematic view for describing conditions of a processing film forming step (Step S6) in the substrate processing.
Figure 9F:
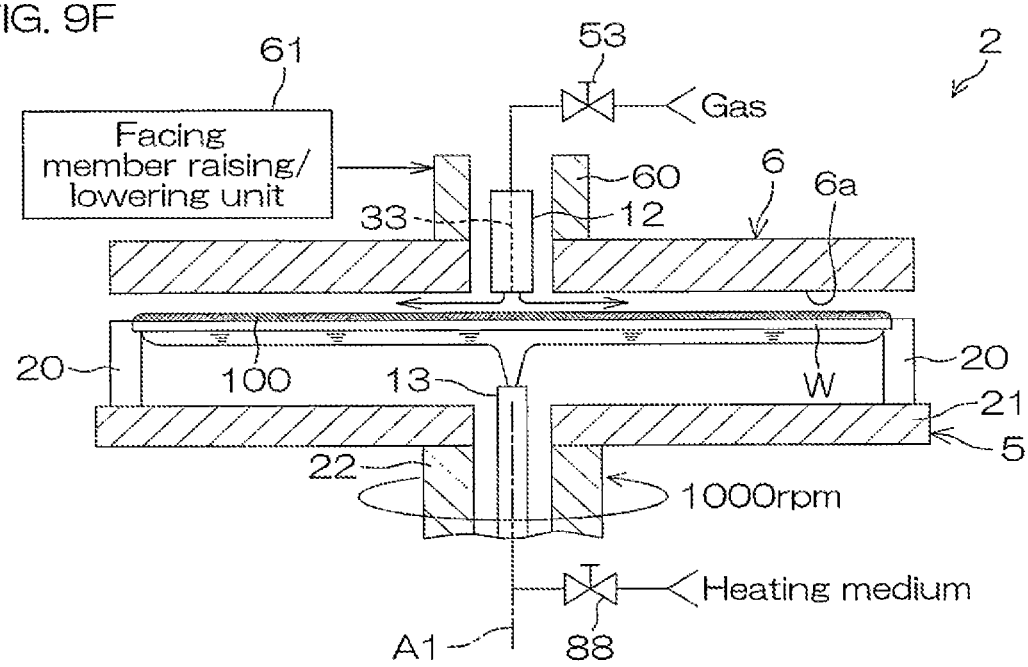
FIG. 9F is a schematic view for describing conditions of the processing film forming step (Step S6) in the substrate processing.

Next, the processing film forming step (Step S8) shown in FIG. 9E and FIG. 9F is executed. In the processing film forming step, the processing liquid on the substrate W is solidified or cured to form, on the upper surface of the substrate W, a processing film 100 (refer to FIG. 9F) which holds a removal object present on the substrate W.

In the processing film forming step, first, a processing liquid film thinning step (processing liquid spin off step) in which the liquid film 101 of the processing liquid on the substrate W is made thin in thickness is executed. Specifically, the processing liquid valve 54 is closed. Thereby, the supply of the processing liquid to the substrate W is stopped. Then, the second moving nozzle 10 is moved to the home position by the second nozzle moving unit 36.

As shown in FIG. 9E, in the processing liquid film thinning step, the substrate W is rotated in a state that the supply of the processing liquid to the upper surface of the substrate W is stopped. Therefore, the processing liquid is partially removed from the upper surface of the substrate W. Thereby, the liquid film 101 on the substrate W is made appropriate in thickness. After movement of the second moving nozzle 10 to the home position, the facing member 6 is kept in the retract position.

In the processing liquid film thinning step, the spin motor 23 changes the rotational speed of the substrate W to a predetermined processing liquid film thinning speed. The processing liquid film thinning speed is, for example, 300 rpm~1500 rpm.

The rotational speed of the substrate W may be kept fixed within a range of 300 rpm~1500 rpm or may be changed within a range of 300 rpm~1500 rpm, whenever necessary, during the processing liquid film thinning step. The processing liquid film thinning step is executed for a predetermined time of, for example, 30 seconds.

In the processing film forming step, after the processing liquid film thinning step, a processing liquid solvent evaporation step in which the solvent is partially evaporated (volatilized) from the liquid film 101 of the processing liquid is executed. In the processing liquid solvent evaporation step, the liquid film 101 on the substrate W is heated for partially evaporating the solvent of the processing liquid on the substrate W.

Specifically, as shown in FIG. 9F, the facing member raising/lowering unit 61 moves the facing member 6 to a proximity position. The proximity position may be the lower position. The proximity position is a position where a distance from the upper surface of the substrate W to the facing surface 6a is, for example, 1 mm.

Then, the gas valve 53 is opened. Thereby, the gas is supplied to a space between the upper surface of the substrate W (the upper surface of the liquid film 101) and the facing surface 6a of the facing member 6 (gas supplying step).

Evaporation (volatilization) of the solvent in the liquid film 101 is promoted by the gas blown onto the liquid film 101 on the substrate W (processing liquid solvent evaporation step, processing liquid solvent evaporation promoting step). A time required to form the processing film 100 can thus be reduced. In the processing film forming step, the central nozzle 12 functions as an evaporation unit (evaporation promoting unit) for evaporating the solvent in the processing liquid.

Even after the processing liquid has been partially removed from the substrate W by the processing liquid film thinning step of the liquid film 101, the facing member 6 and the substrate W are continuously rotated. Therefore, a centrifugal force resulting from the rotation of the facing member 6 and the substrate W acts on the gas discharged from the central nozzle 12. A gas stream in which the gas moves from a center side of the substrate W to a peripheral edge side is formed due to action of the centrifugal force. Therefore, elimination of the gaseous solvent in contact with the liquid film 101 from a space between the facing member 6 and the substrate W is promoted. Evaporation of the solvent in the liquid film 101 is thus promoted. As described above, the facing member 6 and the spin motor 23 function as an evaporation unit (evaporation promoting unit) which evaporates (volatilizes) the solvent in a processing liquid. Only the substrate W may be rotated, while the facing member 6 is not rotated.

Also, the heating medium valve 88 is opened. Thereby, the heating medium is supplied (discharged) from the lower surface nozzle 13 toward the central region of the lower surface of the substrate W in the rotating state (heating medium supplying step, heating medium discharging step). The heating medium supplied from the lower surface nozzle 13 to the lower surface of the substrate W spreads radially by receiving a centrifugal force and spreads over the entire lower surface of the substrate W.

The supply of the heating medium to the substrate W is continued for a predetermined time of, for example, 60 seconds. In the processing liquid solvent evaporation step, the substrate W is rotated at a predetermined evaporation rotational speed of, for example, 1000 rpm.

The heating medium is supplied to the lower surface of the substrate W, by which the liquid film 101 on the substrate W is heated via the substrate W. Evaporation (volatilization) of the solvent in the liquid film 101 is thereby promoted (processing liquid solvent evaporation step, processing liquid solvent evaporation promoting step). A time required to form the processing film 100 can thus be reduced. In the processing film forming step as well, the lower surface nozzle 13 functions as an evaporation unit (evaporation promoting unit) for evaporating (volatilizing) the solvent in the processing liquid.

By executing the processing liquid film thinning step and the processing liquid solvent evaporation step, the processing liquid is solidified or cured. The processing film 100 which holds a removal object is, thus, formed on the entire upper surface of the substrate W.

As described above, the substrate rotating unit (spin motor 23), the facing member rotating unit 62, the central nozzle 12 and the lower surface nozzle 13 form a processing film forming unit in which the processing liquid is solidified or cured to form the processing film 100 in a solid state.

Gas blowing, rotation of the substrate W and heating of the substrate W can be used to quickly form the processing film 100. However, it is also possible to form the processing film 100 by the gas blowing and rotation of the substrate W. In other words, heating by the heating medium is not always necessary in formation of the processing film 100. Therefore, the supply of the heating medium to the substrate W may be omitted.

In the processing liquid solvent evaporation step, the substrate W is preferably heated so that a temperature of the substrate W may be less than a boiling point of the solvent. The substrate W is heated to a temperature less than the boiling point of the solvent, by which excessive evaporation of the solvent can be suppressed and the solvent remains appropriately in the processing film 100. Thereby, in comparison to a case in which no solvent remains inside the processing film 100, the first peeling liquid easily acts on the processing film 100 in the subsequent peeling step (Step S6).

Next, the peeling step (Step S6) of peeling the processing film 100 is executed. Specifically, the heating medium valve 88 is closed. Thereby, the supply of the heating medium to the lower surface of the substrate W is stopped. The gas valve 53 is also closed. Thereby, the supply of the gas to a space between the facing surface 6a of the facing member 6 and the upper surface of the substrate W is stopped.

Then, the facing member raising/lowering unit 61 moves the facing member 6 to the retract position. In a state that the facing member 6 is positioned at the retract position, the third nozzle moving unit 37 moves the third moving nozzle 11 to the processing position. The processing position of the third moving nozzle 11 is, for example, a central position.

Figure 9G:
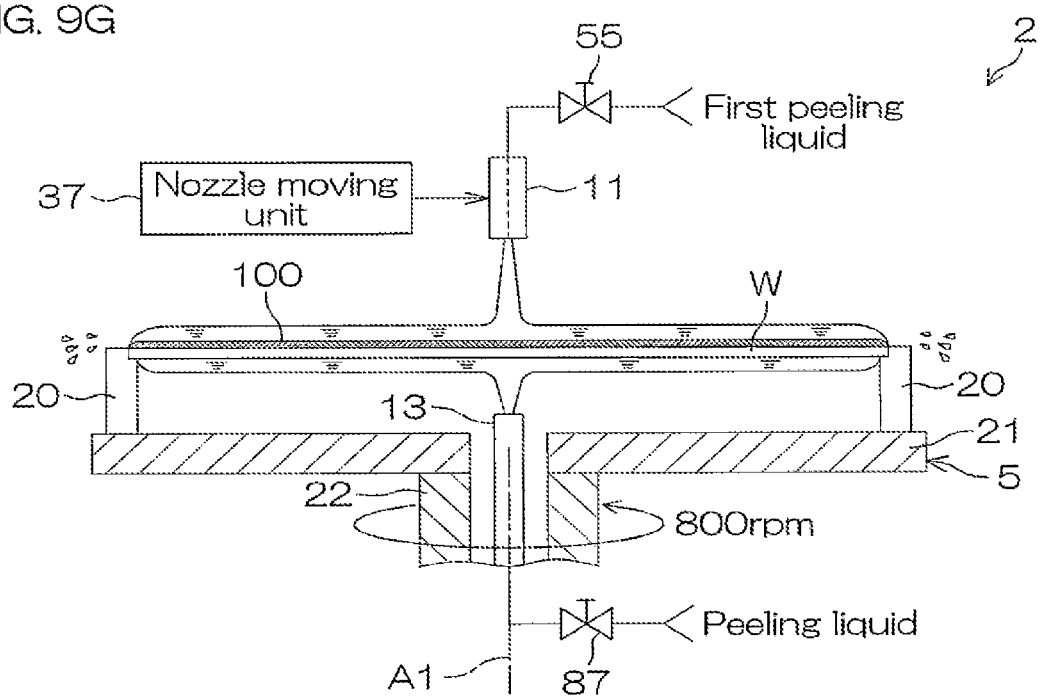
FIG. 9G is a schematic view for describing conditions of a peeling step (Step S7) in the substrate processing.

Then, in a state that the third moving nozzle 11 is positioned at the processing position, the upper peeling liquid valve 55 is opened. Thereby, as shown in FIG. 9G, the first peeling liquid is supplied (discharged) from the third moving nozzle 11 toward the central region of the upper surface of the substrate W in the rotating state (upper peeling liquid supplying step, upper peeling liquid discharging step). The first peeling liquid supplied to the upper surface of the substrate W spreads over the entire upper surface of the substrate W by a centrifugal force. Thereby, the processing film 100 on the upper surface of the substrate W is peeled and expelled outside the substrate W, together with the first peeling liquid.

At the same time when the upper peeling liquid valve 55 is opened, the lower peeling liquid valve 87 is opened. Thereby, as shown in FIG. 9G, the first peeling liquid is supplied (discharged) from the lower surface nozzle 13 toward the central region of the lower surface of the substrate W in the rotating state (lower peeling liquid supplying step, lower peeling liquid discharging step). The first peeling liquid supplied to the lower surface of the substrate W spreads over the entire lower surface of the substrate W by a centrifugal force.

The supply of the first peeling liquid to the upper surface and the lower surface of the substrate W is continued for a predetermined time of, for example, 60 seconds. In the peeling step, the substrate W is rotated at a predetermined peeling rotational speed of, for example, 800 rpm.

Here, in the processing liquid supplying step (Step S5) shown in FIG. 9D, there may be a case in which the processing liquid supplied to the upper surface of the substrate W adheres to the lower surface of the substrate W via a peripheral edge of the substrate W and the processing liquid adhering to the lower surface of the substrate W is solidified or cured to form a solid.

As shown in FIG. 9G, while the first peeling liquid is supplied to the upper surface of the substrate W in the peeling step (Step S6), the first peeling liquid is supplied (discharged) from the lower surface nozzle 13 to the lower surface of the substrate W. Therefore, even in a case in which a solid of the processing liquid is formed on the lower surface of the substrate W, the solid can be peeled and removed from the lower surface of the substrate W.

Figure 9H:
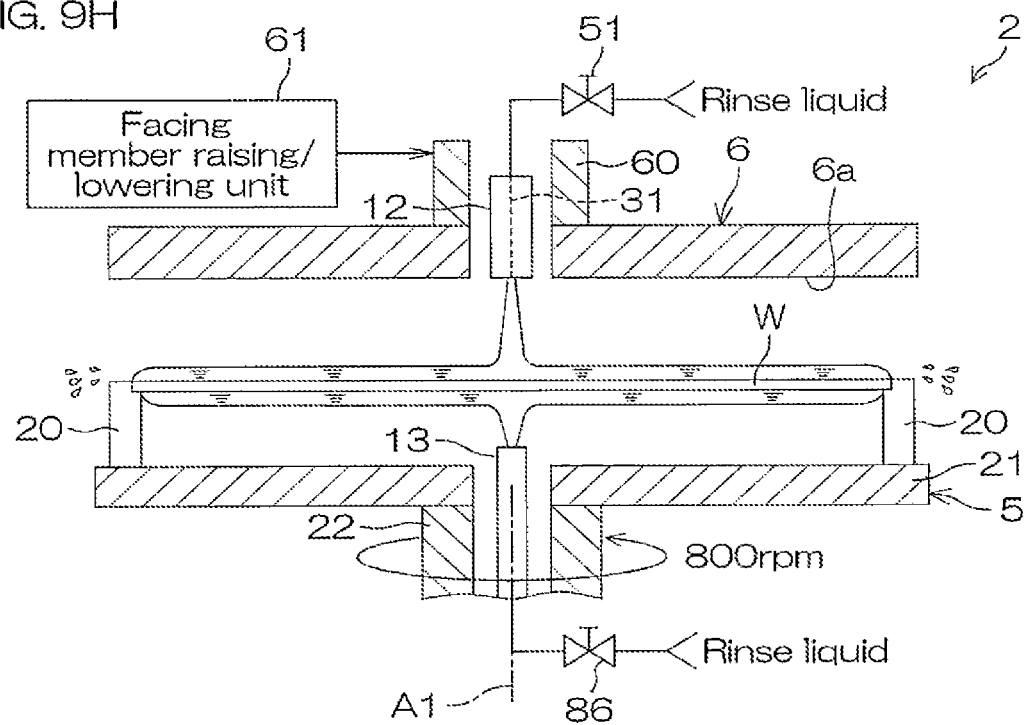
FIG. 9H is a schematic view for describing conditions of a second rinsing step (Step S8) in the substrate processing.
Figure 9:
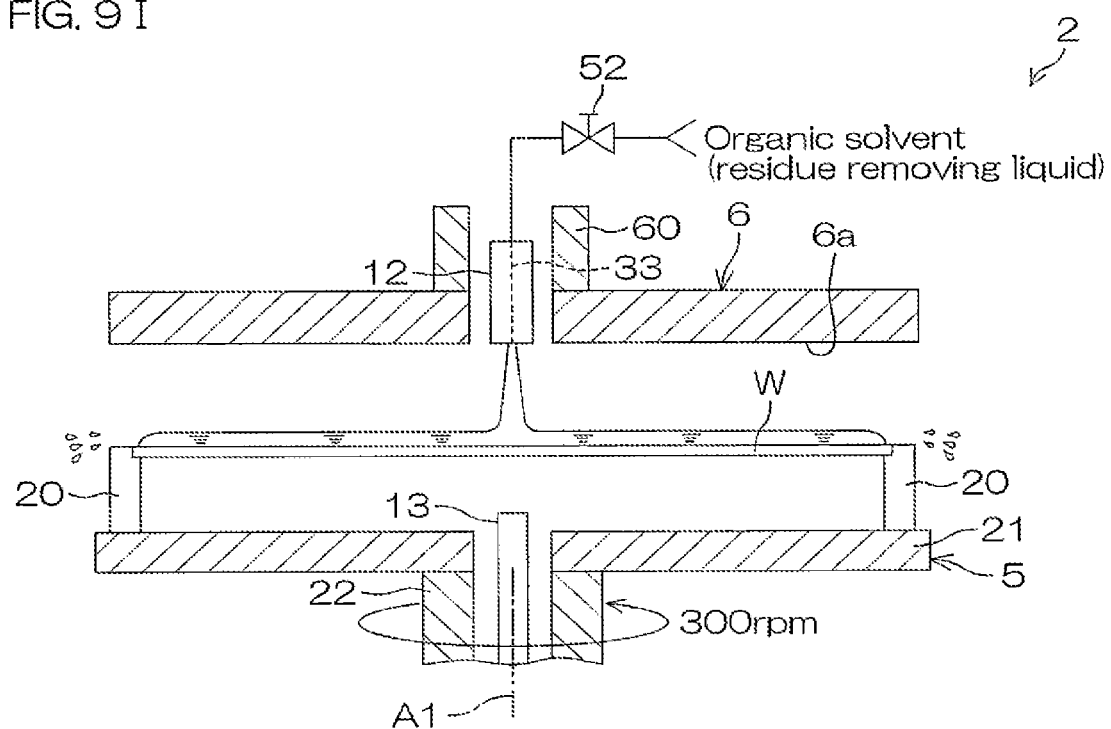
FIG. 9I is a schematic view for describing conditions of a residue removing step (Step S9) in the substrate processing.

After the peeling step (Step S6), the second rinsing step (Step S7) in which the first peeling liquid is washed away from the substrate W by the rinse liquid is executed. Specifically, the upper peeling liquid valve 55 and the lower peeling liquid valve 87 are closed. Thereby, the supply of the first peeling liquid to the upper surface and the lower surface of the substrate W is stopped. Then, the third nozzle moving unit 37 moves the third moving nozzle 11 to the home position. Then, as shown in FIG. 9H, the facing member raising/lowering unit 61 moves the facing member 6 to the processing position.

Then, in a state that the facing member 6 is positioned at the processing position, the upper rinse liquid valve 51 is opened. Thereby, as shown in FIG. 9H, the rinse liquid is supplied (discharged) from the central nozzle 12 toward the central region of the upper surface of the substrate W in the rotating state (upper rinse liquid supplying step, upper rinse liquid discharging step). The rinse liquid supplied to the upper surface of the substrate W spreads over the entire upper surface of the substrate W by a centrifugal force. Thereby, the first peeling liquid adhering to the upper surface of the substrate W is washed away by the rinse liquid (rinsing step).

Further, at the same time when the upper rinse liquid valve 51 is opened, the lower rinse liquid valve 86 is opened. Thereby, as shown in FIG. 9H, the rinse liquid is supplied (discharged) from the lower surface nozzle 13 toward the central region of the lower surface of the substrate W in the rotating state (lower rinse liquid supplying step, lower rinse liquid discharging step). Thereby, the first peeling liquid adhering to the lower surface of the substrate W is washed away by the rinse liquid.

The supply of the rinse liquid to the upper surface and the lower surface of the substrate W is continued for a predetermined time of, for example, 30 seconds. In the second rinsing step, the substrate W is rotated for a predetermined second rinsing rotational speed of, for example, 800 rpm.

Next, the residue removing step (Step S8) is executed. In the residue removing step, after the peeling step, a residue of the processing film 100 remaining on the upper surface of the substrate W is removed by the organic solvent (for example, IPA) as a residue removing liquid. Specifically, the upper rinse liquid valve 51 and the lower rinse liquid valve 86 are closed. Thereby, the supply of the rinse liquid to the upper surface and the lower surface of the substrate W is stopped.

Then, in a state that the facing member 6 is positioned at the processing position, the organic solvent valve 52 is opened. Thereby, as shown in FIG. 9I, the organic solvent as the residue removing liquid is supplied (discharged) from the central nozzle 12 toward the central region of the upper surface of the substrate W in the rotating state (residue removing liquid supplying step, residue removing liquid discharging step).

The organic solvent supplied from the central nozzle 12 to the upper surface of the substrate W spreads radially by receiving a centrifugal force and spreads over the entire upper surface of the substrate W. The organic solvent dissolves a residue of the processing film remaining on the upper surface of the substrate W and, thereafter, is expelled from a peripheral edge of the upper surface of the substrate W. The central nozzle 12 is an example of the residue removing liquid nozzle.

In the residue removing step, the discharge of the organic solvent from the central nozzle 12 is continued for a predetermined time of, for example, 30 seconds. In the residue removing step, the substrate W is rotated at a predetermined residue removing rotational speed of, for example, 300 rpm.

Next, the spin drying step (Step S10) in which the substrate W is rotated at a high speed to dry the upper surface of the substrate W is executed.

Specifically, the organic solvent valve 52 is closed. Thereby, the supply of the organic solvent to the upper surface of the substrate W is stopped. Then, the facing member raising/lowering unit 61 moves the facing member 6 to a drying position lower than the processing position. When the facing member 6 is positioned at the drying position, a distance between the facing surface 6a of the facing member 6 and the upper surface of the substrate W is, for example, 1.5 mm. Then, the gas valve 53 is opened. Thereby, the gas is supplied to a space between the upper surface of the substrate W and the facing surface 6a of the facing member 6.

Then, the spin motor 23 accelerates the rotation of the substrate W to rotate the substrate W at a high speed. The substrate W in the spin drying step is rotated at a drying speed of, for example, 1500 rpm. The spin drying step is executed for a predetermined time of, for example, 30 seconds. Thereby, a large centrifugal force is applied to the organic solvent on the substrate W, and the organic solvent on the substrate W is spun off around the substrate W. In the spin drying step, the gas is supplied to a space between the upper surface of the substrate W and the facing surface 6a of the facing member 6, thereby promoting the evaporation of the organic solvent.

Then, the spin motor 23 stops the rotation of the substrate W. The guard raising/lowering unit 74 moves the first guard 71A and the second guard 71B to a lower position. The gas valve 53 is closed. Then, the facing member raising/lowering unit 61 moves the facing member 6 to an upper position.

The transfer robot CR enters the processing unit 2, scoops up a processed substrate W from the chuck pin 20 of the spin chuck 5 and carries it outside the processing unit 2 (Step S11). The substrate W is transferred from the transfer robot CR to the transfer robot IR and housed in a carrier C by the transfer robot IR.

<Conditions of Peeling Processing Film in First Preferred Embodiment>

Figure 10A:
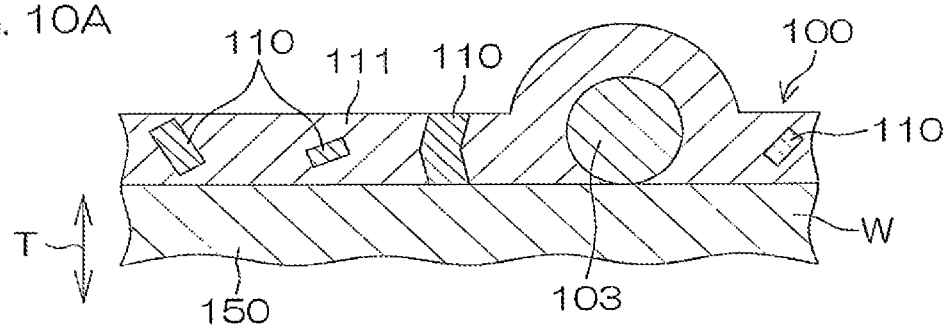
FIG. 10A is a schematic view for describing conditions in which a processing film is peeled from a surface of a substrate.
Figure 10B:
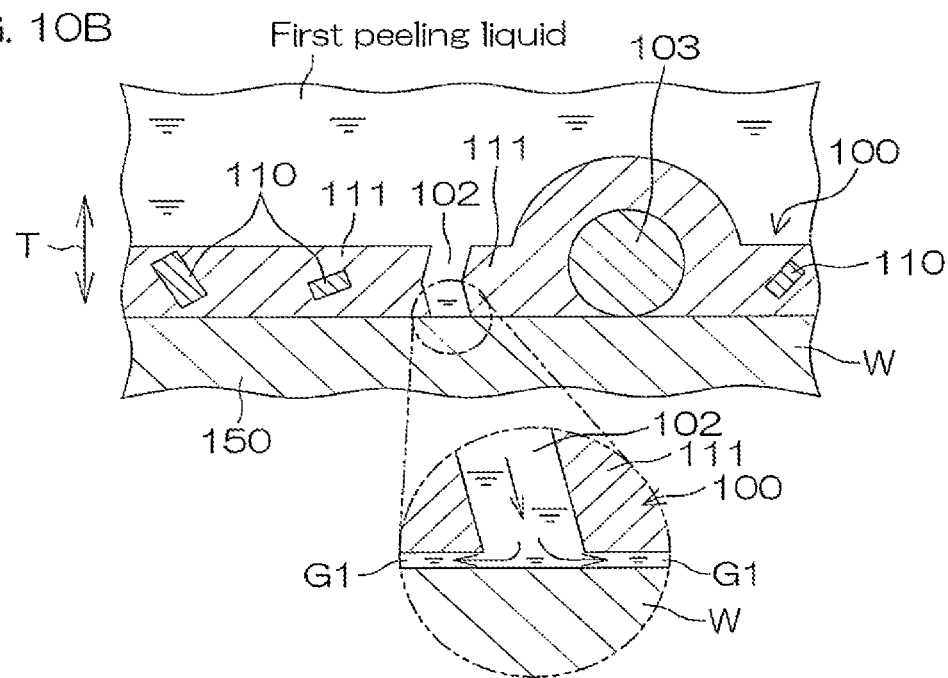
FIG. 10B is a schematic view for describing conditions in which the processing film is peeled from the surface of the substrate.
Figure 10C:
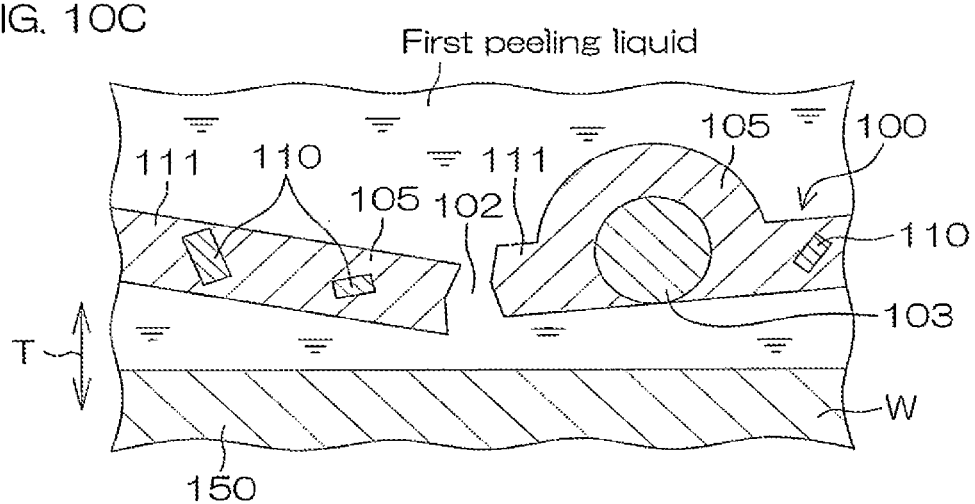
FIG. 10C is a schematic view for describing conditions in which the processing film is peeled from the surface of the substrate.

Conditions of removing the processing film 100 will be described in detail, with reference to FIG. 10A~FIG. 10C. FIG. 10A~FIG. 10C are each a schematic view for describing conditions of peeling the processing film 100 from the substrate W.

As shown in FIG. 10A, the processing film 100 holds a removal object 103 adhering to the surface layer 150 of the substrate W. The processing film 100 has a high solubility solid 110 (high solubility component in a solid state) and a low solubility solid 111 (low solubility component in a solid state). The high solubility solid 110 and the low solubility solid 111 are formed by at least a partial evaporation of a solvent contained in the processing liquid.

The high solubility solid 110 and the low solubility solid 111 are present in the processing film 100 in a mixed state. Strictly speaking, the processing film 100 is not in a state that the high solubility solids 110 and the low solubility solids 111 are uniformly distributed all over on the processing film 100. The processing film 100 has a portion in which the high solubility solids 110 are unevenly distributed and a portion in which the low solubility solids 111 are unevenly distributed.

With reference to FIG. 10B, the high solubility solid 110 is dissolved by the first peeling liquid. That is, the processing film 100 is partially dissolved (dissolving step, partially dissolving step). The high solubility solid 110 is dissolved, by which a penetrating hole 102 is formed at a portion in which the high solubility solid 110 is unevenly distributed in the processing film 100 (penetrating hole forming step).

The penetrating hole 102 is particularly likely to be formed at a portion in which the high solubility solid 110 extends in a thickness direction T of the processing film 100. The penetrating hole 102 has a size of, for example, several nm in diameter in plan view. The penetrating hole 102 is a space which is formed in the processing film 100 by dissolution of the high solubility solid 110.

Here, where the solvent remains appropriately in the processing film 100, the first peeling liquid partially dissolves the processing film 100 by being dissolved in the solvent remaining on the processing film 100. In detail, the peeling liquid dissolves the high solubility solid 110 in the processing film 100 to form the penetrating hole 102 by being dissolved in the solvent remaining in the high solubility solid 110. Therefore, the first peeling liquid easily enters the processing film 100 (dissolution entry step).

The first peeling liquid passes through the penetrating hole 102, reaches an interface between the processing film 100 and the substrate W and acts on the interface. Action of the first peeling liquid on the interface between the processing film 100 and the substrate W means that the first peeling liquid slightly dissolves a portion in contact with the substrate W to peel the processing film 100 from the substrate W.

The low solubility component is low in solubility in the first peeling liquid, and the low solubility solid 111 is hardly dissolved by the first peeling liquid. Therefore, the low solubility solid 111 is slightly dissolved only near the surface thereof by the first peeling liquid. Therefore, the first peeling liquid which has reached near the upper surface of the substrate W via the penetrating hole 102 slightly dissolves a portion of the low solubility solid 111 near the upper surface of the substrate W. Thereby, as shown in an enlarged view of FIG. 10B, the first peeling liquid enters a space G1 between the processing film 100 and the upper surface of the substrate W, while gradually dissolving the low solubility solid 111 near the upper surface of the substrate W (peeling liquid entry step).

Then, for example, with a peripheral edge of the penetrating hole 102 as a starting point, the processing film 100 becomes split into film fragments 105. As shown in FIG. 10C, the film fragments 105 of the processing film 100 are peeled from the substrate W in a state of holding the removal object 103 (processing film splitting step, processing film peeling step).

Then, the supply of the first peeling liquid is continued, and the processing film 100 made into the film fragments 105 is, thus, washed away by the first peeling liquid in a state of holding the removal object 103. In other words, the film fragments 105 which hold the removal object 103 are pushed outside the substrate W and removed from the upper surface of the substrate W (processing film removing step, removal object removing step). Thereby, it is possible to satisfactorily clean the upper surface of the substrate W.

<Summary of First Preferred Embodiment>

The strength of the peeling action (peeling force) by which the first peeling liquid peels the processing film 100 from the substrate W varies depending on surface conditions of the upper surface of the substrate W. Specifically, the higher the hydrophilicity of the upper surface of the substrate W, the more easily the processing film 100 is peeled off by the first peeling liquid. More specifically, the higher the hydrophilicity of the upper surface of the substrate W, the higher the wettability (affinity) of the peeling liquid for the substrate W, and the first peeling liquid easily enters between the substrate W and the processing film 100. That is, the higher the hydrophilicity of the upper surface of the substrate W, the more easily the processing film 100 is peeled from the upper surface of the substrate W.

According to the present preferred embodiment, the processing film 100 is formed on the hydrophilized upper surface of the substrate W and the processing film 100 is peeled off by the first peeling liquid. Therefore, it is possible to effectively peel the processing film 100 from the substrate W.

Upon peeling of the processing film 100, the penetrating hole 102 is formed in the processing film 100 by the first peeling liquid. Therefore, the first peeling liquid reaches an interface between the processing film 100 and the substrate W via the penetrating hole 102. Thereby, the first peeling liquid enters between a portion of the processing film 100 which surrounds the penetrating hole 102 and the upper surface of the substrate W. Therefore, in comparison to an configuration in which the peeling liquid infiltrates into the processing film 100 and reaches an interface between the processing film 100 and the substrate W, with no penetrating hole 102 formed in the processing film 100, the first peeling liquid acts quickly on the interface between the processing film 100 and the substrate W. Although the processing film 100 is partially dissolved by the first peeling liquid for formation of the penetrating hole 102, a remaining portion thereof is kept in a solid state. Therefore, the processing film 100 in a state of holding the removal object 103 can be effectively peeled from the upper surface of the substrate W.

In this way, while the first peeling liquid acts quickly on the interface between the processing film 100 and the substrate W, a large portion of the processing film 100 can be kept in a solid state. Therefore, the processing film 100 in a state of holding the removal object 103 can be effectively peeled from the substrate W.

According to the present preferred embodiment, the solubility of the high solubility component to the first peeling liquid is higher than that of the low solubility component to the first peeling liquid. Therefore, the high solubility solid 110 is more easily dissolved in the first peeling liquid than the low solubility solid 111.

Therefore, the first peeling liquid is supplied to the upper surface of the substrate W to dissolve the high solubility solid 110 in the first peeling liquid, thereby forming the penetrating hole 102 in the processing film 100. On the other hand, the low solubility solid 111 is not dissolved in the first peeling liquid but kept in a solid state.

Therefore, while the high solubility solid 110 is dissolved in the first peeling liquid, the low solubility solid 111 is not dissolved in the first peeling liquid but can be kept in a solid state. Accordingly, the first peeling liquid passes through the penetrating hole 102 formed by dissolution of the high solubility solid 110 and reaches the interface between the substrate W and the low solubility solid 111.

Therefore, while the removal object 103 is held by the low solubility solid 111, the first peeling liquid acts on the interface between the low solubility solid 111 and the substrate W. As a result, while the processing film 100 is quickly peeled from the substrate W, the removal object 103 can be removed efficiently from the substrate W together with the processing film 100.

Further, according to the present preferred embodiment, while the low solubility solid 111 contained in the processing film 100 is slightly dissolved in the first peeling liquid, the first peeling liquid effectively enters between the substrate W and the processing film 100. Therefore, the processing film 100 can be effectively peeled.

According to the present preferred embodiment, the first hydrophilizing liquid is supplied to the upper surface of the substrate W to hydrophilize the upper surface of the substrate W. The first hydrophilizing liquid is supplied to the upper surface of the substrate W, by which the first hydrophilizing liquid spreads on the upper surface of the substrate W and the first hydrophilizing liquid can spread over the entire upper surface of the substrate W. Thus, it is possible to uniformly hydrophilize the entire upper surface of the substrate W. Since the entire upper surface of the substrate W is hydrophilized, in the subsequent peeling step, the first peeling liquid easily acts on the interface between the processing film 100 and the substrate W on the entire upper surface of the substrate W. Therefore, the processing film 100 can be peeled uniformly from the entire upper surface of the substrate W.

According to the present preferred embodiment, the upper surface of the substrate W is hydrophilized so that the contact angle of pure water for the upper surface of the substrate W can be smaller than 41.7°. Therefore, the first peeling liquid fully acts on the interface between the substrate W and the processing film 100. Thereby, it is possible to effectively peel the processing film 100 in a state of holding the removal object 103 from the substrate W.

According to the present preferred embodiment, the contact angle of pure water for the processing film 100 is larger than 52° and smaller than 61°. If the contact angle of pure water for the processing film 100 is within this range, the affinity of the first peeling liquid for the processing film 100 is sufficiently high. Thus, the peeling liquid sufficiently enters between the substrate W and the processing film 100, thereby effectively peeling the processing film 100 from the substrate W.

According to the present preferred embodiment, at least any one of Si, SiN, $SiO_2$, SiGe, Ge, SiCN, W, TiN, Co, Cu, Ru and amorphous carbon is exposed from the upper surface of the substrate W and, therefore, the upper surface of the substrate W can be hydrophilized by the hydrophilization step. For example, where the surface layer 150 of the substrate W includes a TiN layer (barrier layer 153) and an oxidizing liquid is used as the first hydrophilizing liquid, the oxide film 171 is formed on a surface of the TiN layer, thus making it possible to hydrophilize the upper surface of the substrate W. In this way, the upper surface of the substrate W is hydrophilized in advance, and the processing film 100 can thereby be effectively peeled from the substrate W.

<Another Example of Substrate Processing According to First Preferred Embodiment>

FIG. 11 is a flowchart for describing another example of substrate processing by the substrate processing apparatus 1. The substrate processing shown in FIG. 11 is different from the substrate processing shown in FIG. 8 in that the first rinsing step (Step S3) and the replacing step (Step S4) are omitted. If the first hydrophilizing liquid used in the hydrophilization step is a liquid having compatibility with the processing liquid, as shown in FIG. 11, the first rinsing step (Step S3) and the replacing step (Step S4) can be omitted. The first hydrophilizing liquid is preferably the same liquid as the solvent contained in the processing liquid. The same liquid means that it is composed of the same substance. As an example of the first hydrophilizing liquid having compatibility with the processing liquid, the organic solvent such as IPA is cited.

<Experiment of Peeling Processing Film>

Figure 12A:
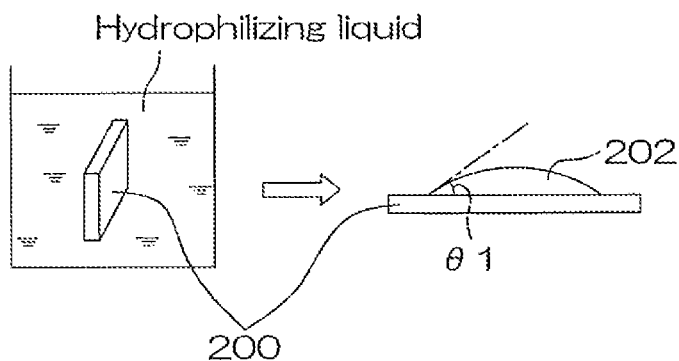
FIG. 12A is a schematic view for describing procedures for measuring a contact angle of pure water for a surface of an experimental substrate.
Figure 12B:
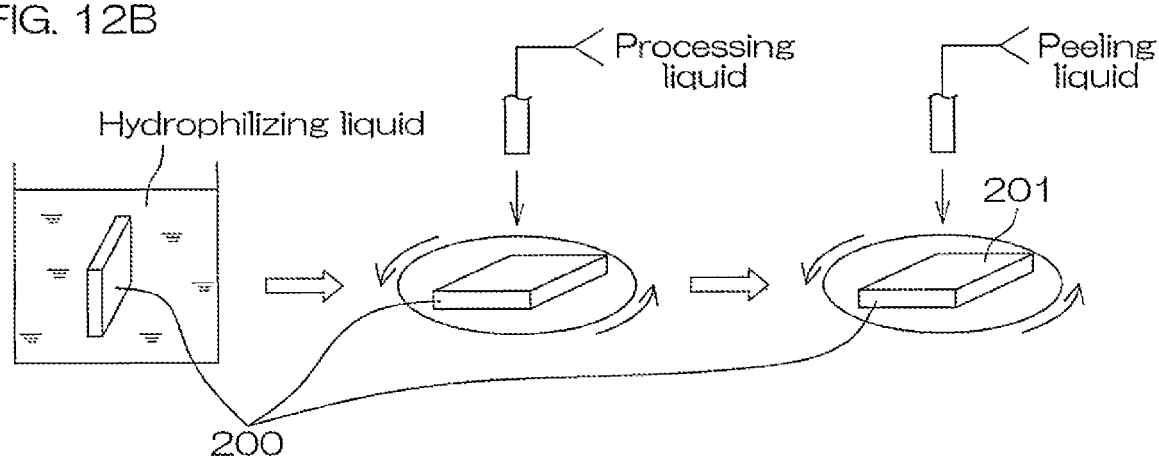
FIG. 12B is a schematic view for describing procedures for peeling a processing film from the experimental substrate.

Hereinafter, a description will be given of results of an experiment of peeling the processing film which was carried out for examining a relationship between a contact angle of pure water for a substrate and whether the processing film is peeled. FIG. 12A is a schematic view which describes procedures for measuring the contact angle of pure water for a surface an experimental substrate 200. FIG. 12B is a schematic view which describes procedures for peeling a processing film from the experimental substrate 200.

In this experiment, as the experimental substrate 200, a substrate in which any one of Si (bare silicon: Bare-Si), SiN, $SiO_2$, W, TiN, Co, Cu, Ru and amorphous carbon (a-C) is exposed from the surface was used, and as the hydrophilizing liquid, any one of hydrochloric acid, SC1, hydrofluoric acid, SPM and IPA was used.

The experimental substrate 200 used in this experiment is a small substrate in a square shape with the length of a side of 3 cm in plan view.

Hydrogen chloride of hydrochloric acid used in this experiment is 0.4% in mass percent concentration. SC1 used in this experiment is a liquid mixture of ammonia water with 0.4% of a mass percent concentration of ammonia, and a hydrogen peroxide solution with 3.5% of a mass percent concentration of hydrogen peroxide.

Hydrogen fluoride of hydrofluoric acid used in this experiment is 0.5% in mass percent concentration. SPM used in this experiment is a liquid mixture of heated dilute sulfuric acid with 64.0% of a mass percent concentration of sulfuric acid, and a hydrogen peroxide solution with 10.0% of a mass percent concentration of hydrogen peroxide. Pure water used in this experiment is DIW.

The experiment was carried out by various combinations of the substrate and the hydrophilizing liquid.

In order to measure the contact angle of pure water for the experimental substrate 200, as shown in FIG. 12A, the experimental substrate 200 was immersed in a hydrophilizing liquid. Thereafter, although not shown, DIW was used to clean the experimental substrate 200 to remove the hydrophilizing liquid from the experimental substrate 200. A droplet 202 of pure water (DIW) was formed on the hydrophilized experimental substrate 200 to measure a contact angle $\theta1$ of the droplet 202.

Then, in order to examine whether a processing film 201 is peeled from the experimental substrate 200, as shown in FIG. 12B, an unprocessed experimental substrate 200 was immersed into the hydrophilizing liquid. Thereafter, although not shown, the experimental substrate 200 was cleaned with pure water and/or IPA, whenever necessary. After that, while a processing liquid was supplied to the experimental substrate 200, the experimental substrate 200 was rotated at 10 rpm for about 2 seconds and, thereafter, the experimental substrate 200 was rotated at 1500 rpm for 30 seconds to form a processing film 201. While the experimental substrate 200 in which the processing film 201 was formed was rotated at 800 rpm, a peeling liquid was supplied to the experimental substrate 200. An observation was made for the surface of the experimental substrate 200 both before the supply of the processing liquid and after the supply of the peeling liquid for whether the processing film was peeled. As the peeling liquid, ammonia water with 0.4% of a mass percent concentration was used.

The processing liquid used in the experiment of peeling the processing film contains, as a solute, at least one type of a low solubility component selected from the low solubility components which will be described later and at least one type of a high solubility component selected from the high solubility components which will be described later. The processing liquid used in the experiment of peeling the processing film is a processing liquid PL4 used in an experiment of measuring a contact angle which will be described later by referring to FIG. 14 and FIG. 15.

FIG. 13 is a table which shows the contact angle $\theta1$ of pure water for the surface of the experimental substrate 200 and whether the processing film 201 is peeled off by use of the peeling liquid. FIG. 13 is a table for summarizing the results of the experiment of peeling the processing film.

The table of FIG. 13 shows columns of "surface of substrate," "hydrophilizing liquid," "contact angle (°) of pure water" and "peeling of processing film."

A name of a substance exposed from the surface of experimental substrate 200 is given in each line of "surface of substrate." A name of a substance of the hydrophilizing liquid used in hydrophilizing the experimental substrate 200 is given in each line of "hydrophilizing liquid." A line which shows "–" in "hydrophilizing liquid" means that the experiment of peeling the processing film was given to a substrate which was not hydrophilized. In each line of "contact angle (°) of pure water," a contact angle $\theta1$ of pure water for the experimental substrate 200 which was hydrophilized by using the hydrophilizing liquid given on the same line is described.

In each line of "peeling of the processing film," whether the processing film 201 was peeled off by the peeling liquid from the experimental substrate 200 hydrophilized by using the hydrophilizing liquid given in the same line is described. "OK" means that the processing film 201 was sufficiently peeled and "NG" means that the processing film 201 was insufficiently peeled.

For example, in the table of FIG. 13, the first line shows that the contact angle $\theta1$ of pure water for the experimental substrate 200 was 4.8° after the experimental substrate 200 with SiN exposed to the surface was hydrophilized with HCl, and the processing film 201 was sufficiently peeled from the experimental substrate 200 by the peeling liquid.

As shown in FIG. 13, where the contact angle $\theta1$ of pure water is not less than 41.7°, the processing film 201 was not sufficiently peeled.

As shown in FIG. 13, even if the substance exposed from the surface of the experimental substrate 200 is the same, a difference in hydrophilizing liquid will result in a difference in contact angle $\theta1$ of pure water for the surface of the experimental substrate 200. For example, where HF was used as the hydrophilizing liquid to hydrophilize the experimental substrate 200 in which TiN was exposed from the surface, the contact angle θ1 of pure water was 15.2° and the processing film 201 was sufficiently removed. Where SC1 was used as the hydrophilizing liquid to hydrophilize the experimental substrate 200 in which TiN was exposed from the surface, the contact angle θ1 of pure water was 28.3° and the processing film 201 was sufficiently removed. On the other hand, where IPA was used as the hydrophilizing liquid to hydrophilize the experimental substrate 200 in which TiN was exposed from the surface, the contact angle θ1 of pure water was 41.7° and the processing film 201 was removed insufficiently.

Therefore, it is presumed that the use of an oxidizing liquid as the hydrophilizing liquid enhances further the hydrophilicity of the surface of the substrate than the use of an organic solvent as the hydrophilizing liquid. As reasons thereof, the following are cited.

Where an organic solvent is used as the hydrophilizing liquid, a hydrophobic organic substance adhering to the surface of the substrate is dissolved in the organic solvent to hydrophilize the surface of the substrate. Depending on the type, etc., of the organic substance adhering to the surface of the substrate, there are some organic substances that are not dissolved in the organic solvent. Therefore, not all organic substances may be removed.

On the other hand, where an oxidizing liquid is used as the hydrophilizing liquid, a portion of the substrate near the surface thereof is oxidized to form an oxide film on the surface of the substrate. Therefore, regardless of the type etc., of the organic substance adhering to the surface of the substrate, it is possible to efficiently enhance the hydrophilicity of the surface of the substrate.

It is noted that where no hydrophilization was carried out, the contact angle of pure water for the experimental substrate 200 in which TiN was exposed from the surface was 59.6°. Therefore, even where any one of IPA, HF and SC1 was used as the hydrophilizing liquid, the experimental substrate 200 in which TiN was exposed from the surface was hydrophilized.

<Experiment of Measuring Contact Angle for Processing Film>

Figure 14:
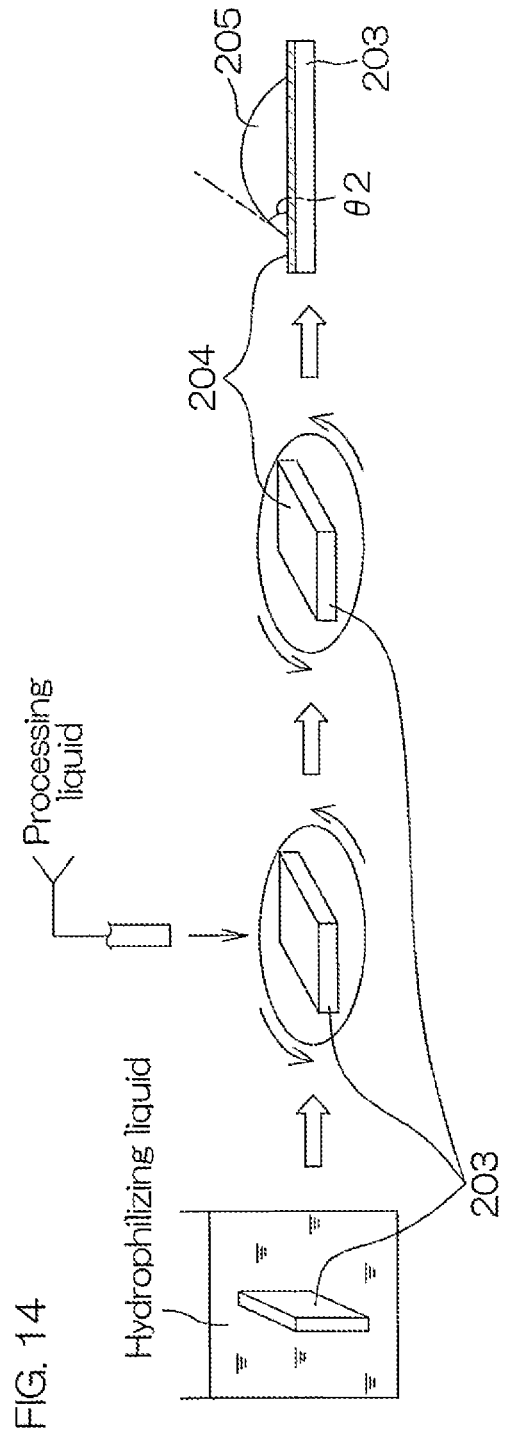
FIG. 14 is a schematic view for describing procedures for measuring a contact angle of pure water for the surface of the processing film.

Next, a description will be given of results of an experiment of measuring a contact angle in which the contact angle of pure water for a processing film formed on a surface of an experimental substrate was measured. FIG. 14 is a schematic view which describes procedures for measuring the contact angle of pure water for the surface of the processing film.

In this experiment, a substrate in which Si (bare silicon: Bare-Si) was exposed from the surface was used as an experimental substrate 203, and IPA was used as a hydrophilizing liquid. Four types of processing liquids PL1~PL4 were used as a processing liquid. Each of the processing liquids PL1~PL4 contains IPA as a solvent. Each of the processing liquids PL1~PL4 contains, as a solute, at least one type of a low solubility component selected from the low solubility components which will be described later and at least one type of a high solubility component selected from the high solubility components which will be described later. The low solubility components contained in the processing liquids PL1~PL4 are common. The high solubility components contained in the processing liquids PL1~PL4 are substances which are different from each other.

As shown in FIG. 15, the experimental substrate 203 was immersed in IPA as a hydrophilizing liquid. Then, although not shown, DIW was used to clean the experimental substrate 203. Thereafter, a processing liquid was dropped onto the surface of the experimental substrate 203. Thereafter, a solvent in the processing liquid was evaporated to form a processing film 204 on the surface of the experimental substrate 203. After that, a droplet 205 of pure water (DIW) was made on the processing film 204 formed in the experimental substrate 203 to measure a contact angle θ2 of the droplet 205.

FIG. 15 is a table which shows a contact angle θ2 of pure water for the surface of the processing film 204 and whether the processing film 204 is peeled off by a peeling liquid.

The table of FIG. 15 shows columns of "processing liquid" and "contact angle (°) of pure water." In each line of "processing liquid," each of the processing liquids PL1~PL4 used for forming the processing film 204 is described. In each line of "contact angle (°) of pure water," the contact angle θ2 of pure water for the processing film 204 formed by using the processing liquid shown in the same line is described. The contact angle θ2 of pure water for the processing film 204 was an angle within a range of not less than 52° and not more than 61°. Therefore, it is presumed that the processing film formed in the hydrophilized substrate can be effectively peeled off by the peeling liquid if the contact angle θ2 of pure water for the processing film 204 is within the range.

<Configuration of Substrate Processing Apparatus According to Second Preferred Embodiment>

Figure 16:
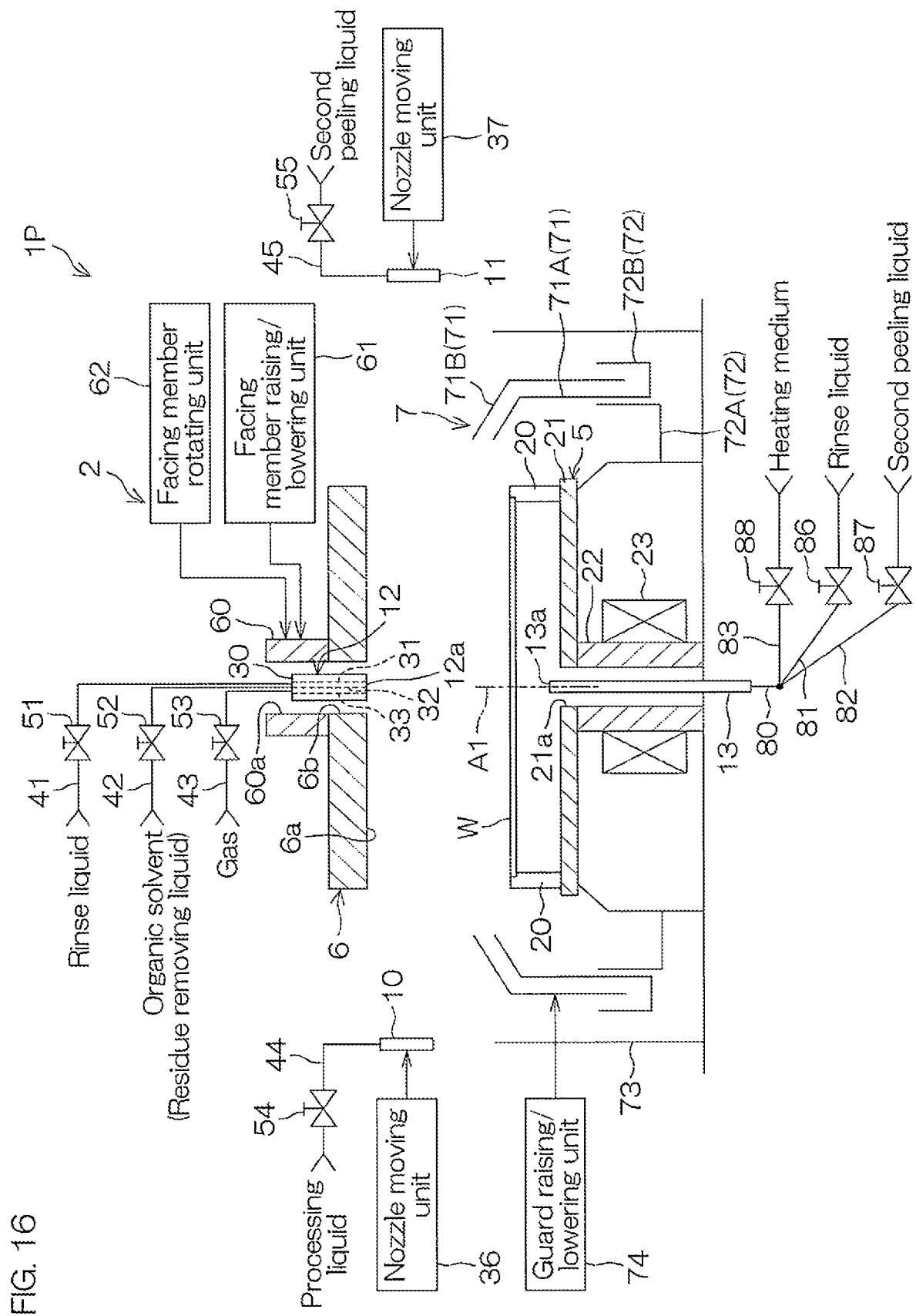
FIG. 16 is a schematic partial sectional view which shows a general configuration of a processing unit included in a substrate processing apparatus according to a second preferred embodiment of the present invention.

FIG. 16 is a schematic view which describes an configuration example of a processing unit 2 of a substrate processing apparatus 1P according to a second preferred embodiment. In FIG. 16, the same configuration as that shown in FIG. 1~FIG. 15 which has been described previously will be given the same reference numeral as that of FIG. 1, etc., with a description thereof omitted. In FIG. 17~FIG. 21 which will be described later as well, the same reference numeral as that appeared in FIG. 1, etc., will be given, with a description thereof omitted.

The substrate processing apparatus 1P according to the second preferred embodiment is different from the substrate processing apparatus 1 according to the first preferred embodiment mainly in that a peeling liquid discharged from a third moving nozzle 11 is a second peeling liquid such as diluted IPA on an upper surface of a substrate W and a surface of the substrate W can be hydrophilized by the second peeling liquid. Therefore, a first moving nozzle 9 for discharging a hydrophilizing liquid is not provided.

A processing film is more easily dissolved in an organic solvent than an alkaline aqueous solution (alkaline liquid) such as ammonia water, pure water and an aqueous solution (non-alkaline aqueous solution) which is neutral or acidic. Individual components (solvent, low solubility component, high solubility component and corrosion preventive component) contained in a processing liquid are the same as those of the above-described first preferred embodiment, and the details thereof will be described later.

As the second peeling liquid, a liquid which is more likely to dissolve the high solubility component contained in the processing liquid than the low solubility component contained in the processing liquid is used. The second peeling liquid is, for example, a diluted organic solvent such as diluted IPA. The diluted organic solvent is an organic solvent that is diluted with pure water or a liquid mixture of an organic solvent and pure water. In the present preferred embodiment, DIW is used as pure water.

Where the second peeling liquid is diluted IPA, a mass percent concentration of IPA in the second peeling liquid is preferably not less than 1% and not more than 33%, more preferably not less than 12% and not more than 33%, and even more preferably not less than 20% and not more than 33%.

If the mass percent concentration of IPA in the second peeling liquid is not less than 1% and not more than 33%, the processing film can be peeled from the substrate W, while the processing film on the substrate W is dissolved appropriately.

The second peeling liquid is a liquid capable of hydrophilizing (enhancing the hydrophilicity of) the upper surface of the substrate W.

If the mass percent concentration of IPA in diluted IPA is not less than 12%, a contact angle of diluted IPA for the surface of the substrate W is smaller than 41.7°. If the mass percent concentration of IPA in diluted IPA is not less than 12%, the surface of the substrate W can be appropriately hydrophilized.

Figure 17:
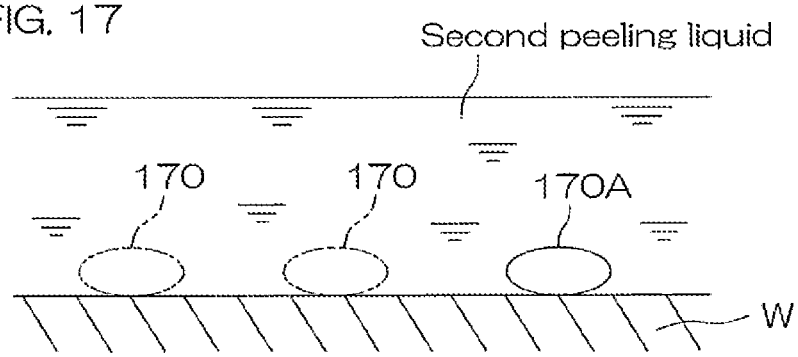
FIG. 17 is a schematic view for describing conditions in which a surface of a substrate is hydrophilized by a peeling liquid.

Next, a description will be given of conditions in which the surface of the substrate W is hydrophilized. FIG. 17 is a schematic view for describing conditions in which the surface of the substrate W is hydrophilized by the second peeling liquid. Where a diluted organic solvent such as diluted IPA is used as the second peeling liquid, as shown in FIG. 17, a hydrophobic organic substance 170 present on the surface of the substrate W is dissolved by the second peeling liquid to hydrophilize the surface of the substrate W. Where an organic substance 170A less likely to be dissolved in the diluted organic solvent is present on the surface of the substrate W, the organic substance 170A remains on the substrate W even after hydrophilization of the surface of the substrate W.

An organic substance is a part of a removal object present on the surface of the substrate W. Even if the organic substance is removed by an organic solvent, the removal object cannot be removed sufficiently. Therefore, even where the surface of the substrate W is hydrophilized by the diluted organic solvent, it is necessary to remove the removal object by peeling of a processing film.

The substrate W having a surface from which at least any one of Si, SiN, SiO$_2$, SiGe, Ge, SiCN, W, TiN, Co, Cu, Ru and a-C is exposed can be hydrophilized by the second peeling liquid. In particular, the substrate W having a surface from which at least any one of Si, SiN, SiO$_2$, W, TiN, Co, Cu, Ru and a-C is exposed is easily hydrophilized by the second peeling liquid, and the substrate W having a surface from which at least any one of Si, SiN, SiO$_2$, W, TiN, Co and Cu is exposed is more likely to be hydrophilized by the second peeling liquid.

If the contact angle of pure water for the processing film is larger than 52° and smaller than 61°, a second peeling liquid which will be described later sufficiently acts on an interface between the substrate W and the processing film. The use of the processing liquid makes it possible to form a processing film in which the contact angle of pure water is larger than 52° and smaller than 61°.

The organic solvent discharged from the central nozzle 12 is an organic solvent which is composed of the same substance (organic compound) as the organic solvent in the diluted organic solvent as a second peeling liquid. Therefore, the organic solvent has compatibility with the second peeling liquid. The organic solvent dissolves and removes a residue of the processing liquid, which remains on the upper surface of the substrate W after the processing film is peeled and removed from the upper surface of the substrate W by the second peeling liquid. The organic solvent functions as a residue removing liquid. The residue removing liquid is also referred to as a residue dissolving liquid. The properties of the residue removing liquid are as per the above description. As the organic solvent discharged from the central nozzle 12, there can be used, for example, organic solvents which are cited as the organic solvents discharged from the central nozzle 12 in the first preferred embodiment. In the present preferred embodiment, the second peeling liquid discharged from the lower surface nozzle 13 is the same as the second peeling liquid discharged from the third moving nozzle 11 and, therefore, a description thereof will be omitted.

<Substrate Processing According to Second Preferred Embodiment>

Figure 18:
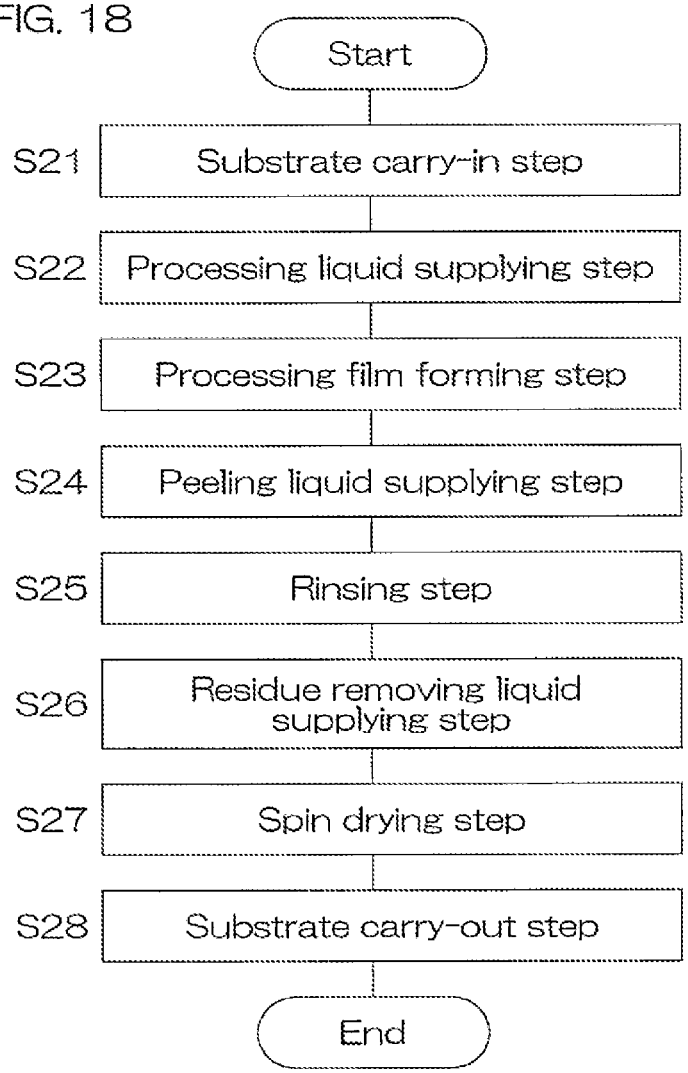
FIG. 18 is a flowchart for describing an example of substrate processing by the substrate processing apparatus according to the second preferred embodiment.

FIG. 18 is a flowchart for describing an example of substrate processing by the substrate processing apparatus 1P. FIG. 18 shows processing which is realized mainly by the controller 3 which executes programs. FIG. 19A~FIG. 19F are each a schematic view for describing conditions of each step of the substrate processing.

In the substrate processing by the substrate processing apparatus 1P, for example, as shown in FIG. 18, a substrate carry-in step (Step S21), a processing liquid supplying step (Step S22), a processing film forming step (Step S23), a peeling liquid supplying step (Step S24), a rinsing step (Step S25), a residue removing liquid supplying step (Step S26), a spin drying step (Step S27) and a substrate carry-out step (Step S28) are executed in this order.

Hereinafter, a reference is mainly made to FIG. 16 and FIG. 18. A reference is made to FIG. 19A~FIG. 19F, whenever necessary.

First, an unprocessed substrate W is carried in a processing unit 2 from a carrier C by transfer robots IR, CR (refer to FIG. 1) and transferred to a spin chuck 5 (Step S1). Thereby, the substrate W is kept horizontally by the spin chuck 5 (substrate holding step). When the substrate W is carried in, a facing member 6 retracts to an upper position.

Holding of the substrate W by the spin chuck 5 is continued until the spin drying step (Step S27) ends. During a period of time from the start of the substrate holding step to the end of the spin drying step (Step S27), a guard raising/lowering unit 74 adjusts a height position of a first guard 71A and that of a second guard 71B so that at least one of guards 71 may be positioned at an upper position.

In a state that the substrate W is held by the spin chuck 5, a spin motor 23 rotates a spin base 21. Thereby, the rotation of the substrate W held horizontally is started (substrate rotating step). A facing member rotating unit 62 may rotate the facing member 6 synchronously with the spin base 21. Synchronous rotation is to rotate the facing member 6 in the same direction and at the same rotational speed as the spin base 21.

Next, the processing liquid supplying step (Step S22) in which, after the transfer robot CR has been retracted outside the processing unit 2, a processing liquid is supplied to the upper surface of the substrate W is executed. Specifically, in a state that the facing member 6 is positioned at the retract position, a second nozzle moving unit 36 moves a second moving nozzle 10 to a processing position. The processing position of the second moving nozzle 10 is, for example, a central position. When the facing member 6 is positioned at the retract position, each of moving nozzles moves horizontally between the facing member 6 and the substrate W. The retract position may be an upper position.

Figure 19A:
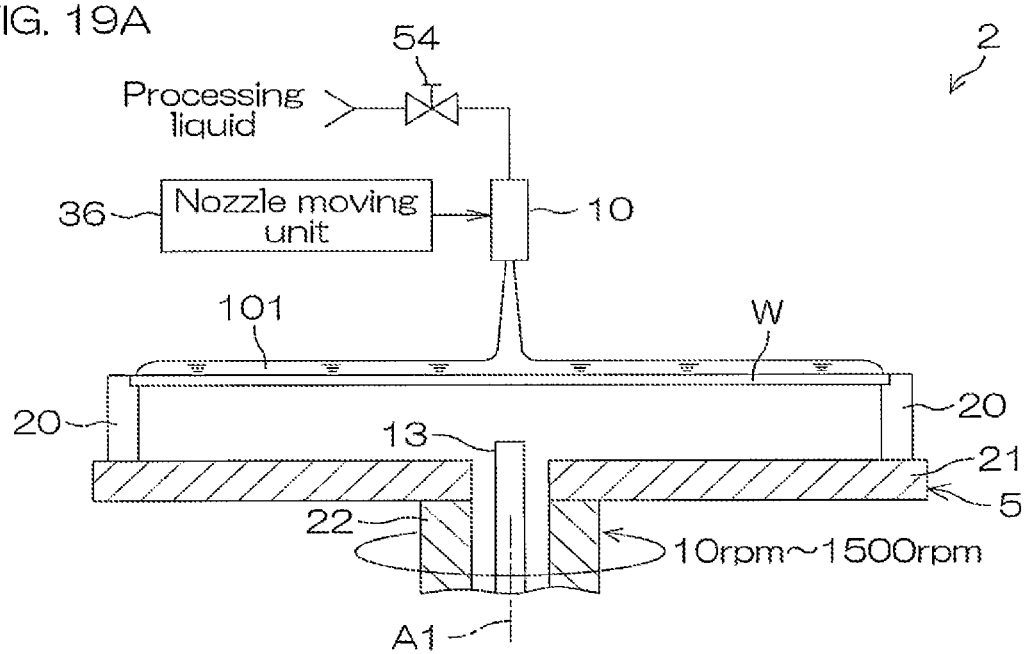
FIG. 19A is a schematic view for describing conditions of a processing liquid supplying step (Step S22) in the substrate processing according to the second preferred embodiment.

In a state that the second moving nozzle 10 is at the processing position, a processing liquid valve 54 is opened. Thereby, as shown in FIG. 19A, a processing liquid is supplied (discharged) from the second moving nozzle 10 toward the central region of the upper surface of the substrate W in the rotating state (processing liquid supplying step, processing liquid discharging step). The processing liquid supplied to the upper surface of the substrate W spreads over the entire substrate W by a centrifugal force. Thereby, a liquid film 101 of the processing liquid (processing liquid film) is formed on the substrate W (processing liquid film forming step).

The supply of the processing liquid from the second moving nozzle 10 is continued for a predetermined time of, for example, 2 seconds~4 seconds. In the processing liquid supplying step, the substrate W is rotated at a predetermined processing liquid rotational speed of, for example, 10 rpm~1500 rpm.

Figure 19B:
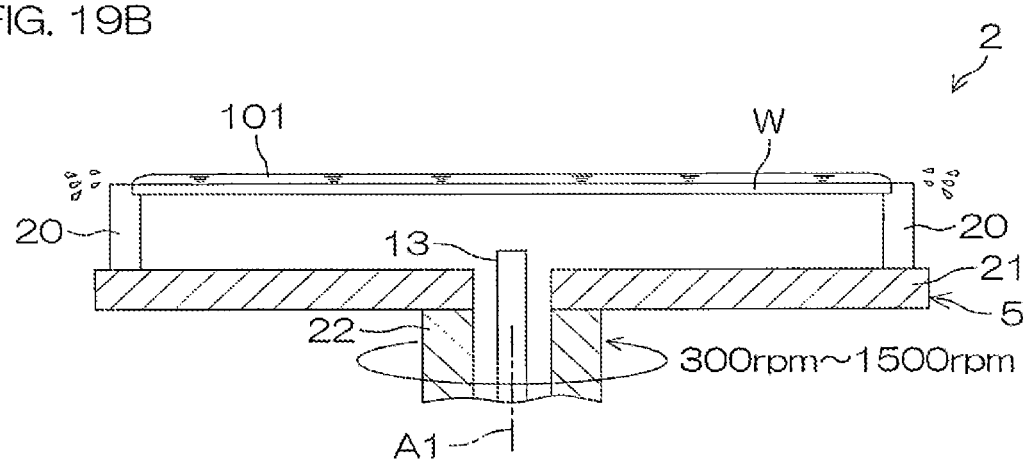
FIG. 19B is a schematic view for describing conditions of a processing film forming step (Step S23) in the substrate processing according to the second preferred embodiment.
Figure 19C:
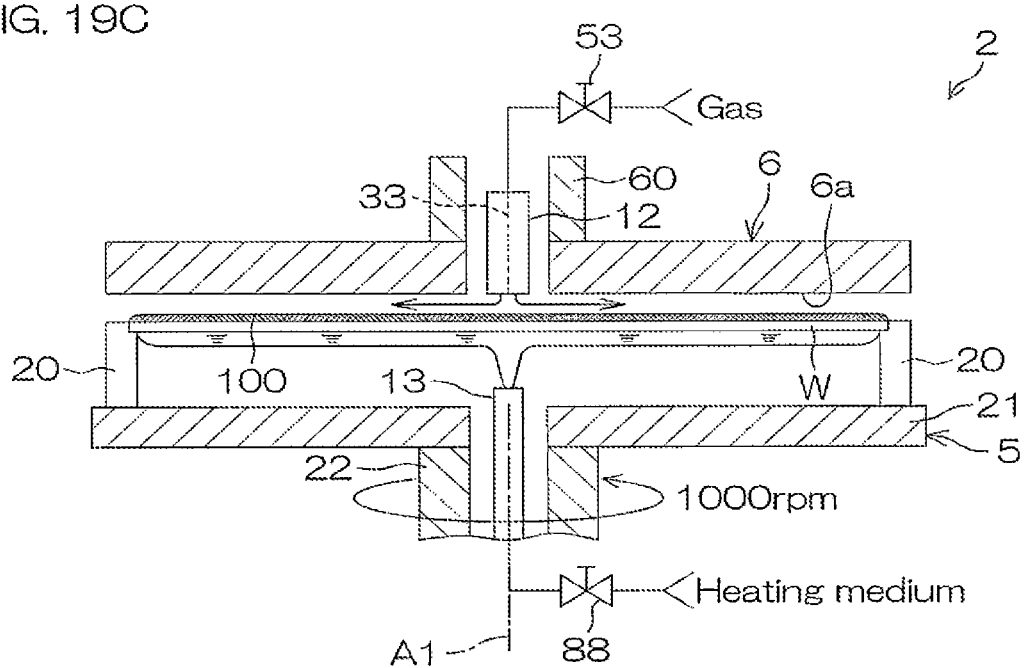
FIG. 19C is a schematic view for describing conditions of a processing film forming step (Step S23) in the substrate processing according to the second preferred embodiment.

Next, the processing film forming step (Step S23) shown in FIG. 19B and FIG. 19C is executed. In the processing film forming step, the processing liquid on the substrate W is solidified or cured to form, on the upper surface of the substrate W, a processing film 100 which holds a removal object present on the substrate W (refer to FIG. 19C).

In the processing film forming step, first, a processing liquid film thinning step (processing liquid spin off step) in which the liquid film 101 of the processing liquid on the substrate W is made thin in thickness is executed. Specifically, the processing liquid valve 54 is closed. Thereby, as shown in FIG. 19B, the supply of the processing liquid to the substrate W is stopped. Then, the second nozzle moving unit 36 moves the second moving nozzle 10 to a home position.

As shown in FIG. 19B, in the processing liquid film thinning step, the substrate W is rotated in a state that the supply of the processing liquid to the upper surface of the substrate W is stopped and, therefore, the processing liquid is partially removed from the upper surface of the substrate W. The liquid film 101 on the substrate W is, thereby, made appropriate in thickness. Even after movement of the second moving nozzle 10 to the home position, the facing member 6 is kept at the retract position.

In the processing liquid film thinning step, the spin motor 23 changes a rotational speed of the substrate W to a predetermined processing liquid film thinning speed. The processing liquid film thinning speed is, for example, 300 rpm~1500 rpm. The rotational speed of the substrate W may be kept fixed within a range of 300 rpm~1500 rpm or may be changed within a range of 300 rpm~1500 rpm whenever necessary during the processing liquid film thinning step. The processing liquid film thinning step is executed for a predetermined time of, for example, 30 seconds.

In the processing film forming step, a processing liquid solvent evaporation step in which, after the processing liquid film thinning step, a solvent is partially evaporated (volatilized) from the liquid film 101 of the processing liquid is executed. In the processing liquid solvent evaporation step, the liquid film 101 on the substrate W is heated for partially evaporating the solvent of the processing liquid on the substrate W.

Specifically, as shown in FIG. 19C, the facing member raising/lowering unit 61 moves the facing member 6 to a proximity position. The proximity position may be a lower position. The proximity position is a position in which a distance from the upper surface of the substrate W to the facing surface 6a is, for example, 1 mm.

Next, the gas valve 53 is opened. Thereby, a gas is supplied to a space between the upper surface of the substrate W (the upper surface of the liquid film 101) and the facing surface 6a of the facing member 6 (gas supplying step).

Evaporation (volatilization) of the solvent in the liquid film 101 is promoted by the gas being blown onto the liquid film 101 on the substrate W (processing liquid solvent evaporation step, processing liquid solvent evaporation promoting step). Therefore, it is possible to shorten a time necessary for forming the processing film 100. In the processing film forming step, the central nozzle 12 functions as an evaporation unit (evaporation promoting unit) for evaporating the solvent in the processing liquid.

Even after removal of a portion of the processing liquid from the substrate W by the processing liquid film thinning step of the liquid film 101, the rotation of the facing member 6 and the substrate W is continued. Therefore, a centrifugal force resulting from the rotation of the facing member 6 and the substrate W acts on a gas which is discharged from the central nozzle 12. Due to action of the centrifugal force, a gas stream in which the gas moves from a central side of the substrate W to a peripheral edge side thereof is formed. Therefore, elimination of a gaseous solvent in contact with the liquid film 101 from a space between the facing member 6 and the substrate W is promoted. Thereby, evaporation of the solvent in the liquid film 101 is promoted. In this way, the facing member 6 and the spin motor 23 function as an evaporation unit (evaporation promoting unit) for evaporating (volatilizing) the solvent in the processing liquid. Only the substrate W may be rotated, with the facing member 6 not being rotated.

Also, the heating medium valve 88 is opened. Thereby, as shown in FIG. 19C, a heating medium is supplied (discharged) from the lower surface nozzle 13 toward the central region of the lower surface of the substrate W in the rotating state (heating medium supplying step, heating medium discharging step). The heating medium supplied from the lower surface nozzle 13 to the lower surface of the substrate W spreads radially by receiving a centrifugal force and spreads over the entire lower surface of the substrate W.

The supply of the heating medium to the substrate W is continued for a predetermined time of, for example, 60 seconds. In the processing liquid solvent evaporation step, the substrate W is rotated at a predetermined evaporation rotational speed of, for example, 1000 rpm.

By the supply of the heating medium to the lower surface of the substrate W, the liquid film 101 on the substrate W is heated via the substrate W. The evaporation (volatilization) of the solvent in the liquid film 101 is, thereby, promoted (processing liquid solvent evaporation step, processing liquid solvent evaporation promoting step). Thus, it is possible to shorten a time necessary for forming the processing film 100. In the processing film forming step as well, the lower surface nozzle 13 functions as an evaporation unit (evaporation promoting unit) for evaporating (volatilizing) the solvent in the processing liquid.

By execution of the processing liquid film thinning step and the processing liquid solvent evaporation step, the processing liquid is solidified or cured. Thereby, a processing film 100 which holds a removal object is formed on the entire upper surface of the substrate W.

In this way, the substrate rotating unit (spin motor 23), the facing member rotating unit 62, the central nozzle 12 and the lower surface nozzle 13 form a processing film forming unit in which the processing liquid is solidified or cured to form the processing film 100 in a solid state.

Gas blowing, rotation of the substrate W and heating of the substrate W can be used to quickly form the processing film 100. However, it is also possible to form the processing film 100 by the gas blowing and rotation of the substrate W. In other words, heating by a heating medium is not always necessary in formation of the processing film 100. Therefore, the supply of the heating medium to the substrate W may be omitted.

In the processing liquid solvent evaporation step, the substrate W is preferably heated so that a temperature of the substrate W may be less than a boiling point of the solvent. The substrate W is heated up to the temperature less than the boiling point of the solvent, by which excessive evaporation of the solvent can be suppressed and the solvent remains appropriately in the processing film 100. Thus, in comparison to a case in which no solvent remains in the processing film 100, the second peeling liquid easily acts on the processing film 100 in the subsequent peeling liquid supplying step (Step S24).

Next, the peeling liquid supplying step (Step S24) in which the second peeling liquid is supplied toward the upper surface of the substrate W is executed. Specifically, the heating medium valve 88 is closed. Thereby, the supply of the heating medium to the lower surface of the substrate W is stopped. Also, the gas valve 53 is closed. The supply of the gas to a space between the facing surface 6a of the facing member 6 and the upper surface of the substrate W is thereby stopped.

Then, the facing member raising/lowering unit 61 moves the facing member 6 to a retract position. In a state that the facing member 6 is positioned at the retract position, the third nozzle moving unit 37 moves the third moving nozzle 11 to a processing position. The processing position of the third moving nozzle 11 is, for example, a central position.

Figure 19D:
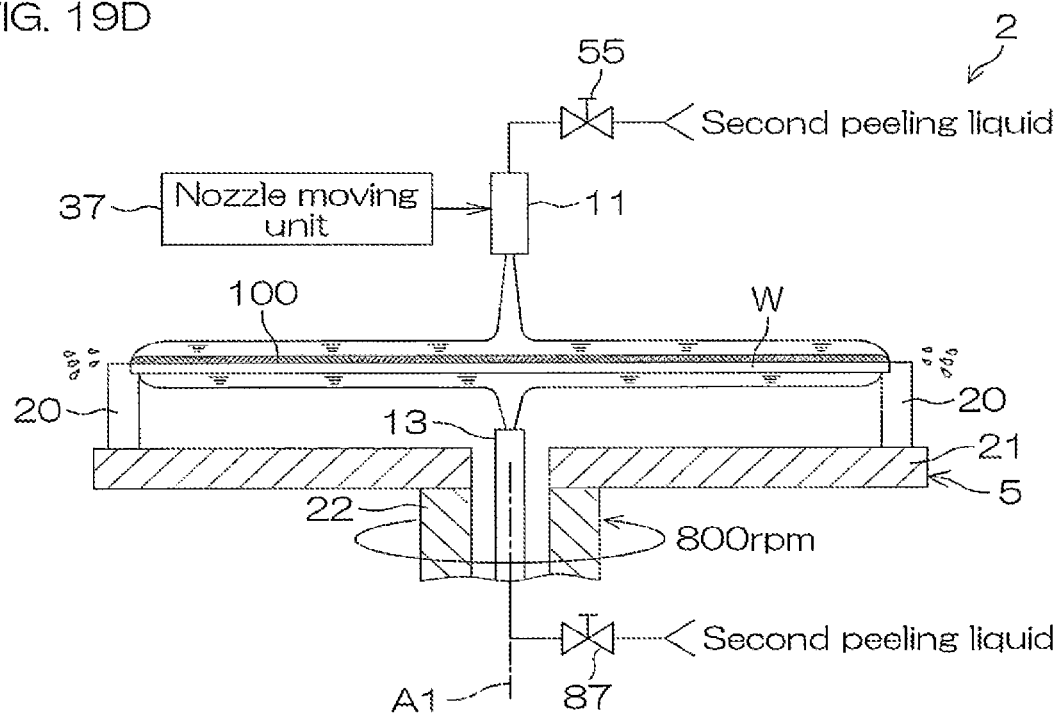
FIG. 19D is a schematic view for describing conditions of a peeling liquid supplying step (Step S24) in the substrate processing according to the second preferred embodiment.

Then, in a state that the third moving nozzle 11 is positioned at the processing position, the upper peeling liquid valve 55 is opened. Thereby, as shown in FIG. 19D, the second peeling liquid is supplied (discharged) from the third moving nozzle 11 toward the central region of the upper surface of the substrate W in the rotating state (upper peeling liquid supplying step, upper peeling liquid discharging step). The peeling liquid supplied to the upper surface of the substrate W spreads over the entire upper surface of the substrate W by a centrifugal force. Thereby, the processing film 100 on the upper surface of the substrate W is peeled and removed outside the substrate W together with the second peeling liquid.

At the same time when the upper peeling liquid valve 55 is opened, the lower peeling liquid valve 87 is opened. Thereby, as shown in FIG. 19D, the second peeling liquid is supplied (discharged) from the lower surface nozzle 13 toward the central region of the lower surface of the substrate W in the rotating state (lower peeling liquid supplying step, lower peeling liquid discharging step). The second peeling liquid supplied to the lower surface of the substrate W spreads over the entire lower surface of the substrate W by a centrifugal force.

The supply of the second peeling liquid to the upper surface and the lower surface of the substrate W is continued for a predetermined time of, for example, 60 seconds. In the peeling liquid supplying step, the substrate W is rotated at a predetermined peeling rotational speed of, for example, 800 rpm.

Here, there may be a possibility in which, in the processing liquid supplying step (Step S22) shown in FIG. 19A, the processing liquid supplied to the upper surface of the substrate W adheres to the lower surface of the substrate W via a peripheral edge of the substrate W and the processing liquid adhering to the lower surface of the substrate W is solidified or cured to form a solid.

Even in this case, as shown in FIG. 19D, in the peeling liquid supplying step (Step S24), during a time when the second peeling liquid is supplied to the upper surface of the substrate W, the second peeling liquid is supplied (discharged) from the lower surface nozzle 13 to the lower surface of the substrate W. Therefore, even in a case in which a solid of the processing liquid is formed on the lower surface of the substrate W, the solid can be peeled from the lower surface of the substrate W and removed.

After the peeling liquid supplying step (Step S24), the rinsing step (Step S25) in which the second peeling liquid is washed away from the substrate W by a rinse liquid is executed. Since the second peeling liquid is expelled outside the substrate W by the rinse liquid, the rinsing step (Step S25) is also referred to as a peeling liquid expelling step.

Figure 19E:
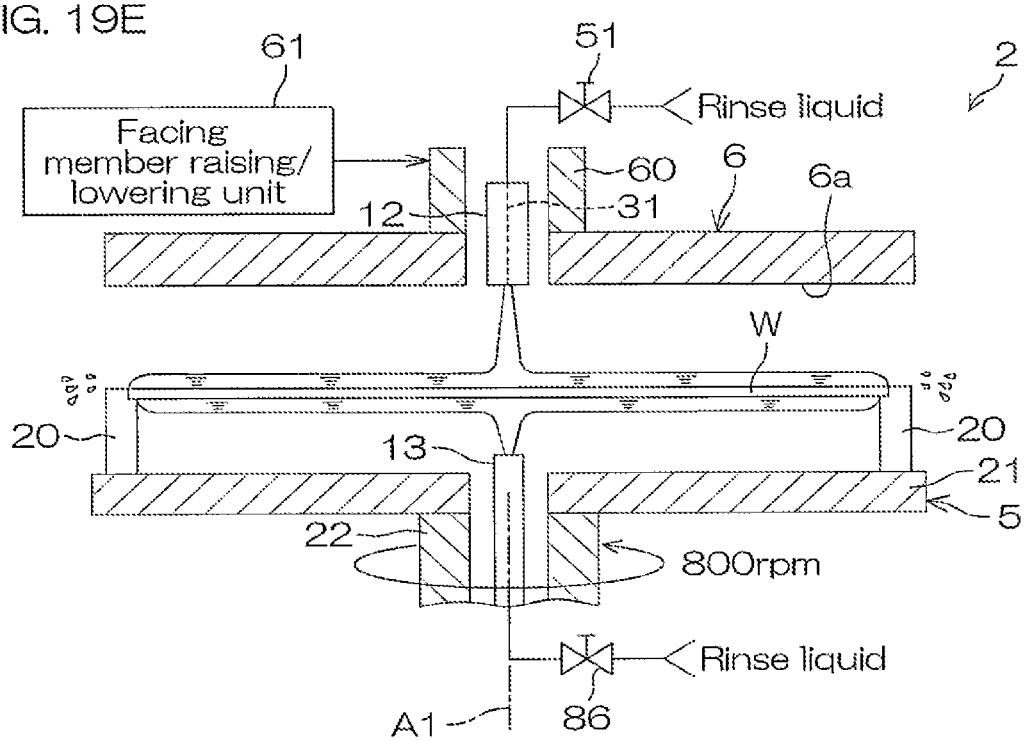
FIG. 19E is a schematic view for describing conditions of a rinsing step (Step S25) in the substrate processing according to the second preferred embodiment.

Specifically, the upper peeling liquid valve 55 and the lower peeling liquid valve 87 are closed. Thereby, the supply of the second peeling liquid to the upper surface and the lower surface of the substrate W is stopped. Then, the third nozzle moving unit 37 moves the third moving nozzle 11 to the home position. Then, as shown in FIG. 19E, the facing member raising/lowering unit 61 moves the facing member 6 to the processing position between the retract position and the lower position. When the facing member 6 is positioned at the processing position, a distance between the upper surface of the substrate W and the facing surface 6a is, for example, 30 mm.

Then, in a state that the facing member 6 is positioned at the processing position, the upper rinse liquid valve 51 is opened. Thereby, as shown in FIG. 19E, the rinse liquid is supplied (discharged) from the central nozzle 12 toward the central region of the upper surface of the substrate W in the rotating state (upper rinse liquid supplying step, upper rinse liquid discharging step). The rinse liquid supplied to the upper surface of the substrate W spreads over the entire upper surface of the substrate W by a centrifugal force. Thereby, the second peeling liquid adhering to the upper surface of the substrate W is expelled outside the substrate W together with the rinse liquid and replaced with the rinse liquid (peeling liquid expelling step).

Also, at the same time when the upper rinse liquid valve 51 is opened, the lower rinse liquid valve 86 is opened. Thereby, as shown in FIG. 19E, the rinse liquid is supplied (discharged) from the lower surface nozzle 13 toward the central region of the lower surface of the substrate W in the rotating state (lower rinse liquid supplying step, lower rinse liquid discharging step). Thereby, the second peeling liquid adhering to the lower surface of the substrate W is expelled outside the substrate W together with the rinse liquid and replaced with the rinse liquid (lower peeling liquid expelling step).

The supply of the rinse liquid to the upper surface and the lower surface of the substrate W is continued for a predetermined time of, for example, 30 seconds. In the rinsing step (Step S25), the substrate W is rotated at a predetermined peeling liquid removing rotational speed of, for example, 800 rpm.

Next, the residue removing liquid supplying step (Step S28) in which the residue removing liquid such as IPA is supplied is executed.

Figure 19F:
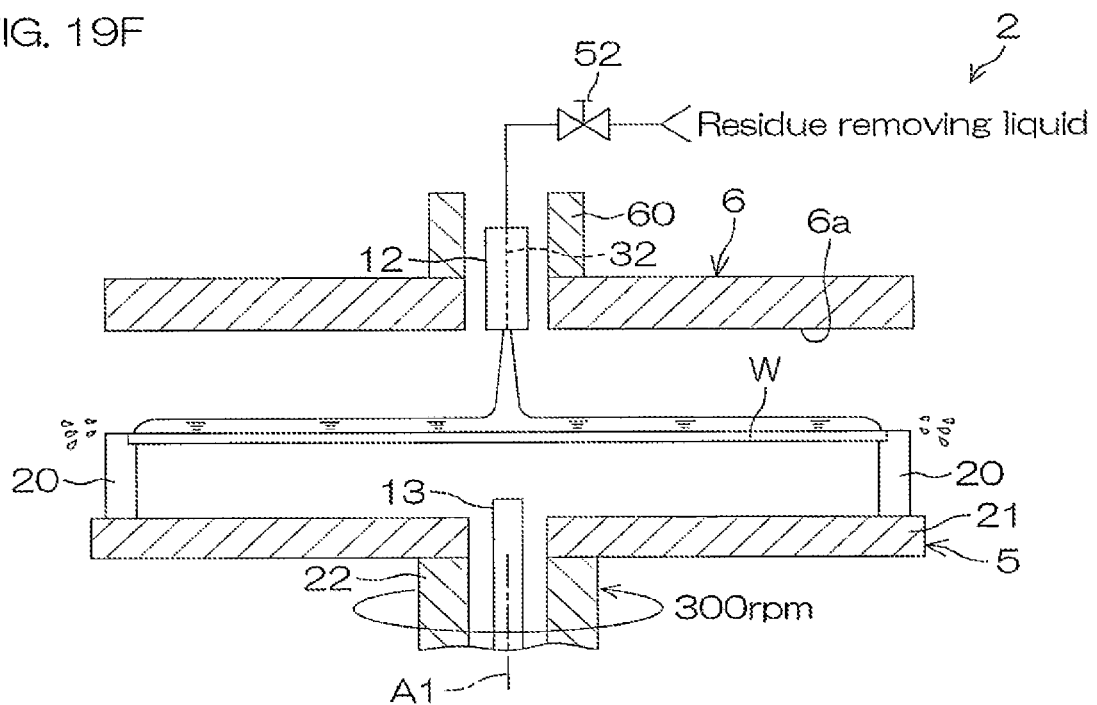
FIG. 19F is a schematic view for describing conditions of a residue removing liquid supplying step (Step S26) in the substrate processing according to the second preferred embodiment.
Figure 20A:
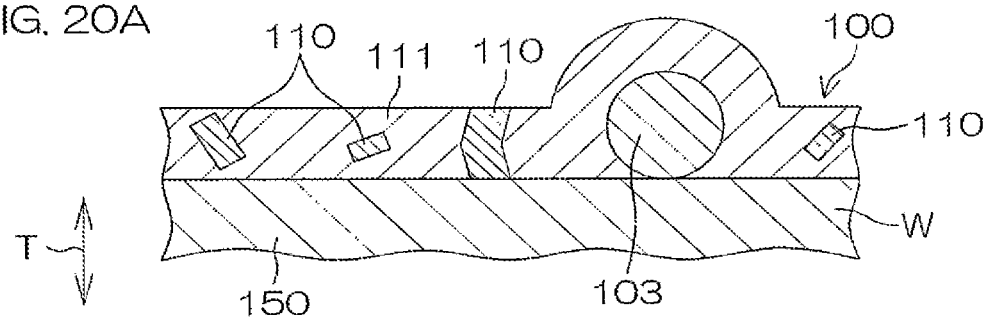
FIG. 20A is a schematic view for describing conditions in which a processing film is peeled from a surface of a substrate.
Figure 20B:
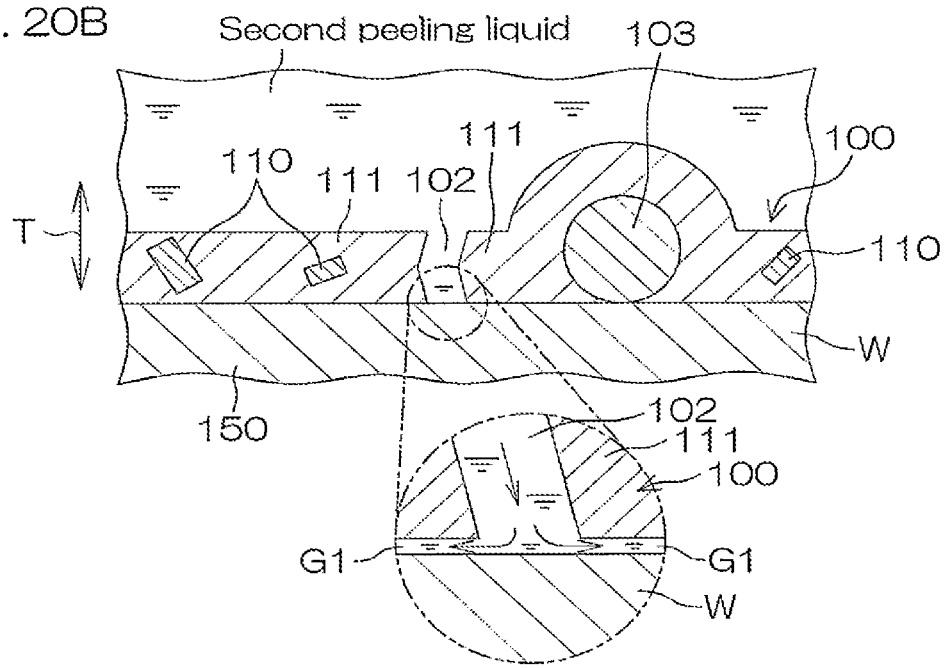
FIG. 20B is a schematic view for describing conditions in which the processing film is peeled from the surface of the substrate.
Figure 20C:
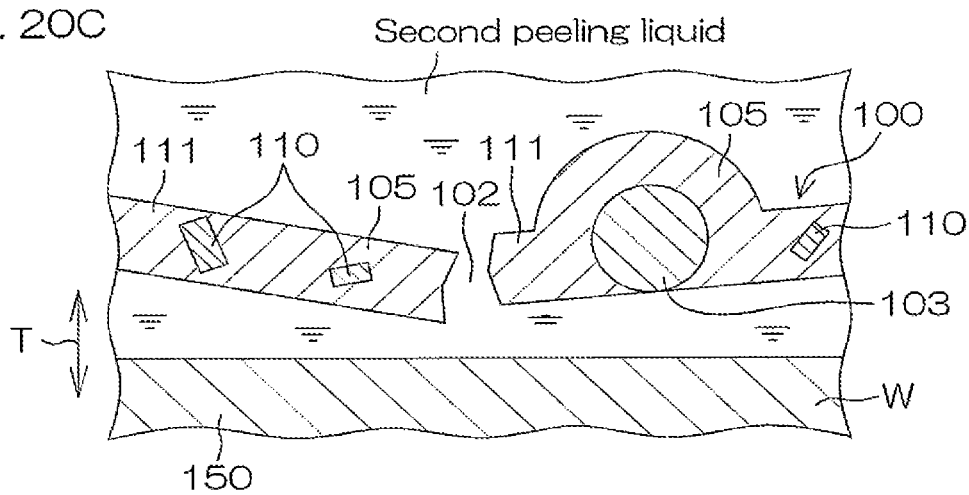
FIG. 20C is a schematic view for describing conditions in which the processing film is peeled from the surface of the substrate.

Specifically, the upper rinse liquid valve 51 and the lower rinse liquid valve 86 are closed. Thereby, the supply of the rinse liquid to the upper surface and the lower surface of the substrate W is stopped. Then, in a state that the facing member 6 is positioned at the processing position, the organic solvent valve 52 is opened. Thereby, as shown in FIG. 19F, the residue removing liquid (organic solvent) is supplied (discharged) from the central nozzle 12 toward the central region of the upper surface of the substrate W in the rotating state (residue removing liquid supplying step, residue removing liquid discharging step).

The residue removing liquid supplied from the central nozzle 12 to the upper surface of the substrate W spreads radially by receiving a centrifugal force and spreads over the entire upper surface of the substrate W. There may be a case in which a residue of the processing film remains on the upper surface of the substrate W even after the processing film has been peeled from the substrate W by the second peeling liquid and removed outside the substrate W. The residue removing liquid supplied to the upper surface of the substrate W dissolves the residue of the processing film. The residue removing liquid which has dissolved the residue of the processing film is expelled from a peripheral edge of the upper surface of the substrate W by a centrifugal force. Thereby, the residue of the processing film on the substrate W is removed (residue removing step).

In the residue removing liquid supplying step, the discharge of the residue removing liquid from the central nozzle 12 is continued for a predetermined time of, for example, 30 seconds. In the residue removing liquid supplying step, the substrate W is rotated at a predetermined residue removing rotational speed of, for example, 300 rpm.

Next, the spin drying step (Step S7) in which the substrate W is rotated at a high speed to dry the upper surface of the substrate W is executed. Specifically, the organic solvent valve 52 is closed. Thereby, the supply of the organic solvent to the upper surface of the substrate W is stopped. Then, the facing member raising/lowering unit 61 moves the facing member 6 to a drying position lower than the processing position. When the facing member 6 is positioned at the drying position, a distance between the facing surface 6a of the facing member 6 and the upper surface of the substrate W is, for example, 1.5 mm. Then, the gas valve 53 is opened. Thereby, a gas is supplied to a space between the upper surface of the substrate W and the facing surface 6a of the facing member 6.

Then, the spin motor 23 accelerates the rotation of the substrate W to rotate the substrate W at a high speed. The substrate W in the spin drying step is rotated at a drying speed of, for example, 1500 rpm. The spin drying step is executed for a predetermined time of, for example, 30 seconds. Thereby, a large centrifugal force acts on an organic solvent on the substrate W and the organic solvent on the substrate W is spun off around the substrate W. In the spin drying step, a gas is supplied to a space between the upper surface of the substrate W and the facing surface 6a of the facing member 6, thereby promoting the evaporation of the organic solvent.

Then, the spin motor 23 stops the rotation of the substrate W. The guard raising/lowering unit 74 moves the first guard 71A and the second guard 71B to the lower position. The gas valve 53 is closed. Then, the facing member raising/lowering unit 61 moves the facing member 6 to an upper position.

The transfer robot CR enters the processing unit 2, scoops up a processed substrate W from the chuck pin 20 of the spin chuck 5 and carries it outside the processing unit 2 (Step S28). The substrate W is transferred from the transfer robot CR to the transfer robot IR and housed in a carrier C by the transfer robot IR.

<Conditions of Peeling of Processing Film in Second Preferred Embodiment>

Figure 30A:
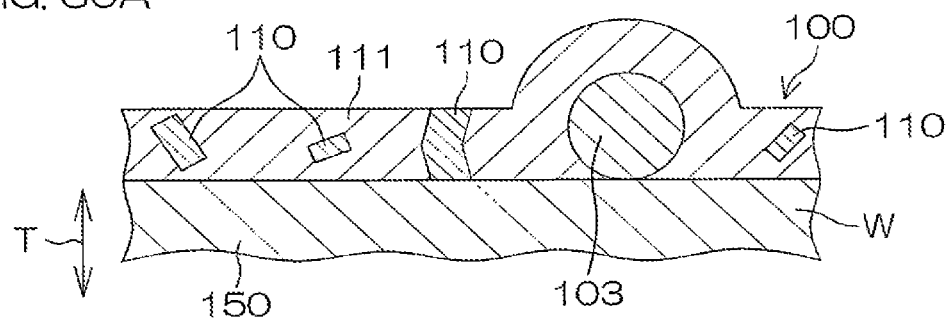
FIG. 30A is a schematic view for describing conditions in which a processing film is peeled from a surface of a substrate in the substrate processing according to the fourth preferred embodiment.
Figure 30B:
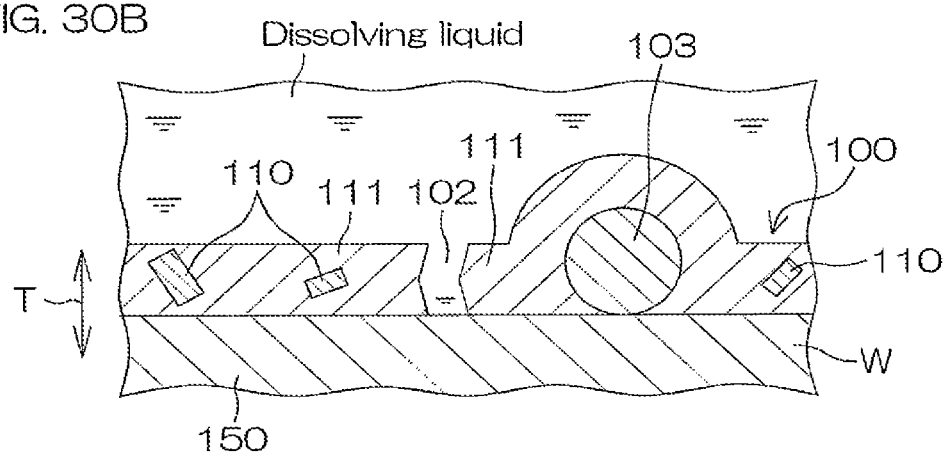
FIG. 30B is a schematic view for describing conditions in which the processing film is peeled from the surface of the substrate in the substrate processing according to the fourth preferred embodiment.
Figure 30C:
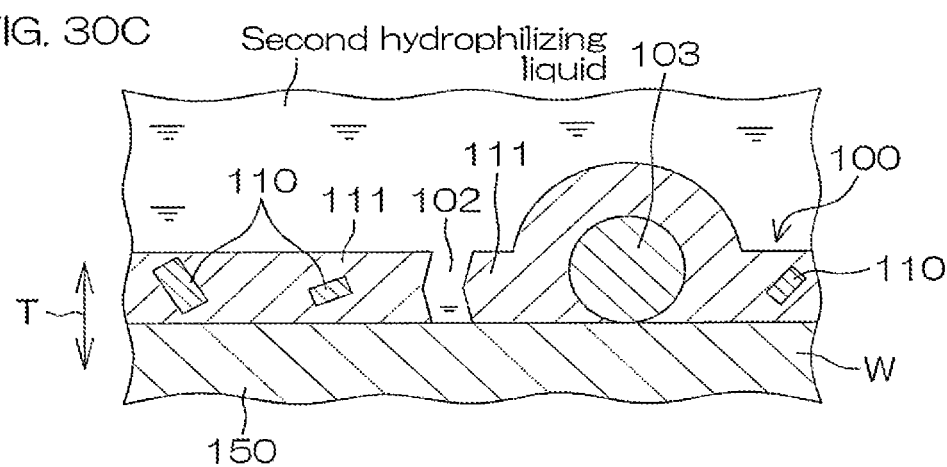
FIG. 30C is a schematic view for describing conditions in which the processing film is peeled from the surface of the substrate in the substrate processing according to the fourth preferred embodiment.

Next, conditions in which the processing film 100 is peeled from the substrate W will be described in detail with reference to FIG. 30A~FIG. 30C. FIG. 30A~FIG. 30C are each a schematic view for describing the conditions in which the processing film 100 is peeled from the substrate W.

As shown in FIG. 30A, the processing film 100 holds a removal object 103 which adhering to a surface layer 150 of the substrate W. The processing film 100 has a high solubility solid 110 (high solubility component in a solid state) and a low solubility solid 111 (low solubility component in a solid state). The high solubility solid 110 and the low solubility solid 111 are formed by evaporating at least a portion of a solvent contained in a processing liquid.

In the processing film 100, the high solubility solid 110 and the low solubility solid 111 are present in a mixed state. Strictly speaking, the processing film 100 is not in a state that the high solubility solids 110 and the low solubility solids 111 are uniformly distributed all over the processing film 100. The processing film 100 has a portion in which the high solubility solids 110 are unevenly distributed and a portion in which the low solubility solids 111 are unevenly distributed.

With reference to FIG. 30B, the high solubility solid 110 is dissolved by a second peeling liquid. That is, the processing film 100 is partially dissolved (dissolving step, partially dissolving step). The high solubility solid 110 is dissolved, by which a penetrating hole 102 is formed at a portion of the processing film 100 in which the high solubility solids 110 are unevenly distributed (penetrating hole forming step).

The penetrating hole 102 is particularly likely to be formed at a portion in which the high solubility solid 110 extends in a thickness direction T of the processing film 100. The penetrating hole 102 has a size of, for example, several nm in diameter in plan view.

Here, where a solvent remains appropriately in the processing film 100, the second peeling liquid dissolves partially the processing film 100, while being dissolved in the solvent remaining in the processing film 100. In detail, while being dissolved in the solvent remaining in the high solubility solid 110, the second peeling liquid dissolves the high solubility solid 110 in the processing film 100 to form the penetrating hole 102. Thus, the second peeling liquid easily enters the processing film 100 (dissolution entry step).

The second peeling liquid passes through the penetrating hole 102, reaches an upper surface of the substrate W and hydrophilizes the upper surface of the substrate W (hydrophilization step). The upper surface of the substrate W is hydrophilized, and a contact angle of pure water for the upper surface of the substrate W becomes smaller than 41.7° (contact angle reducing step). The second peeling liquid which has reached the upper surface of the substrate W acts on an interface between the processing film 100 and the substrate W, peels the processing film 100 and removes the peeled processing film 100 from the upper surface of the substrate W (peeling removal step).

In detail, the low solubility component is low in solubility in the second peeling liquid and the low solubility solid 111 is hardly dissolved by the second peeling liquid. Therefore, the low solubility solid 111 is slightly dissolved by the second peeling liquid only near the surface thereof. Accordingly, the second peeling liquid which has reached near the upper surface of the substrate W via the penetrating hole 102 slightly dissolves a portion of the low solubility solid 111 near the upper surface of the substrate W. Thereby, as shown in an enlarged view of FIG. 30B, the second peeling liquid enters a gap G1 between the processing film 100 and the upper surface of the substrate W, while gradually dissolving the low solubility solid 111 near the upper surface of the substrate W (peeling liquid entry step).

Then, for example, with a peripheral edge of the penetrating hole 102 as a starting point, the processing film 100 is split into film fragments 105, and as shown in FIG. 10C, the film fragments 105 of the processing film 100 are peeled from the substrate W in a state of holding the removal object 103 (processing film splitting step, processing film peeling step).

Then, by continuing the supply of the second peeling liquid, the processing film 100 that has become the film fragments 105 is washed away by the second peeling liquid in a state of holding the removal object 103. In other words, the film fragments 105 which hold the removal object 103 are pushed outside the substrate W and removed from the upper surface of the substrate W (processing film removal step, removal object removal step). Thereby, it is possible to satisfactorily clean the upper surface of the substrate W.

<Summary of Second Preferred Embodiment>

As described above, according to the second preferred embodiment, the processing liquid supplied to the upper surface of the substrate W is solidified or cured, thereby, forming the processing film 100 which holds the removal object 103. Thereafter, the second peeling liquid is supplied toward the upper surface of the substrate W. By the supply of the second peeling liquid, the penetrating hole 102 is formed in the processing film 100, the upper surface of the substrate W is hydrophilized, and the processing film 100 in a state of holding the removal object 103 is peeled from the upper surface of the substrate W. In other words, the formation of the penetrating hole 102, hydrophilization of the substrate W and peeling of the processing film 100 are realized by the supply of the second peeling liquid alone.

According to the second preferred embodiment, the second peeling liquid is a liquid mixture of an organic solvent and water. The processing film 100 is more easily dissolved by an organic solvent than by water or ammonia water. Therefore, the second peeling liquid which is a liquid mixture of an organic solvent and water is less likely to dissolve the processing film 100 than an organic solvent. Therefore, the processing film 100 is partially dissolved by the second peeling liquid. Thereby, the penetrating hole 102 (space) is formed in the processing film 100. The second peeling liquid passes through the penetrating hole 102 and reach the upper surface of the substrate W. The second peeling liquid which has reached the upper surface of the substrate W acts on an interface between the processing film 100 and the substrate W.

Therefore, in comparison to a method in which, with no space such as the penetrating hole 102 formed in the processing film 100, through infiltration of the peeling liquid into the processing film 100, the peeling liquid reaches an interface between the processing film 100 and the substrate W, a large amount of the second peeling liquid acts quickly to reach the interface between the processing film 100 and the substrate W.

The peeling liquid is a diluted organic solvent. The processing film 100 is more easily dissolved by an organic solvent than by water or ammonia water. Therefore, the diluted organic solvent is higher in solubility of the processing film 100 than water or ammonia water. Although the processing film 100 is partially dissolved by the second peeling liquid for formation of the penetrating hole 102, a remaining portion thereof is kept in a solid state. Therefore, a surface of a portion of the processing film 100 which is kept in a solid state (the low solubility solid 111) is appropriately dissolved by the second peeling liquid, and the processing film 100 in a state of holding the removal object 103 can be effectively peeled from the upper surface of the substrate W. Therefore, in comparison to a method in which the processing film 100 is peeled without using an organic solvent, the processing film 100 can be efficiently peeled.

According to the second preferred embodiment, the solubility of the high solubility component to the second peeling liquid is higher than that of the low solubility component to the second peeling liquid. Therefore, the high solubility solid 110 is more easily dissolved in the second peeling liquid than the low solubility solid 111. Therefore, the high solubility solid 110 is dissolved in the second peeling liquid to form the penetrating hole 102 in the processing film 100. On the other hand, the low solubility solid 111 is not dissolved by the peeling liquid but kept in a solid state.

Therefore, while the high solubility solid 110 is being dissolved in the second peeling liquid, the low solubility solid 111 is not dissolved in the peeling liquid but can be kept in a solid state. Thus, the second peeling liquid passes through the penetrating hole 102 formed by dissolution of the high solubility solid 110 and reaches an interface between the substrate W and the low solubility solid 111. Therefore, with the removal object 103 held by the low solubility solid 111, the second peeling liquid acts on the interface between the low solubility solid 111 and the substrate W. As a result, while the processing film 100 is quickly peeled from the substrate W, the removal object 103 can be effectively removed from the substrate W together with the processing film 100.

According to the second preferred embodiment, the second peeling liquid enters between the upper surface of the substrate W and the processing film 100 (low solubility solid 111). Therefore, the second peeling liquid acts on an interface between the processing film 100 and the substrate W and the processing film 100 can be more efficiently peeled from the upper surface of the substrate W.

In the case of the second peeling liquid which is diluted IPA, if a mass percent concentration of IPA in the second peeling liquid is not less than 12% and not more than 33%, the surface of the processing film 100 can be appropriately dissolved so that the processing film 100 in a state of holding the removal object 103 can be peeled from the upper surface of the substrate W.

According to the second preferred embodiment, in the residue removing liquid supplying step (Step S28), the residue removing liquid supplied to the upper surface and the lower surface of the substrate W is the organic solvent which is composed of the same substance (IPA) as the organic solvent in the second peeling liquid. That is, the organic solvent in the diluted organic solvent used as the second peeling liquid is the same organic compound as the organic solvent used as the residue removing liquid. Therefore, in comparison to a method in which the organic solvent in the second peeling liquid is a substance (organic compound) which is different from the organic solvent used as the residue removing liquid, types of the liquid to be used can be reduced. Therefore, it is possible to reduce costs required for removing the removal object 103 from the substrate W.

The higher the hydrophilicity of the upper surface of the substrate W, the more easily the peeling liquid acts on an interface between the substrate W and the processing film 100, and the processing film 100 can be effectively peeled from the upper surface of the substrate W. In the second preferred embodiment, a site of the upper surface of the substrate W which is exposed by formation of the penetrating hole 102 is hydrophilized by the second peeling liquid. Therefore, the second peeling liquid effectively acts on an interface between a portion of the processing film 100 which surrounds the penetrating hole 102 and the substrate W. In other words, the second peeling liquid acts quickly to enter between the processing film 100 and the substrate W.

Therefore, it is possible to effectively remove the processing film 100 in a state of holding the removal object 103 from the upper surface of the substrate W.

In the second preferred embodiment, since the second peeling liquid is a diluted organic solvent and the residue removing liquid is an organic solvent, the residue removing liquid is dissolved in the second peeling liquid. Therefore, in the substrate processing (refer to FIG. 18) of the second preferred embodiment, the rinsing step (Step S25) may be omitted.

<Modified Example of Substrate Processing Apparatus According to Second Preferred Embodiment>

Figure 21:
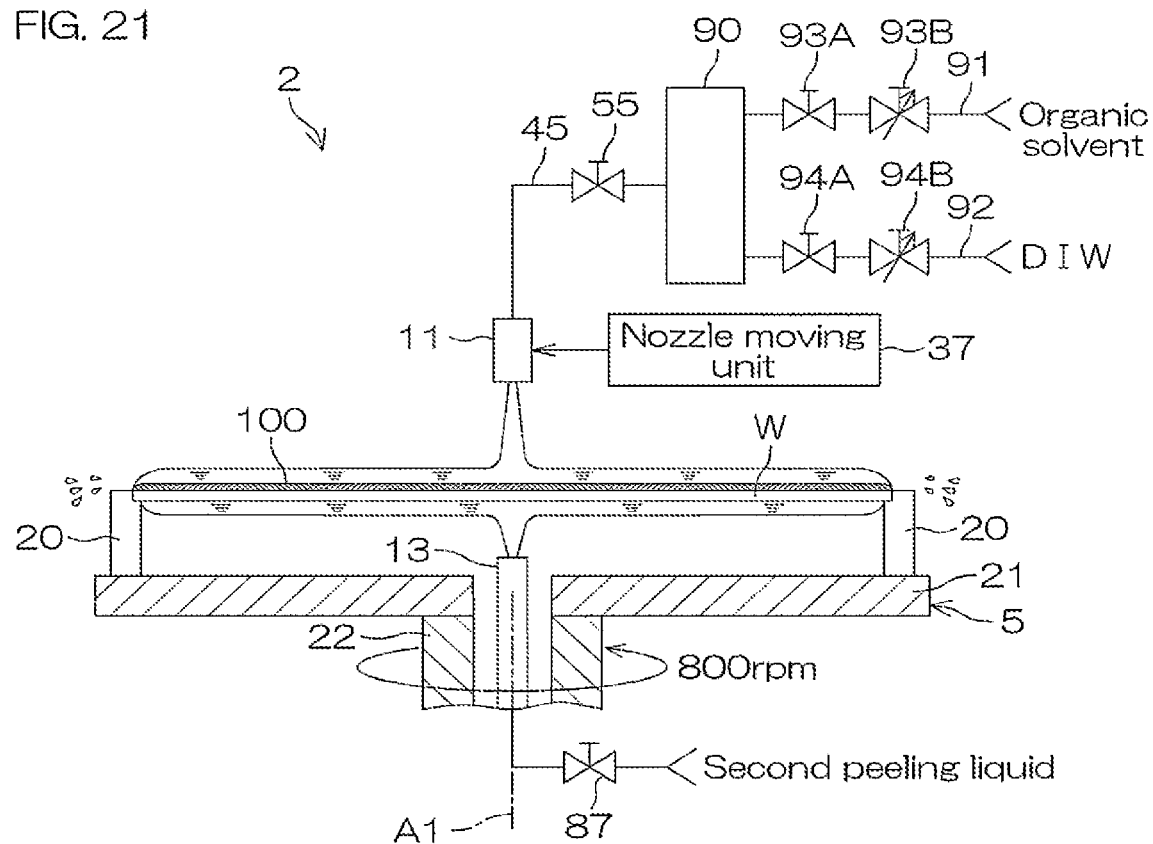
FIG. 21 is a schematic view for describing conditions of a peeling liquid supplying step (Step S24) in the substrate processing according to a modified example of the substrate processing apparatus of the second preferred embodiment.

FIG. 21 is a schematic view for describing conditions of the peeling liquid supplying step (Step S24) of substrate processing by a modified example of the substrate processing apparatus 1P according to the second preferred embodiment. In the substrate processing apparatus 1P of the modified example, a mixing valve 90 is connected to the upper peeling liquid piping 45 which supplies a second peeling liquid to the third moving nozzle 11.

An organic solvent piping 91 and a pure water piping 92 are connected to the mixing valve 90. An organic solvent valve 93A which is interposed in the organic solvent piping 91 is opened, by which an organic solvent such as IPA is supplied to the mixing valve 90. A pure water valve 94A which is interposed in the pure water piping 92 is opened, by which pure water such as DIW is supplied to the mixing valve 90. An opening degree of an organic solvent adjusting valve 93B interposed in the organic solvent piping 91 and an opening degree of a pure water adjusting valve 94B interposed in the pure water piping 92 are adjusted, thus making it possible to adjust a concentration of the organic solvent in the diluted organic solvent inside the mixing valve 90.

Therefore, in the peeling liquid supplying step (Step S24), during supplying the second peeling liquid to the upper surface of the substrate W, the concentration of the organic solvent in the second peeling liquid supplied to the upper surface of the substrate W can be adjusted by adjusting the opening degree of the organic solvent adjusting valve 93B and that of the pure water adjusting valve 94B (organic solvent concentration adjusting step). For example, by increasing the opening degree of the organic solvent adjusting valve 93B, the organic solvent in the second peeling liquid can be increased in concentration during the supply of the second peeling liquid to the upper surface of the substrate W.

The organic solvent is increased in concentration to make the second peeling liquid free of pure water, and thus making it possible to remove a residue of the processing film 100 from the upper surface of the substrate W. That is, the organic solvent discharged from the third moving nozzle 11 functions as a residue removing liquid. Thereby, it is possible to smoothly start the residue removing liquid supplying step after the peeling liquid supplying step.

In contrast, a decrease in the opening degree of the organic solvent adjusting valve 93B makes it possible to decrease the concentration of the organic solvent in the second peeling liquid during the supply of the second peeling liquid to the upper surface of the substrate W.

<Configuration of Substrate Processing Apparatus According to Third Preferred Embodiment>

Figure 22:
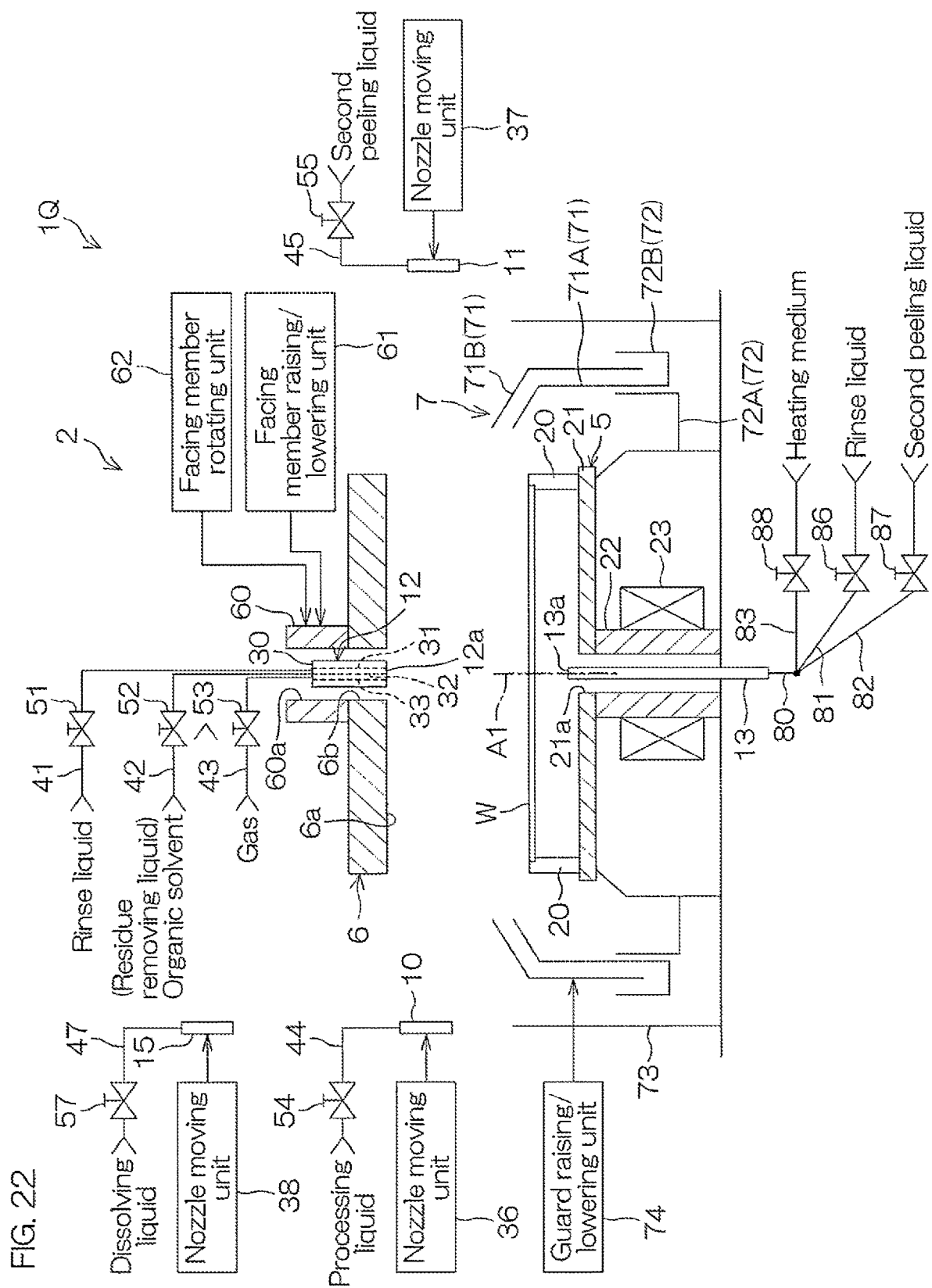
FIG. 22 is a schematic partial sectional view which shows a general configuration of a processing unit included in a substrate processing apparatus according to a third preferred embodiment of the present invention.

FIG. 22 is a schematic partial sectional view which shows a general configuration of a processing unit 2 provided in a substrate processing apparatus 1Q according to the third preferred embodiment of the present invention.

In FIG. 22, the same configuration as the configuration shown in FIG. 1~FIG. 21 which has been described previously will be given the same reference numeral as that of FIG. 1, etc., with a description thereof omitted. Also, in FIG. 23~FIG. 25D which will be described later, the same reference numeral as that indicated in FIG. 1, etc., will be given, with a description thereof omitted.

The substrate processing apparatus 1Q according to the third preferred embodiment is different from the substrate processing apparatus 1P (refer to FIG. 16) according to the second preferred embodiment in that the processing unit 2 includes a fourth moving nozzle 14 which supplies (discharges) a dissolving liquid such as ammonia water toward an upper surface of the substrate W which is held by a spin chuck 5. The fourth moving nozzle 14 is an example of a dissolving liquid supplying unit.

When positioned at a center position, the fourth moving nozzle 14 faces a central region of the upper surface of the substrate W. When positioned at a home position, the fourth moving nozzle 14 does not face the upper surface of the substrate W but is positioned outside a processing space 7 in plan view. The fourth moving nozzle 14 moves close to the upper surface of the substrate W and retracts upward from the upper surface of the substrate W by moving in a vertical direction.

A fourth nozzle moving unit 38 has the same configuration as the first nozzle moving unit 35. That is, the fourth nozzle moving unit 38 may include an arm (not shown) which is coupled to the fourth moving nozzle 14 and extends horizontally, a turning shaft (not shown) which is coupled to the arm and extends along the vertical direction and a turning shaft driving unit (not shown) which raises, lowers and turns the turning shaft.

The fourth moving nozzle 14 is connected to a dissolving liquid piping 47 which guides a dissolving liquid to the fourth moving nozzle 14. When a dissolving liquid valve 57 interposed in the dissolving liquid piping 47 is opened, the dissolving liquid is continuously discharged downward from a discharge port of the fourth moving nozzle 14. When the fourth moving nozzle 14 is positioned at the central position and the dissolving liquid valve 57 is opened, the dissolving liquid is supplied to a central region of the upper surface of the substrate W.

As the dissolving liquid, there can be used a liquid capable of appropriately dissolving a processing film on the substrate W. The dissolving liquid is a liquid which contains a substance different from a peeling liquid.

In detail, a liquid which is more likely to dissolve a high solubility component contained in a processing liquid rather than a low solubility component contained in the processing liquid as the dissolving liquid is used. The dissolving liquid is, for example, ammonia water with 0.4% of a mass percent concentration.

The dissolving liquid may be, for example, an alkaline aqueous solution (alkaline liquid) other than ammonia water. As specific examples of alkaline aqueous solutions other than ammonia water, cited are an aqueous solution of TMAH (tetramethylammonium hydroxide), a choline aqueous solution and any combination of them. The dissolving liquid may be pure water (preferably DIW) or may be an aqueous solution (non-alkaline aqueous solution) which is neutral or acidic.

The dissolving liquid is preferably alkaline. The dissolving liquid is preferably 7~13 in pH. In detail, the dissolving liquid is preferably 8~13 in pH and more preferably 10~13 and even more preferably 11~12.5. The pH is preferably measured after degassing for avoiding influence due to dissolution of carbon dioxide in air.

A large portion of the solvent of the dissolving liquid is pure water. A percentage of pure water contained in the solvent of the dissolving liquid is 50~100 mass % (preferably 70~100 mass %, more preferably 90~100 mass %, even more preferably 95~100 mass % and yet even more preferably 99~100 mass %). "Mass %" is a percentage of a mass of a certain component with respect to a total mass of a liquid. The solute of the dissolving liquid is 0.1~10% in mass percent concentration (preferably, 0.2~8% and more preferably 0.3~6%).

As shown in FIG. 5, the dissolving liquid valve 57 and the fourth nozzle moving unit 38 are controlled by a controller 3.

<Substrate Processing According to Third Preferred Embodiment>

Figure 23:
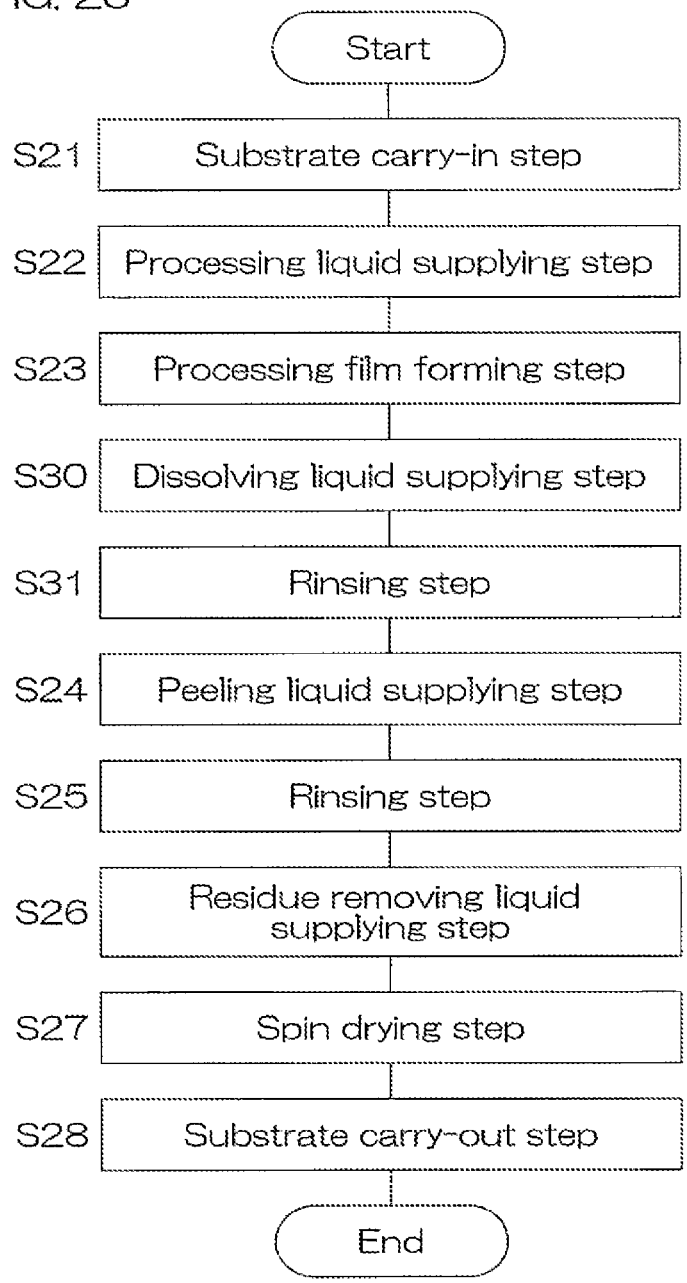
FIG. 23 is a flowchart for describing an example of substrate processing according to the third preferred embodiment.

FIG. 23 is a flowchart for describing an example of substrate processing by the substrate processing apparatus 1Q according to the third preferred embodiment. The substrate processing by the substrate processing apparatus 1Q is different from the substrate processing (refer to FIG. 18) by the substrate processing apparatus 1P according to the second preferred embodiment mainly in that, between the processing film forming step (Step S23) and the peeling liquid supplying step (Step S24), a dissolving liquid supplying step (Step S30) and a rinsing step (Step S31) are executed in this order. Hereinafter, a description will be given of the substrate processing by the substrate processing apparatus 1Q, with an emphasis placed on the dissolving liquid supplying step (Step S30) and the rinsing step (Step S31).

It is noted that an configuration of the substrate W which is to be processed by the substrate processing apparatus 1Q is the same as that of the substrate which is to be processed by the substrate processing apparatus 1. That is, there can be used the substrate W having a surface from which at least any one of Si, SiN, SiO$_2$, SiGe, Ge, SiCN, W, TiN, Co, Cu, Ru, and a-C is exposed.

Figure 24A:
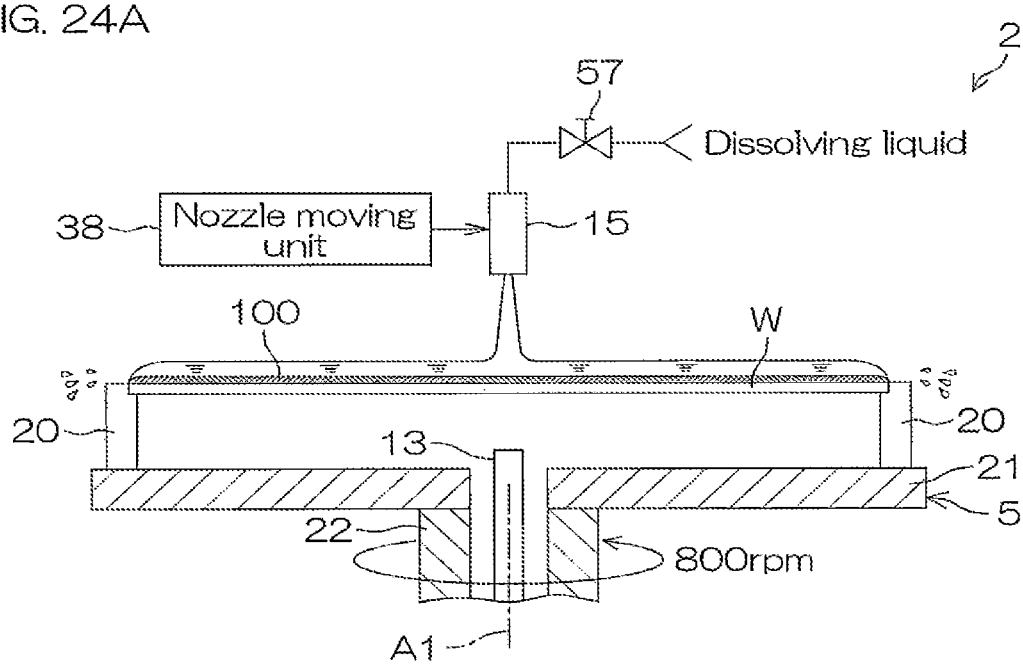
FIG. 24A is a schematic view for describing conditions of a dissolving liquid supplying step (Step S30) in the substrate processing according to the third preferred embodiment.
Figure 24B:
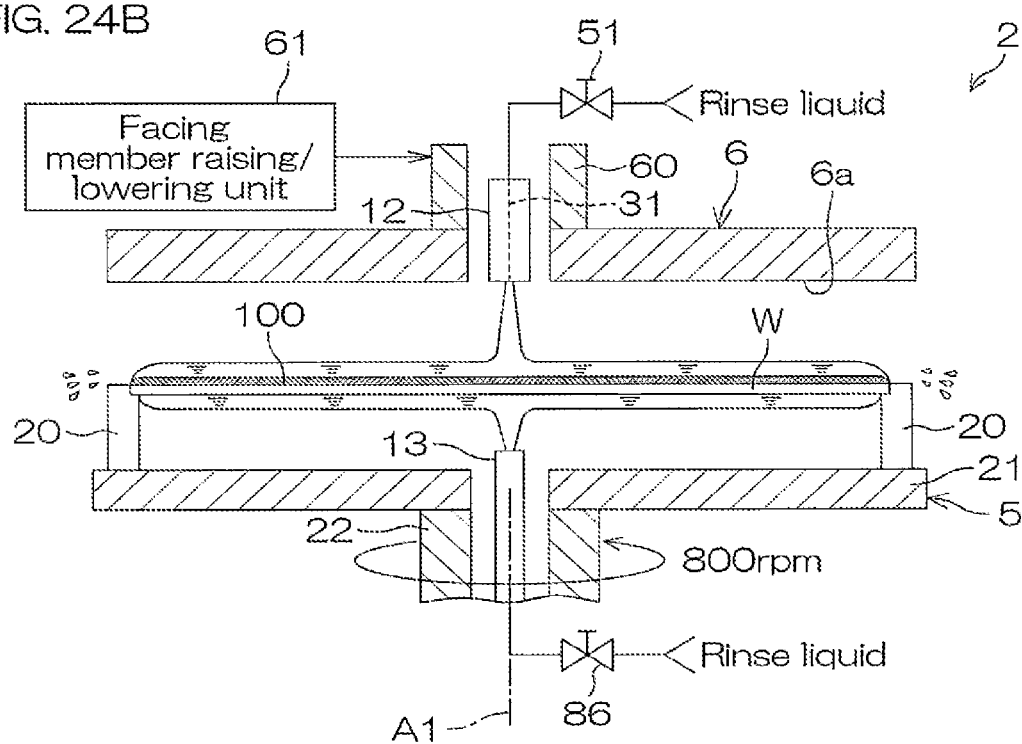
FIG. 24B is a schematic view for describing conditions of a rinsing step (Step S31) in the substrate processing according to the third preferred embodiment.

FIG. 24A is a schematic view for describing conditions of the dissolving liquid supplying step (Step S30). FIG. 24B is a schematic view for describing conditions of the rinsing step (Step S31). After the end of the processing film forming step (Step S23), the dissolving liquid supplying step (Step S30) is executed as follows.

First, a heating medium valve 88 is closed. Thereby, the supply of a heating medium to a lower surface of the substrate W is stopped. A gas valve 53 is also closed. Thereby, the supply of a gas to a space between a facing surface 6a of a facing member 6 and the upper surface of the substrate W is stopped.

Then, a facing member raising/lowering unit 61 moves a facing member 6 to a retract position. In a state that the facing member 6 is positioned at an upper position, the fourth nozzle moving unit 38 moves the fourth moving nozzle 14 to a processing position. The processing position of the fourth moving nozzle 14 is, for example, a central position.

Then, in a state that the fourth moving nozzle 14 is positioned at the processing position, a dissolving liquid valve 57 is opened. Thereby, as shown in FIG. 24A, a dissolving liquid is supplied (discharged) from the fourth moving nozzle 14 toward the central region of the upper surface of the substrate W in the rotating state (dissolving liquid supplying step, dissolving liquid discharging step). The dissolving liquid supplied to the upper surface of the substrate W spreads over the entire upper surface of the substrate W by a centrifugal force. Thereby, a processing film 100 on the upper surface of the substrate W is partially dissolved in the dissolving liquid and a component dissolved by the dissolving liquid is expelled outside the substrate W together with the dissolving liquid.

The supply of the dissolving liquid to the upper surface of the substrate W is continued for a predetermined time of, for example, 60 seconds. In the dissolving liquid supplying step, the substrate W is rotated in a predetermined dissolving rotational speed of, for example, 800 rpm.

After the dissolving liquid supplying step (Step S30), the rinsing step (Step S31) which will be described hereinafter is executed. In the rinsing step, the dissolving liquid is washed away from the substrate W by a rinse liquid. Since the dissolving liquid is expelled outside the substrate W by the rinse liquid, the rinsing step (Step S31) is also referred to as a dissolving liquid expelling step.

In the rinsing step (Step S31), first, the dissolving liquid valve 57 is closed. Thereby, the supply of the dissolving liquid to the upper surface of the substrate W is stopped. Then, the fourth nozzle moving unit 38 moves the fourth moving nozzle 14 to the home position. Then, as shown in FIG. 24B, the facing member raising/lowering unit 61 moves the facing member 6 to the processing position.

Then, in a state that the facing member 6 is positioned at the processing position, an upper rinse liquid valve 51 is opened. Thereby, as shown in FIG. 24B, the rinse liquid is supplied (discharged) from the central nozzle 12 toward the central region of the upper surface of the substrate W in the rotating state (upper rinse liquid supplying step, upper rinse liquid discharging step). The rinse liquid supplied to the upper surface of the substrate W spreads over the entire upper surface of the substrate W by a centrifugal force. Thereby, the dissolving liquid adhering to the upper surface of the substrate W is expelled outside the substrate W together with the rinse liquid and replaced with the rinse liquid (dissolving liquid expelling step).

Further, at the same time when the upper rinse liquid valve 51 is opened, the lower rinse liquid valve 86 is opened. Thereby, as shown in FIG. 24B, the rinse liquid is supplied (discharged) from the lower surface nozzle 13 toward the central region of the lower surface of the substrate W in the rotating state (lower rinse liquid supplying step, lower rinse liquid discharging step). Thereby, the dissolving liquid adhering to the upper surface of the substrate W may move from the upper surface of the substrate W to the lower surface of the substrate W via a peripheral edge portion of the substrate W. Thus, even where the dissolving liquid adheres to the lower surface of the substrate W, the dissolving liquid on the lower surface of the substrate W is washed away by the rinse liquid.

The supply of the rinse liquid to the upper surface and the lower surface of the substrate W is continued for a predetermined time of, for example, 30 seconds. In the rinsing step (Step S31), the substrate W is rotated at a predetermined dissolving liquid expelling rotational speed of, for example, 800 rpm.

As shown in FIG. 23, after the rinsing step (Step S31), the peeling liquid supplying step (refer to Step S24, and also FIG. 19D) is executed. After that, the rinsing step (Step S25)~the substrate carry-out step (Step S28) are executed sequentially.

<Conditions of Peeling Processing Film in Third Preferred Embodiment>

Next, conditions in which the processing film 100 is peeled from the substrate W in the substrate processing according to the third preferred embodiment will be described in detail with reference to FIG. 25A~FIG. 25D. FIG. 25A~FIG. 25D are each a schematic view for describing conditions in which the processing film 100 is peeled from the substrate W in the substrate processing according to the third preferred embodiment.

Figure 25A:
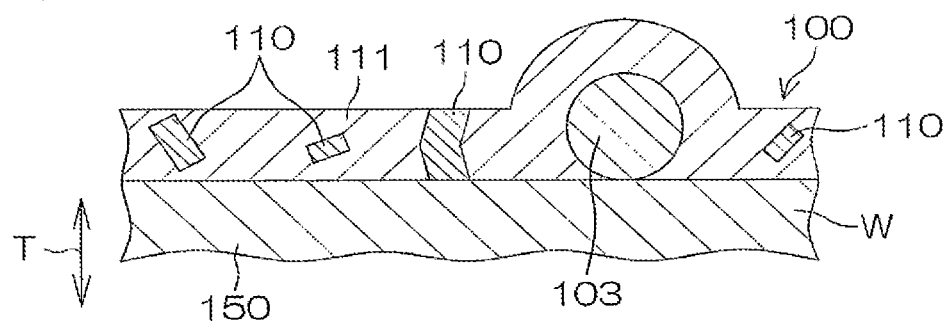
FIG. 25A is a schematic view for describing conditions in which a processing film is peeled from a surface of a substrate in the substrate processing according to the third preferred embodiment.

As shown in FIG. 25A, the processing film 100 has the same configuration as the substrate processing according to the second preferred embodiment. That is, as shown in FIG. 25A, the processing film 100 holds a removal object 103 adhering to a surface layer 150 of the substrate W and has a high solubility solid 110 and a low solubility solid 111.

Figure 25B:
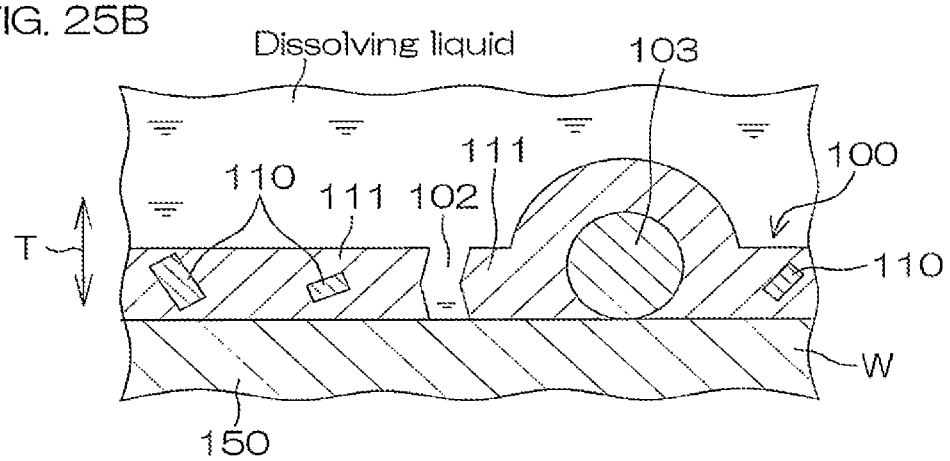
FIG. 25B is a schematic view for describing conditions in which the processing film is peeled from the surface of the substrate in the substrate processing according to the third preferred embodiment.

In the substrate processing according to the third preferred embodiment, with reference to FIG. 25B, a dissolving liquid is supplied toward an upper surface of the substrate W in a state of formation of the processing film 100 (dissolving liquid supplying step). The high solubility solid 110 is dissolved by the dissolving liquid supplied to the upper surface of the substrate W. That is, the processing film 100 is partially dissolved (dissolving step, partially dissolving step).

By dissolving the high solubility solid 110, the penetrating hole 102 is formed at a portion of the processing film 100 in which the high solubility solids 110 are unevenly distributed (penetrating hole forming step). Although the penetrating hole 102 is formed by the dissolving liquid, the processing film 100 is not yet thereby peeled.

Here, where the solvent remains appropriately in the processing film 100, the dissolving liquid partially dissolves the processing film 100, while being dissolved in the solvent remaining on the processing film 100. In detail, the dissolving liquid dissolves the high solubility solid 110 in the processing film 100 to form the penetrating hole 102, while being dissolved in the solvent remaining in the high solubility solid 110. Therefore, the dissolving liquid easily enters the processing film 100 (dissolving liquid entry step).

Figure 25C:
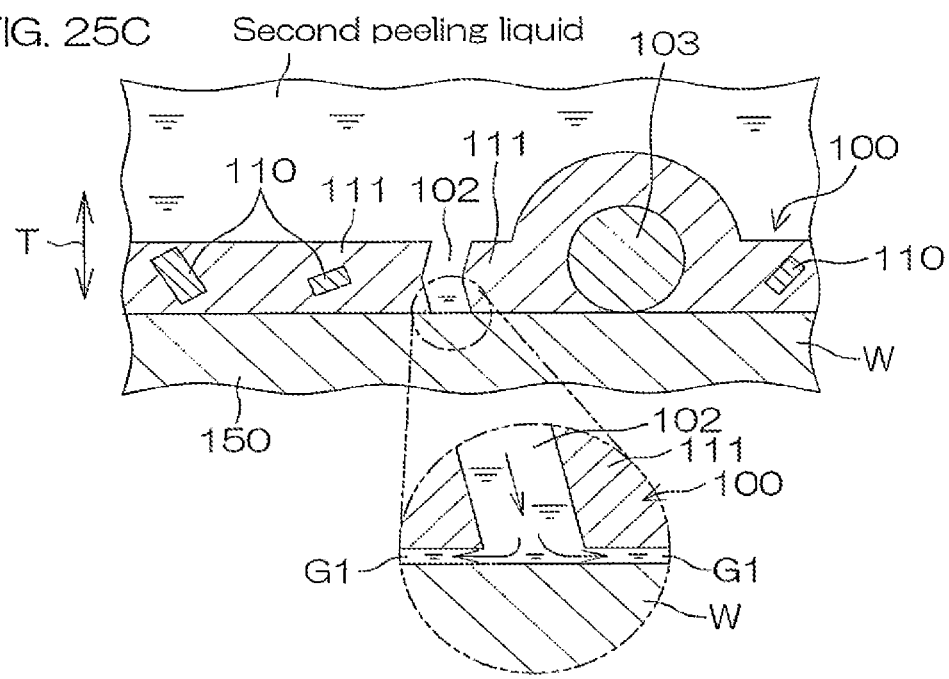
FIG. 25C is a schematic view for describing conditions in which the processing film is peeled from the surface of the substrate in the substrate processing according to the third preferred embodiment.

Then, after removal of the dissolving liquid by the rinse liquid, a second peeling liquid is supplied toward the upper surface of the substrate W (peeling liquid supplying step). As shown in FIG. 25C, the second peeling liquid passes through the penetrating hole 102 formed by the dissolving liquid and reaches the upper surface of the substrate W. Thereby, a portion of the upper surface of the substrate W which is exposed by formation of the penetrating hole 102 is hydrophilized (hydrophilization step). Due to hydrophilization of the upper surface of the substrate W, the contact angle of pure water for the upper surface of the substrate W becomes smaller than 41.7° (contact angle reducing step).

The second peeling liquid which has reached the upper surface of the substrate W acts on an interface between the processing film 100 and the substrate W to peel the processing film 100 and remove the peeled processing film 100 from the upper surface of the substrate W (peeling removal step).

In detail, the low solubility component is low in solubility in the second peeling liquid and the low solubility solid 111 is hardly dissolved by the second peeling liquid. Therefore, the low solubility solid 111 is slightly dissolved only near the surface thereof by the second peeling liquid. Accordingly, the second peeling liquid which has reached near the upper surface of the substrate W via the penetrating hole 102 slightly dissolves a portion of the low solubility solid 111 near the upper surface of the substrate W. Thereby, as shown in an enlarged view of FIG. 25C, the second peeling liquid enters a gap G1 between the processing film 100 and the upper surface of the substrate W, while gradually dissolving the low solubility solid 111 near the upper surface of the substrate W (peeling liquid entry step).

Figure 25D:
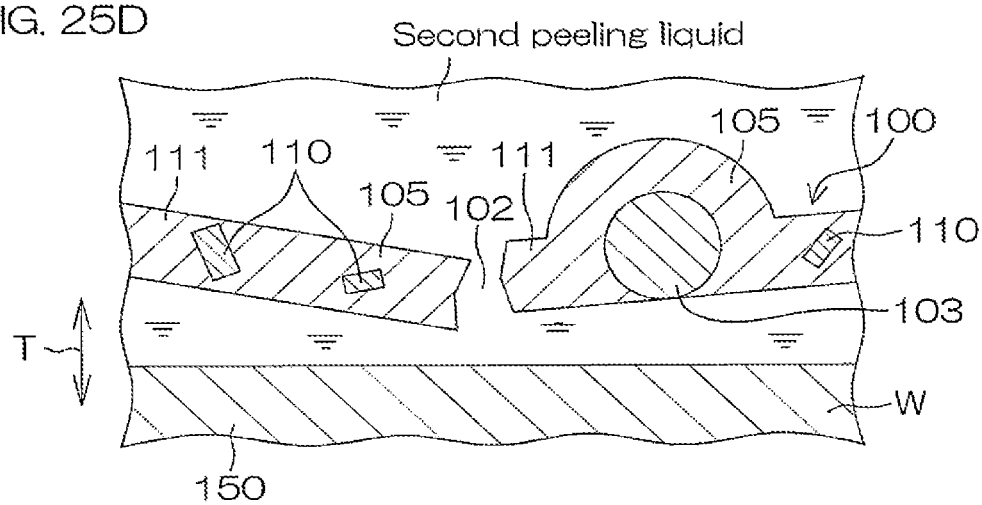
FIG. 25D is a schematic view for describing conditions in which the processing film is peeled from the surface of the substrate in the substrate processing according to the third preferred embodiment.

In the process of the peeling liquid entering the gap G1, with a peripheral edge of the penetrating hole 102 as a starting point, the processing film 100 is split into film fragments 105, and as shown in FIG. 25D, and the film fragments 105 of the processing film 100 are peeled from the substrate W in a state of holding a removal object 103 (processing film splitting step, processing film peeling step).

By continuing the supply of the second peeling liquid even after the start of peeling of the processing film 100, the processing film 100 which has become the film fragments 105 is washed away by the second peeling liquid in a state of holding the removal object 103. In other words, the film fragments 105 which hold the removal object 103 are pushed outside the substrate W and removed from the upper surface of the substrate W (processing film removal step, removal object removal step). Thereby, it is possible to satisfactorily clean the upper surface of the substrate W.

As described above, according to the third preferred embodiment, the dissolving liquid and the second peeling liquid are each supplied toward the upper surface of the substrate W in which the processing film 100 is formed. By the supply of the dissolving liquid, the penetrating hole 102 is formed in the processing film 100. Then, by the supply of the second peeling liquid, the upper surface of the substrate W is hydrophilized and the processing film 100 is peeled from the upper surface of the substrate W. In other words, the formation of the penetrating hole 102, hydrophilization of the substrate W and peeling of the processing film 100 are realized by the supply of a different liquid.

<Summary of Third Preferred Embodiment>

According to the third preferred embodiment, the same effects as those of the second preferred embodiment can be obtained. However, in the third preferred embodiment, unlike the second embodiment, after the formation of the processing film 100 and before the supply of the second peeling liquid to the substrate W, the dissolving liquid is supplied to the substrate W.

In the third preferred embodiment, if a liquid (for example, an alkaline liquid such as ammonia water) larger in difference of solubility between the high solubility solid 110 and the low solubility solid 111 than the second peeling liquid is used as the dissolving liquid, it is possible to peel the low solubility solid 111 from the substrate W by the second peeling liquid after formation of the penetrating hole 102 by more selectively dissolving the high solubility solid 110. In other words, it is possible to suppress the loss of the low solubility solid 111 by the dissolving liquid and suppress the detachment of a removal object from the low solubility solid 111. Therefore, it is possible to effectively peel the processing film 100 in a state of holding a removal object 103.

Further, the second peeling liquid can be selected, with no consideration given to the solubility of the high solubility solid 110 in the second peeling liquid and, therefore, the degree of freedom is enhanced in selecting the second peeling liquid.

<Configuration of Substrate Processing Apparatus According to Fourth Preferred Embodiment>

Figure 26:
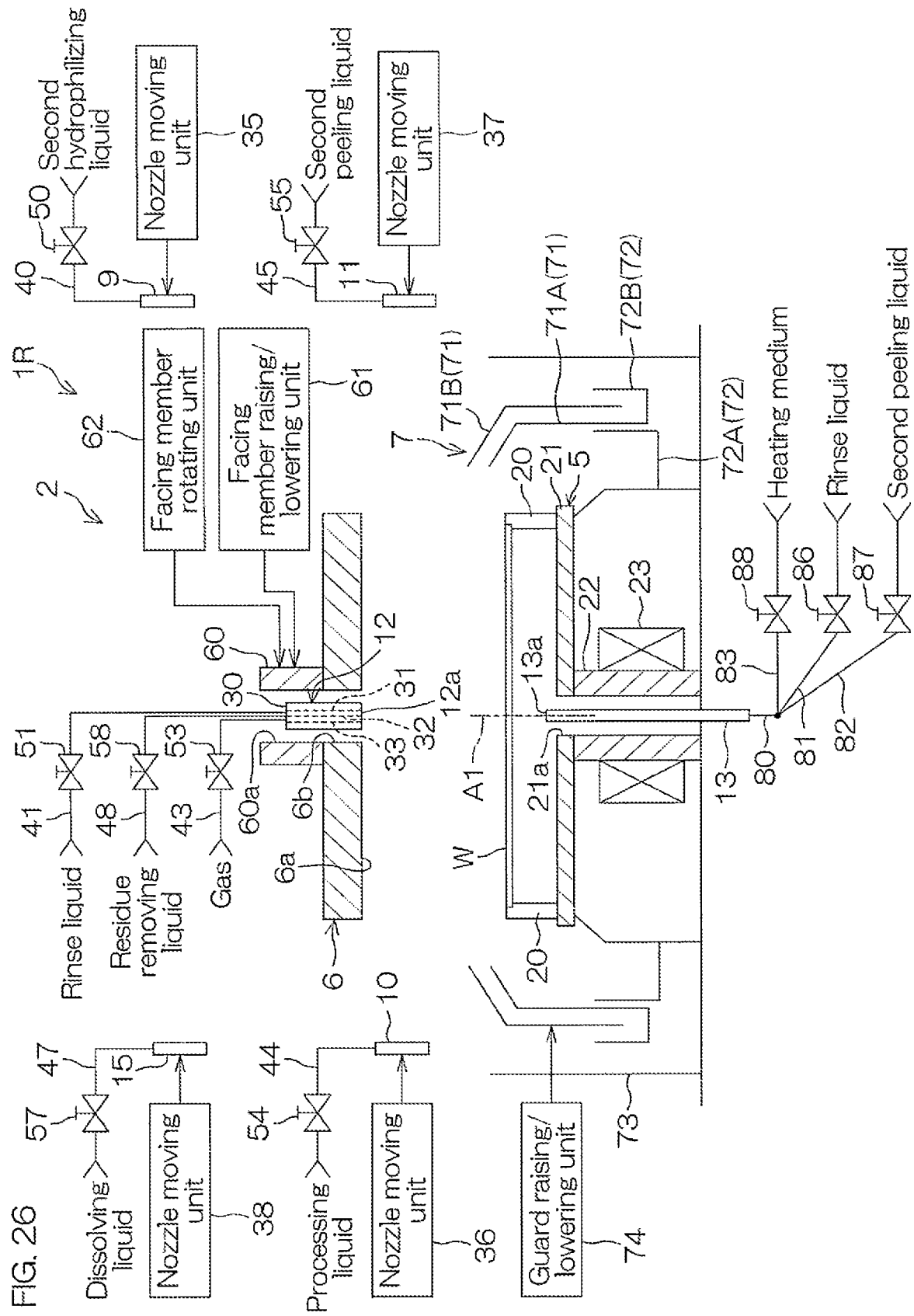
FIG. 26 is a schematic partial sectional view which shows a general configuration of a processing unit included in the substrate processing apparatus according to the fourth preferred embodiment of the present invention.

FIG. 26 is a schematic partial sectional view which shows a general configuration of a processing unit 2 provided in a substrate processing apparatus 1R according to the fourth preferred embodiment of the present invention.

In FIG. 26, the same configuration as that shown in FIG. 1~FIG. 25D which has been described previously will be given the same reference numeral as that of FIG. 1, etc., with a description thereof omitted. In FIG. 26~FIG. 32C which will be described later as well, the same reference numeral as that of FIG. 1, etc., will be given, with a description thereof omitted.

The substrate processing apparatus 1R according to the fourth preferred embodiment is different from the substrate processing apparatus 1Q according to the third preferred embodiment (refer to FIG. 22) mainly in that the processing unit 2 is provided with a first moving nozzle 9 and a hydrophilizing liquid discharged from the first moving nozzle 9 is a second hydrophilizing liquid such as SC1 (ammonia-hydrogen peroxide mixture).

The second hydrophilizing liquid is a liquid capable of appropriately hydrophilizing (enhancing the hydrophilicity of) a surface of a substrate W. The second hydrophilizing liquid is a liquid which contains a substance different from a dissolving liquid or a peeling liquid. The second hydrophilizing liquid is, for example, an oxidizing liquid such as SC1. The oxidizing liquid is a liquid which contains a substance (oxidizing agent) having an oxidation power. As the oxidizing liquid, in addition to SC1, there are cited hydrochloric hydrogen peroxide mixed water solution (HPM), hydrogen peroxide solution, and ozonized water. HPM is also referred to as SC2 (Standard Clean 2).

SC1, SC2 and a hydrogen peroxide solution contain hydrogen peroxide ($H_2O_2$) as an oxidizing agent. Ozonized water contains ozone ($O_3$) as an oxidizing agent.

As with the substrate processing shown in FIG. 31 which will be described later, in a case in which the second hydrophilizing liquid is supplied toward a substrate W in which no processing film is formed in an upper surface thereof, a liquid high in solubility in the processing film can be used as the second hydrophilizing liquid. Hydrofluoric acid (HF), diluted hydrofluoric acid (DHF), a sulfuric acid/hydrogen peroxide mixture (SPM) and an organic solvent, etc., are cited as the above-described liquid.

Hydrofluoric acid and diluted hydrofluoric acid contain hydrogen fluoride as an oxidizing agent. SPM contains persulfate as an oxidizing agent. As an organic solvent which can be used as the hydrophilizing liquid in the substrate W in which no processing film is formed on the upper surface, there are cited IPA, etc.

Figure 27:
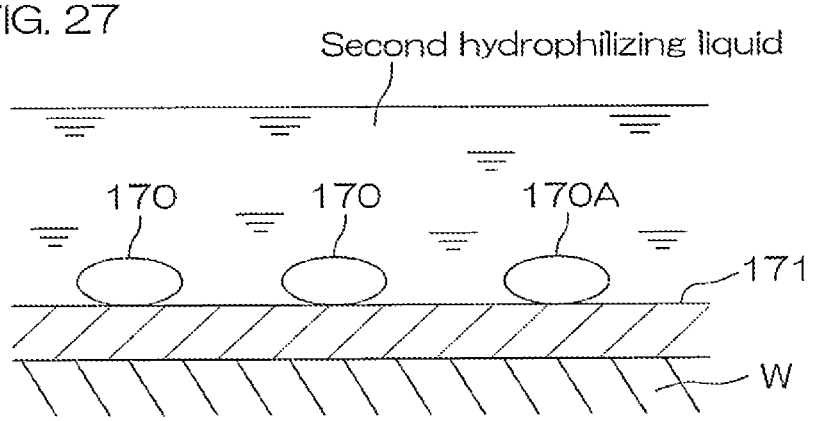
FIG. 27 is a schematic view for describing conditions in which the surface of the substrate is hydrophilized by a hydrophilizing liquid.

FIG. 27 is a schematic view for describing conditions in which the surface of the substrate W is hydrophilized by the second hydrophilizing liquid.

Where the oxidizing liquid such as SC1 is used as the second hydrophilizing liquid, as shown in FIG. 27, the surface of the substrate W is oxidized to form an oxide film 171 on the surface of the substrate W. By oxidizing the surface of the substrate W, oxygen atoms bond to a substance exposed from the surface of the substrate W. Oxygen atoms bond to the substance exposed from the surface of the substrate W and, thereby, the surface of the substrate W is improved in hydrophilicity.

Where the oxidizing liquid is used as the second hydrophilizing liquid, the substrate W can be hydrophilized, regardless of the presence of an organic substance 170.

The substrate W having a surface from which at least any one of Si, SiN, $SiO_2$, SiGe, Ge, SiCN, W, TiN, Co, Cu, Ru and a-C is exposed can be hydrophilized by the second hydrophilizing liquid. In particular, the substrate W having a surface from which at least any one of Si, SiN, $SiO_2$, W, TiN, Co, Cu, Ru and a-C is exposed is easily hydrophilized by the second hydrophilizing liquid, and the substrate W having a surface from which at least any one of Si, SiN, $SiO_2$, W, TiN, Co and Cu is exposed is more easily hydrophilized by the second hydrophilizing liquid.

<Substrate Processing According to Fourth Preferred Embodiment>

Figure 28:
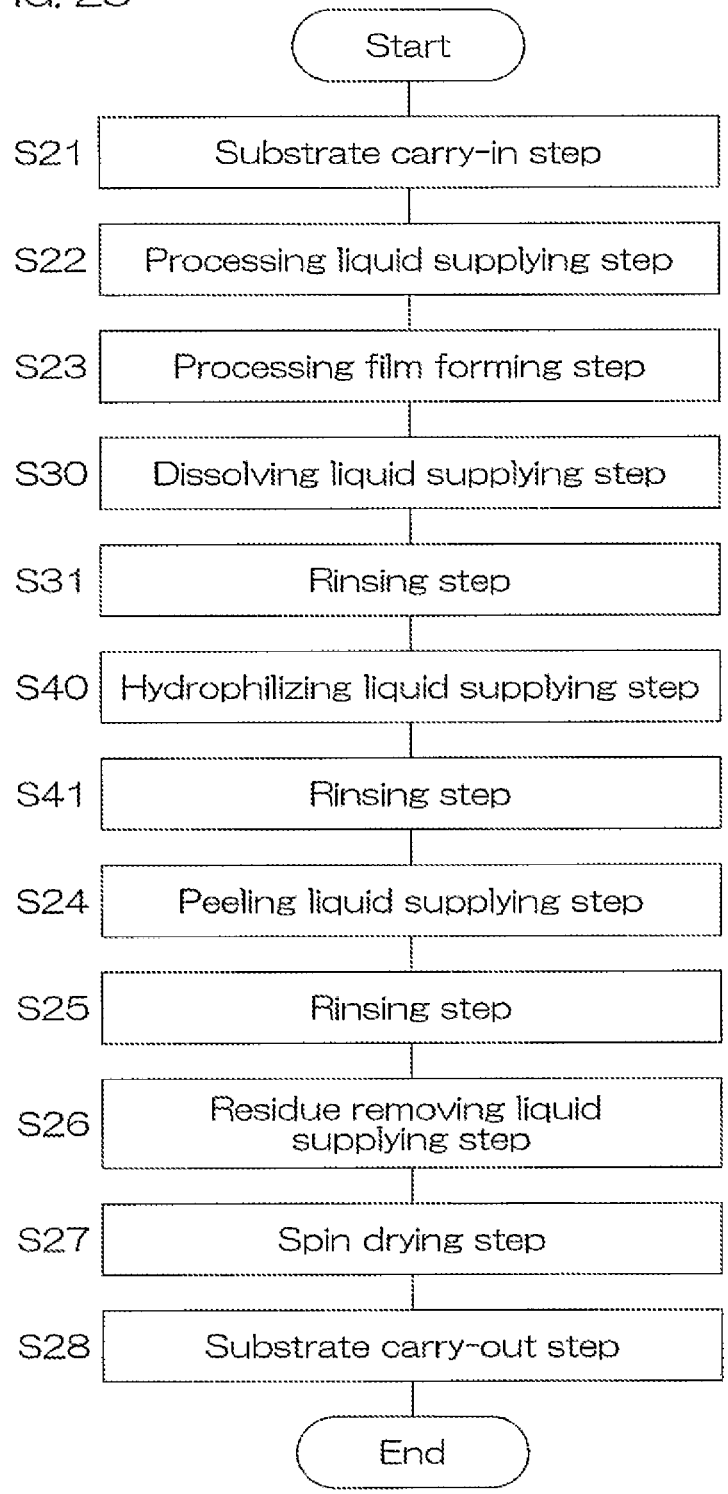
FIG. 28 is a flowchart for describing an example of substrate processing according to a fourth preferred embodiment.

FIG. 28 is a flowchart for describing an example of substrate processing by the substrate processing apparatus 1R according to the fourth preferred embodiment. The substrate processing by the substrate processing apparatus 1R is different from the substrate processing (refer to FIG. 23) by the substrate processing apparatus 1Q according to the third preferred embodiment mainly in that a hydrophilizing liquid supplying step (Step S40) and a rinsing step (Step S41) are executed in this order between the rinsing step (Step S31) and the peeling liquid supplying step (Step S24).

Hereinafter, the substrate processing by the substrate processing apparatus 1Q will be described, with an emphasis placed on the hydrophilizing liquid supplying step (Step S40) and the rinsing step (Step S41).

It is noted that the substrate W which is to be processed by the substrate processing apparatus 1R has the same configuration as the substrate which is to be processed by the substrate processing apparatus 1P. That is, there can be used the substrate W having a surface from which at least any one of Si, SiN, $SiO_2$, SiGe, Ge, SiCN, W, TiN, Co, Cu, Ru and a-C is exposed.

Figure 29A:
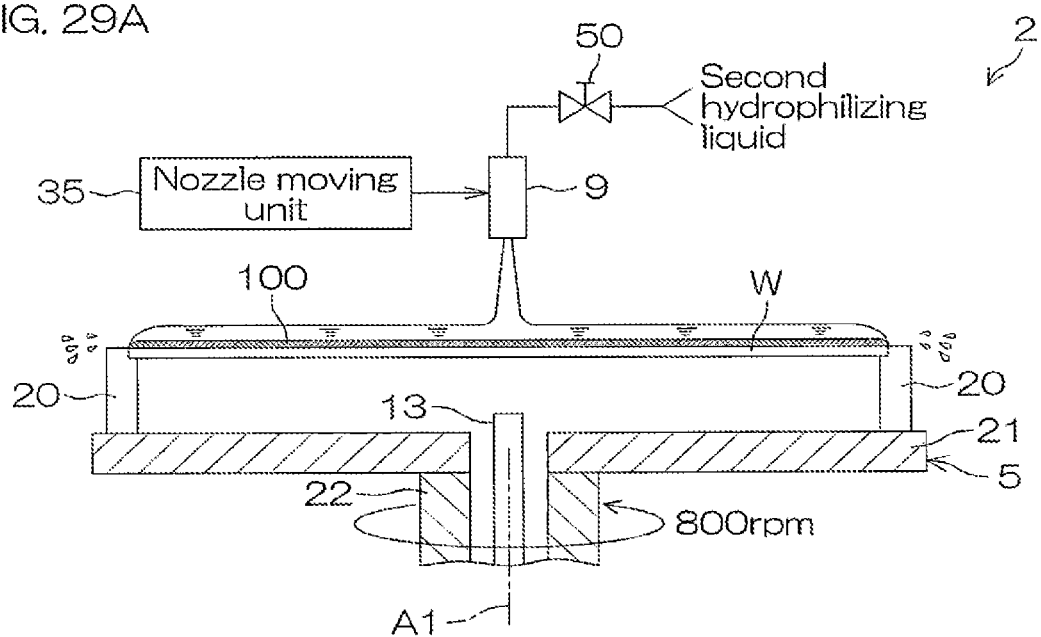
FIG. 29A is a schematic view for describing conditions of a hydrophilizing liquid supplying step (Step S40) in the substrate processing according to the fourth preferred embodiment.
Figure 29B:
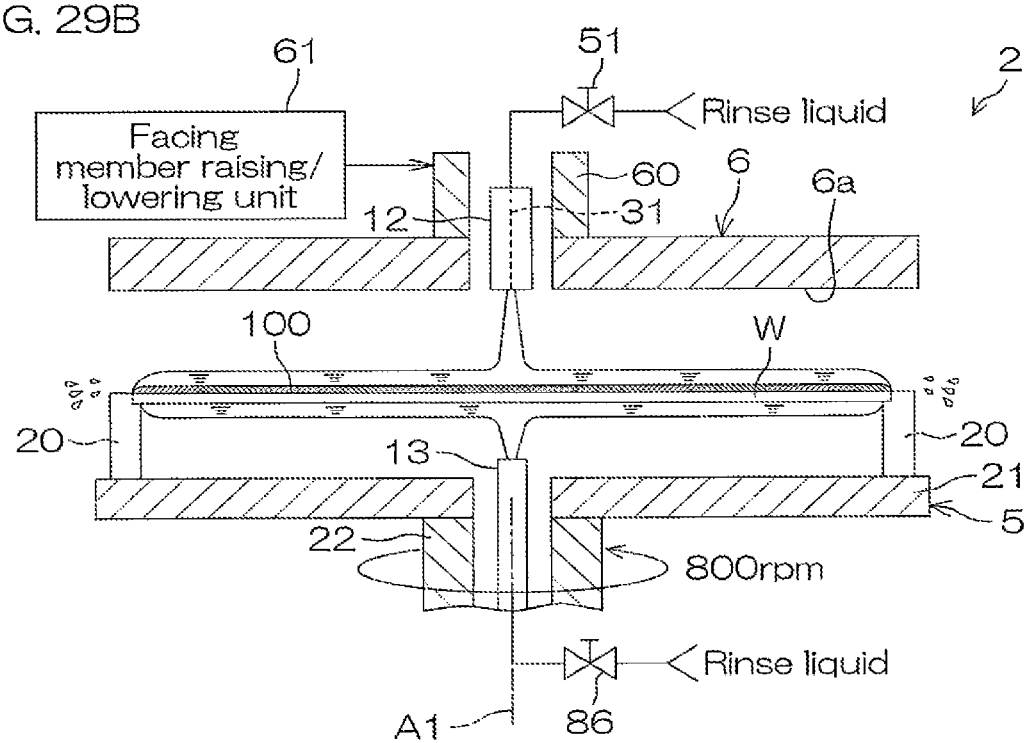
FIG. 29B is a schematic view for describing conditions of a rinsing step (Step S41) in the substrate processing according to the fourth preferred embodiment.

FIG. 29A is a schematic view for describing conditions of the hydrophilizing liquid supplying step (Step S40). FIG. 29B is a schematic view for describing conditions of the rinsing step (Step S41).

After the end of the rinsing step (Step S31), the hydrophilizing liquid supplying step (Step S40) is executed as will be described hereinafter.

First, an upper rinse liquid valve 51 and a lower rinse liquid valve 86 are closed. Thereby, the supply of a rinse liquid to the upper surface and the lower surface of the substrate W is stopped. A facing member raising/lowering unit 61 moves a facing member 6 to a retract position. In a state that the facing member 6 is positioned at the retract position, a first nozzle moving unit 35 moves a first moving nozzle 9 to a processing position. The processing position of the first moving nozzle 9 is, for example, a central position.

Then, in a state the first moving nozzle 9 is positioned at the processing position, a hydrophilizing liquid valve 50 is opened. Thereby, as shown in FIG. 29A, a second hydrophilizing liquid is supplied (discharged) from the first moving nozzle 9 toward a central region of the upper surface of the substrate W in the rotating state (hydrophilizing liquid supplying step, hydrophilizing liquid discharging step). The second hydrophilizing liquid supplied to the upper surface of the substrate W spreads over the entire upper surface of the substrate W by a centrifugal force. Thereby, the entire upper surface of the substrate W is hydrophilized by the second hydrophilizing liquid. The second hydrophilizing liquid is expelled outside the substrate W by a centrifugal force.

The supply of the second hydrophilizing liquid to the upper surface of the substrate W is continued for a predetermined time of, for example, 60 seconds. In the hydrophilizing liquid supplying step, the substrate W is rotated at a predetermined hydrophilization rotational speed of, for example, 800 rpm.

After the hydrophilizing liquid supplying step (Step S40), the rinsing step (Step S41) is executed as will be described hereinafter. In the rinsing step, the second hydrophilizing liquid is washed away from the substrate W by a rinse liquid. Since the second hydrophilizing liquid is expelled outside the substrate W by the rinse liquid, the rinsing step (Step S41) is also referred to as a hydrophilizing liquid expelling step.

In the rinsing step (Step S41), first, the hydrophilizing liquid valve 50 is closed. Thereby, the supply of the second hydrophilizing liquid to the upper surface of the substrate W is stopped.

Then, the first nozzle moving unit 35 moves the first moving nozzle 9 to the home position. Then, as shown in FIG. 29B, the facing member raising/lowering unit 61 moves the facing member 6 to the processing position.

Then, in a state that the facing member 6 is positioned at the processing position, the upper rinse liquid valve 51 is opened. Thereby, as shown in FIG. 29B, the rinse liquid is supplied (discharged) from the central nozzle 12 toward the central region of the upper surface of the substrate W in the rotating state (upper rinse liquid supplying step, upper rinse liquid discharging step). The rinse liquid supplied to the upper surface of the substrate W spreads over the entire upper surface of the substrate W by a centrifugal force. Thereby, the second hydrophilizing liquid adhering to the upper surface of the substrate W is expelled outside the substrate W together with the rinse liquid and replaced with the rinse liquid (hydrophilizing liquid expelling step).

Further, at the same time when the upper rinse liquid valve 51 is opened, the lower rinse liquid valve 86 is opened. Thereby, as shown in FIG. 29B, the rinse liquid is supplied (discharged) from the lower surface nozzle 13 toward the central region of the lower surface of the substrate W in the rotating state (lower rinse liquid supplying step, lower rinse liquid discharging step). Thereby, the second hydrophilizing liquid adhering to the upper surface of the substrate W moves from the upper surface of the substrate W to the lower surface of the substrate W via a peripheral edge portion of the substrate W. Thus, even where the hydrophilizing liquid adheres to the lower surface of the substrate W, the second hydrophilizing liquid on the lower surface of the substrate W is washed away by the rinse liquid.

The supply of the rinse liquid to the upper surface and the lower surface of the substrate W is continued for a predetermined time of, for example, 30 seconds. In the rinsing step (Step S41), the substrate W is rotated at a predetermined hydrophilizing liquid expelling rotational speed of, for example, 800 rpm.

As shown in FIG. 28, after the rinsing step (Step S41), the peeling liquid supplying step (Step S24)~the substrate carry-out step (Step S28) are executed sequentially.

<Conditions of Peeling of Processing Film in Fourth Preferred Embodiment>

Next, conditions in which the processing film 100 is peeled from the substrate W in the substrate processing according to the fourth preferred embodiment will be described in detail with reference to FIG. 30A~FIG. 30E. FIG. 30A~FIG. 30E are each a schematic view for describing conditions in which the processing film 100 is peeled from the substrate W in the substrate processing according to the fourth preferred embodiment.

As shown in FIG. 30A, the processing film 100 has the same configuration as the substrate processing according to the second preferred embodiment. That is, as shown in FIG. 30A, the processing film 100 holds a removal object 103 adhering to the surface layer 150 of the substrate W and has a high solubility solid 110 and a low solubility solid 111.

In the substrate processing according to the fourth preferred embodiment, as with the substrate processing according to the third preferred embodiment, with reference to FIG. 30B, a dissolving liquid is supplied toward the upper surface of the substrate W in a state of forming the processing film 100 (dissolving liquid supplying step). The high solubility solid 110 is dissolved by the dissolving liquid supplied to the upper surface of the substrate W. That is, the processing film 100 is partially dissolved (dissolving step, partially dissolving step).

By dissolving the high solubility solid 110, a penetrating hole 102 is formed at a portion of the processing film 100 in which the high solubility solids 110 are unevenly distributed (penetrating hole forming step). Although the penetrating hole 102 is formed by the dissolving liquid, the processing film 100 is not yet thereby peeled.

Here, where the solvent remains appropriately in the processing film 100, the dissolving liquid partially dissolves the processing film 100 while being dissolving in the solvent remaining on the processing film 100. In detail, the dissolving liquid dissolves the high solubility solid 110 in the processing film 100 while being dissolved in the solvent remaining in the high solubility solid 110, thereby forming the penetrating hole 102. Therefore, the dissolving liquid easily enters the processing film 100 (dissolving liquid entry step).

Then, after removal of the dissolving liquid by the rinse liquid, the second hydrophilizing liquid is supplied toward the upper surface of the substrate W (hydrophilizing liquid supplying step). As shown in FIG. 30C, the second hydrophilizing liquid passes through the penetrating hole 102 formed by the dissolving liquid and reaches the upper surface of the substrate W. Thereby, a portion of the upper surface of the substrate W exposed by formation of the penetrating hole 102 is hydrophilized (hydrophilization step). Due to hydrophilization of the upper surface of the substrate W, a contact angle of pure water for the upper surface of the substrate W becomes smaller than 41.7° (contact angle reducing step). Although the surface of the substrate W is hydrophilized by the second hydrophilizing liquid, the processing film 100 is not peeled.

Figure 30D:
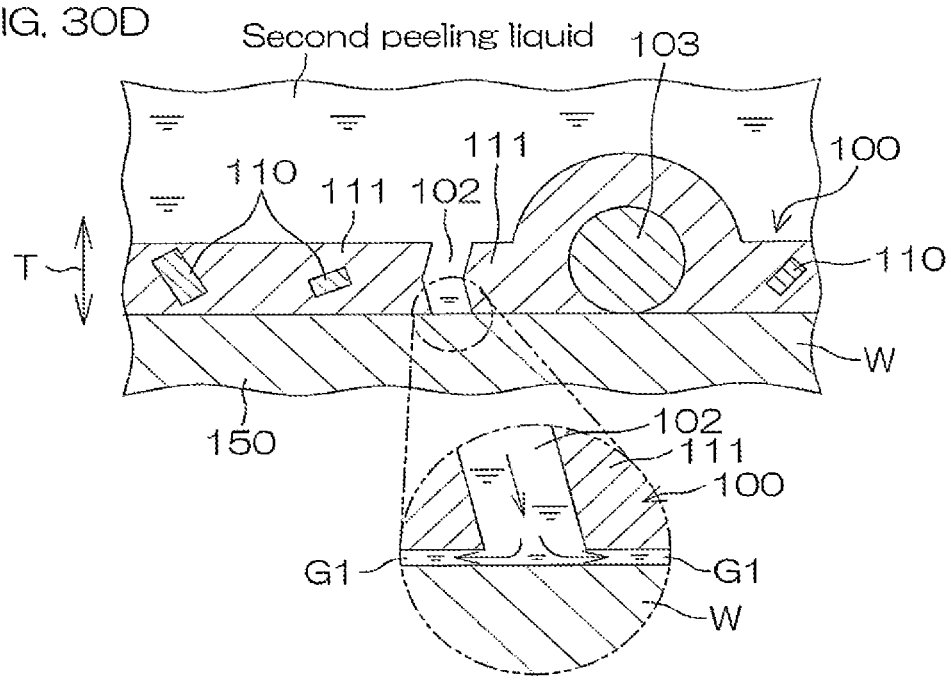
FIG. 30D is a schematic view for describing conditions in which the processing film is peeled from the surface of the substrate in the substrate processing according to the fourth preferred embodiment.

Then, after removal of the second hydrophilizing liquid by the rinse liquid, a second peeling liquid is supplied toward the upper surface of the substrate W (peeling liquid supplying step). As shown in FIG. 30D, the second peeling liquid passes through the penetrating hole 102 and reaches the upper surface of the substrate W. The second peeling liquid which has reached the upper surface of the substrate W acts on an interface between the processing film 100 and the substrate W, thereby peeling the processing film 100 and removing the peeled processing film 100 from the upper surface of the substrate W (peeling removal step).

A site of the upper surface of the substrate W which is exposed by formation of the penetrating hole 102 is hydrophilized by the second hydrophilizing liquid and, therefore, the second peeling liquid effectively acts on an interface between a portion of the processing film 100 which surrounds the penetrating hole 102 and the substrate W. In other words, as shown in an enlarged view of FIG. 30D, the second peeling liquid acts quickly to enter a gap G1 between the processing film 100 and the substrate W (peeling liquid entry step).

In detail, the low solubility component is low in solubility in the second peeling liquid and the low solubility solid 111 is hardly dissolved by the peeling liquid. Therefore, the low solubility solid 111 is slightly dissolved only near the surface thereof by the second peeling liquid. Therefore, the second peeling liquid which has reached near the upper surface of the substrate W via the penetrating hole 102 slightly dissolves a portion of the low solubility solid 111 near the upper surface of the substrate W. Thereby, as shown in an enlarged view of FIG. 30D, the second peeling liquid enters the gap G1 between the processing film 100 and the upper surface of the substrate W while gradually dissolving the low solubility solid 111 near the upper surface of the substrate W (peeling liquid entry step).

Figure 30E:
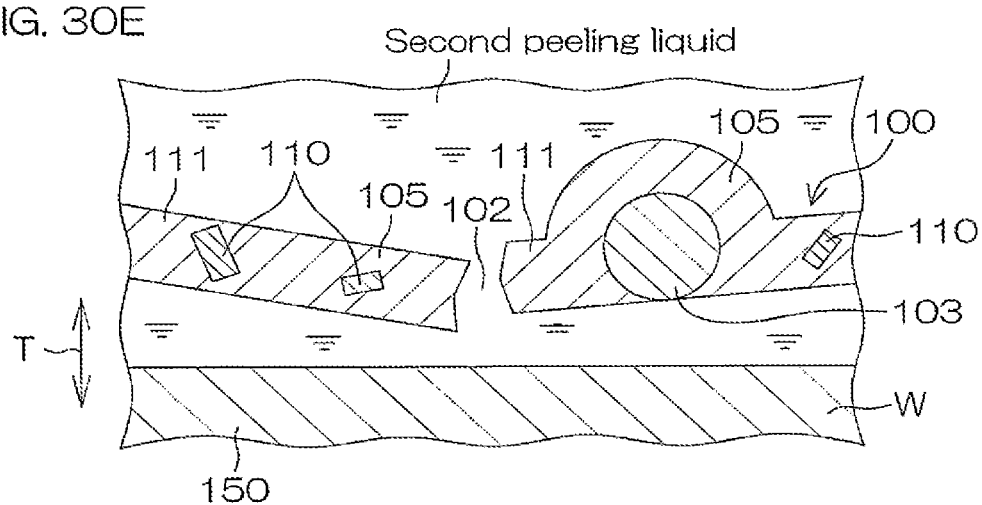
FIG. 30E is a schematic view for describing conditions in which the processing film is peeled from the surface of the substrate in the substrate processing according to the fourth preferred embodiment.

In the process of the second peeling liquid entering the gap G1, with a peripheral edge of the penetrating hole 102 as a starting point, the processing film 100 is split into film fragments 105. As shown in FIG. 30E, the film fragments 105 of the processing film 100 are peeled from the substrate W in a state of holding the removal object 103 (processing film splitting step, processing film peeling step).

By continuing the supply of the second peeling liquid, the processing film 100 which has become the film fragments 105 is washed away by the second peeling liquid in a state of holding the removal object 103. In other words, the film fragments 105 which hold the removal object 103 are pushed outside the substrate W and removed from the upper surface of the substrate W (processing film removal step, removal object removal step). Thereby, it is possible to satisfactorily clean the upper surface of the substrate W.

As described above, according to the fourth preferred embodiment, the dissolving liquid, the second hydrophilizing liquid and the second peeling liquid are each supplied toward the upper surface of the substrate W in which the processing film 100 is formed. By the supply of the dissolving liquid, the penetrating hole 102 is formed in the processing film 100. By the supply of the second hydrophilizing liquid, the upper surface of the substrate W is hydrophilized. Then, by the supply of the second peeling liquid, the processing film 100 is peeled from the upper surface of the substrate W. In other words, the formation of the penetrating hole 102, hydrophilization of the substrate W and peeling of the processing film 100 are realized by the supply of a different liquid.

<Summary of Fourth Preferred Embodiment>

According to the fourth preferred embodiment, the same effects as those of the third preferred embodiment can be obtained. However, in the fourth preferred embodiment unlike the third preferred embodiment, after the supply of the dissolving liquid to the substrate W and before the supply of the second peeling liquid to the substrate W, the second hydrophilizing liquid is supplied to the substrate W.

In the fourth preferred embodiment, the upper surface of the substrate W can be sufficiently hydrophilized by the second hydrophilizing liquid. Therefore, the second peeling liquid can be selected, with the hydrophilization capacity of the second peeling liquid not taken into account.

Specifically, if a mass percent concentration of IPA in the second peeling liquid is not less than 12%, it is possible to sufficiently enhance the hydrophilicity of the upper surface of the substrate W. If the mass percent concentration of IPA in the second peeling liquid is not less than 1% and not more than 33%, it is possible to peel the processing film 100 from the substrate W, while appropriately dissolving the processing film 100 on the substrate W. Therefore, even if the second peeling liquid with the mass percent concentration of IPA being not less than 1% and less than 12% is used, it is possible to sufficiently peel the processing film 100. Therefore, the use of the second hydrophilizing liquid makes it possible to select the second peeling liquid, with a degree of hydrophilization by the second peeling liquid (hydrophilizing power of the second peeling liquid) not taken into account. Therefore, the degree of freedom is enhanced in selecting the second peeling liquid.

Since there can be selected the second peeling liquid suitable for peeling the processing film 100, with the hydrophilizing power of the second peeling liquid not taken into account, it is possible to effectively peel the processing film 100 in a state of holding the removal object 103.

<Another Example of Substrate Processing in Fourth Preferred Embodiment>

Figure 31:
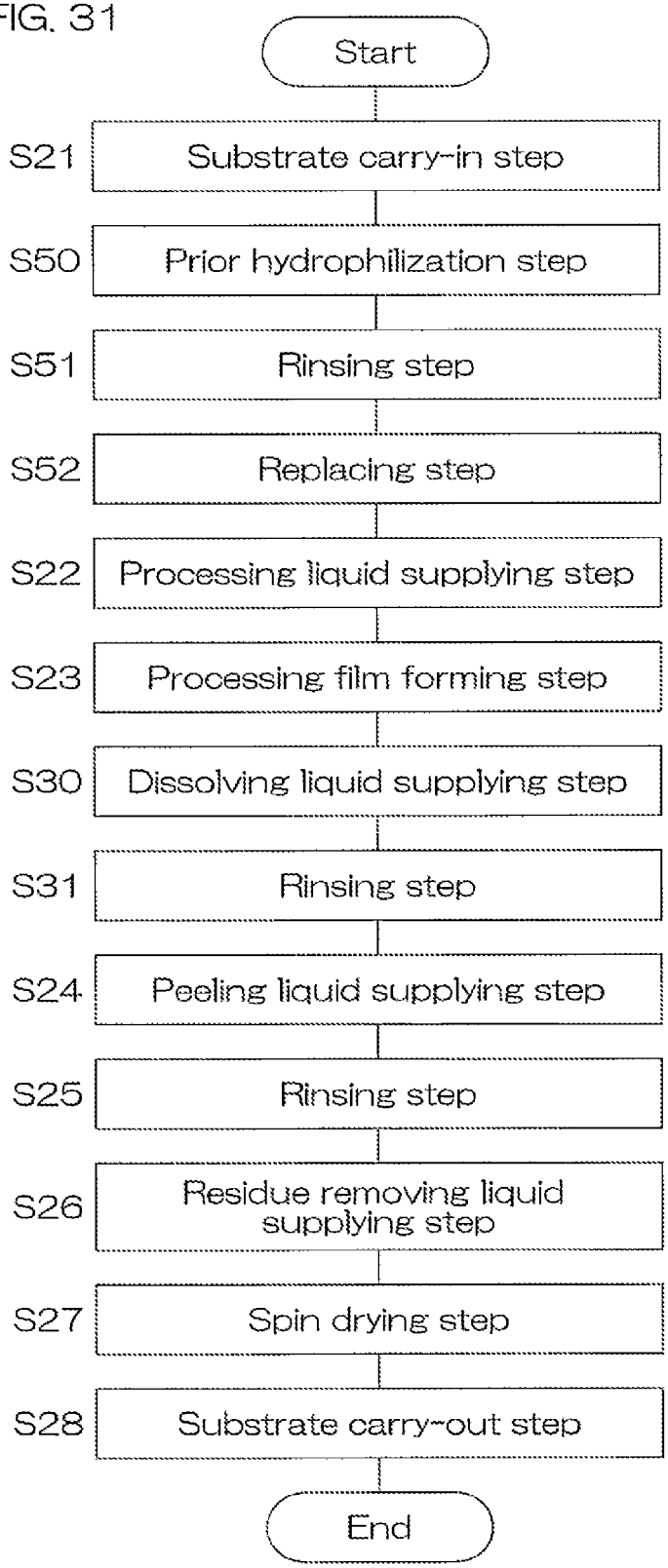
FIG. 31 is a flowchart for describing another example of the substrate processing according to the fourth preferred embodiment.

Use of the substrate processing apparatus 1R in the fourth preferred embodiment makes it also possible to execute the substrate processing shown in FIG. 31. The substrate processing shown in FIG. 31 is different from the substrate processing shown in FIG. 28 in that the hydrophilizing liquid supplying step (Step S40) and the rinsing step (Step S41) are not executed but a prior hydrophilization step (Step S50), a rinsing step (Step S51) and a replacing step (Step S52) are executed before the processing liquid supplying step (Step S22).

Figure 32A:
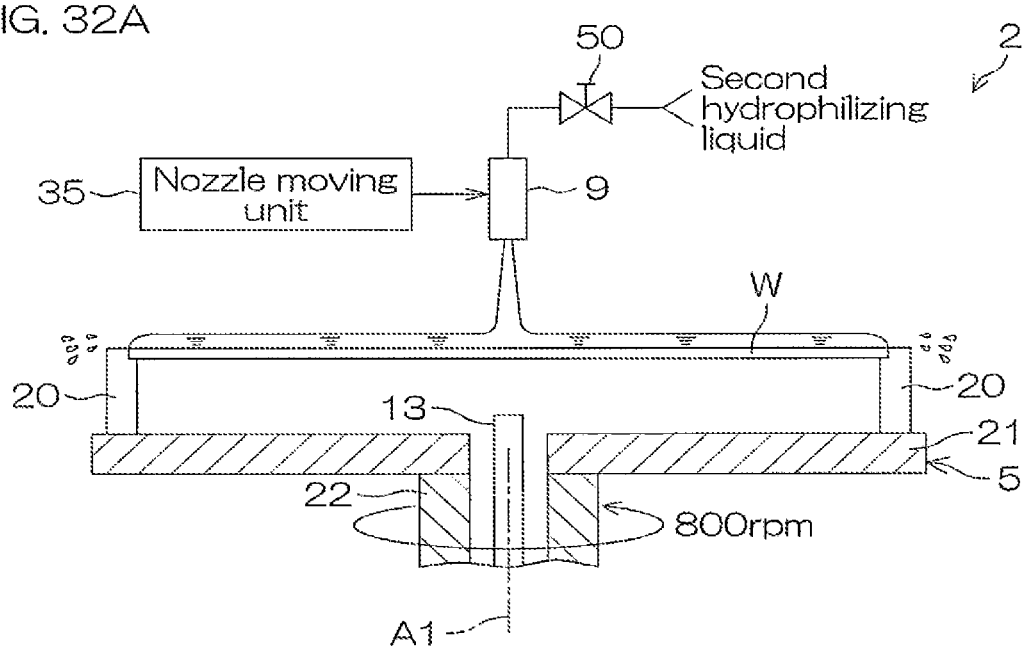
FIG. 32A is a schematic view for describing conditions of a prior hydrophilization step (Step S50) executed by another example of the substrate processing according to the fourth preferred embodiment.
Figure 32B:
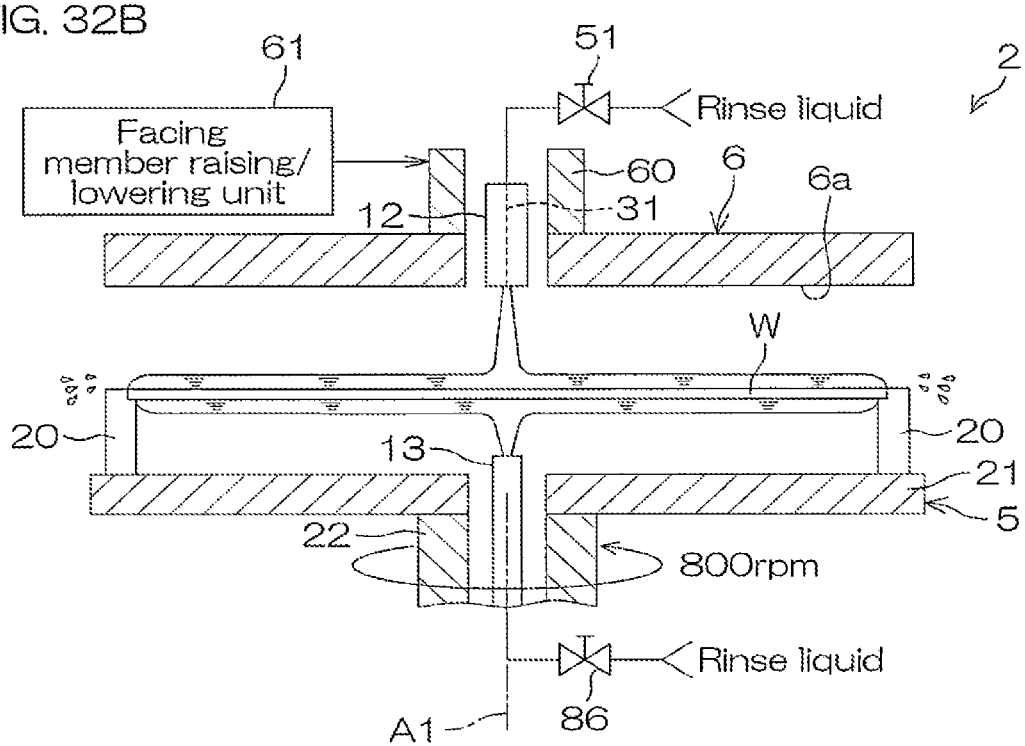
FIG. 32B is a schematic view for describing conditions of a rinsing step (Step S51) executed by another example of the substrate processing according to the fourth preferred embodiment.
Figure 32C:
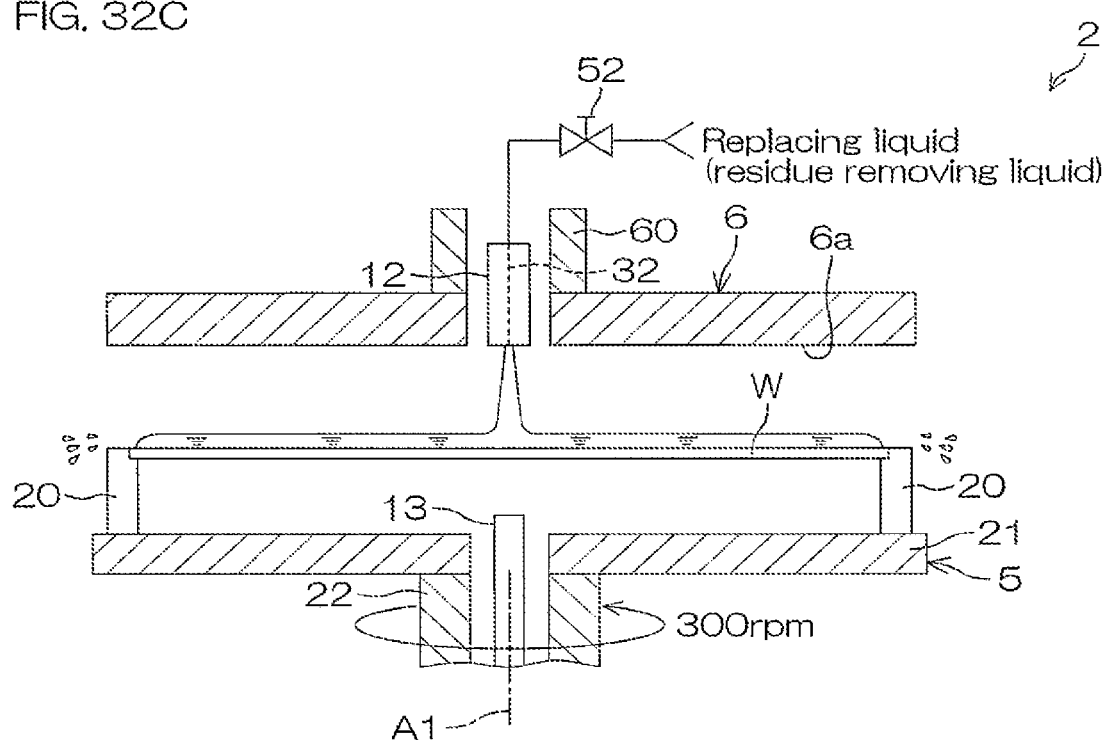
FIG. 32C is a schematic view for describing conditions of a replacing step (Step S52) executed by another example of the substrate processing according to the fourth preferred embodiment.

FIG. 32A~FIG. 32C are each a schematic view for describing conditions of the substrate processing shown in FIG. 31.

First, after the substrate carry-in step (Step S21), the prior hydrophilization step (Step S50) is executed. Specifically, as shown in FIG. 32A, a second hydrophilizing liquid is supplied (discharged) from the first moving nozzle 9 toward the upper surface of the substrate W, that is, toward a central region of the upper surface of the substrate W in the rotating state (prior hydrophilizing liquid supplying step, prior hydrophilizing liquid discharging step). The second hydrophilizing liquid supplied to the upper surface of the substrate W spreads over the entire upper surface of the substrate W by a centrifugal force. Thereby, the entire upper surface of the substrate W is hydrophilized by the second hydrophilizing liquid. The second hydrophilizing liquid is expelled outside the substrate W by a centrifugal force.

In the prior hydrophilization step (Step S50), the second hydrophilizing liquid is supplied toward the substrate W in which no processing film is formed on the upper surface thereof. Therefore, as described previously, it is possible to use, as the second hydrophilizing liquid, a liquid which is high in solubility in a processing film. Therefore, as the second hydrophilizing liquid, there can be used an oxidizing liquid such as SC1, SC2, hydrogen peroxide solution, ionized water, SPM, hydrofluoric acid, etc., and an organic solvent such as IPA, etc.

With reference to FIG. 32B, the rinsing step (Step S51) similar to the rinsing step (Step S41) is executed after the prior hydrophilization step (Step S50). In the rinsing step (Step S51), the hydrophilizing liquid is washed away from the substrate W by the rinse liquid. Since the hydrophilizing liquid is expelled outside the substrate W by the rinse liquid, the rinsing step (Step S51) is also referred to as a prior hydrophilizing liquid expelling step.

With reference to FIG. 32C, after the rinsing step (Step S51), the replacing step (Step S52) in which the rinse liquid on the substrate W is replaced with the replacing liquid such as an organic solvent is executed. In the replacing step, the rinse liquid on the substrate W is replaced with the residue removing liquid as a replacing liquid.

Specifically, an upper rinse liquid valve 51 and a lower rinse liquid valve 86 are closed. Thereby, the supply of the rinse liquid to the upper surface and the lower surface of the substrate W is stopped. A facing member 6 is kept at a processing position.

In a state that the facing member 6 is kept at the processing position, an organic solvent valve 52 is opened. Thereby, as shown in FIG. 32C, the replacing liquid (residue removing liquid) which is an organic solvent such as IPA is supplied (discharged) from a central nozzle 12 toward the central region of the upper surface of the substrate W in the rotating state (replacing liquid supplying step, replacing liquid discharging step). The central nozzle 12 is an example of a replacing liquid supplying unit.

The replacing liquid supplied from the central nozzle 12 to the upper surface of the substrate W spreads radially by receiving a centrifugal force and spreads over the entire upper surface of the substrate W. Thereby, the rinse liquid on the substrate W is replaced with the replacing liquid.

In the replacing step, the discharge of the replacing liquid from the central nozzle 12 is continued for a predetermined time of, for example, 10 seconds. In the replacing step, the substrate W is rotated at a predetermined replacing rotational speed of, for example, 300 rpm~1500 rpm. The substrate W is not required to be rotated at a fixed rotational speed in the replacing step. For example, a spin motor 23 may rotate the substrate W at 300 rpm at the start of supplying the replacing liquid and accelerate the rotation of the substrate W until the rotational speed of the substrate W reaches 1500 rpm while supplying the replacing liquid to the substrate W.

The replacing liquid such as IPA discharged from the second tube 32 is supplied to the upper surface of the substrate W covered with a liquid film of the rinse liquid, and the processing liquid is supplied to the upper surface of the substrate W covered with a liquid film of the replacing liquid. When the replacing liquid is supplied to the upper surface of the substrate W covered with the liquid film of the rinse liquid, a large portion of the rinse liquid on the substrate W is pushed away by the replacing liquid and expelled from the substrate W.

A remaining trace amount of the rinse liquid is dissolved in the replacing liquid and diffused in the replacing liquid. The diffused rinse liquid is expelled from the substrate W together with the replacing liquid. Therefore, it is possible to efficiently replace the rinse liquid on the substrate W with the replacing liquid. Due to the same reason, the replacing liquid on the substrate W can be efficiently replaced with the processing liquid. Thereby, it is possible to reduce an amount of the rinse liquid contained in the processing liquid on the substrate W.

Thereafter, as shown in FIG. 31, the processing liquid supplying step (Step S22)~the substrate carry-out step (Step S28) are executed sequentially.

In the substrate processing shown in FIG. 31, before the supply of the processing liquid to the upper surface of the substrate W, that is, the upper surface of the substrate W is hydrophilized in advance. Therefore, the processing film 100 is formed in the hydrophilized upper surface of the substrate W. The processing film 100 can be, therefore, peeled effectively from the substrate W by the second peeling liquid.

<Experiment of Measuring Contact Angle by Using Diluted IPA>

Hereinafter, a description will be given of the results of a contact angle measuring experiment in which a contact angle of diluted IPA for the surface of the substrate is measured.

In the experiment, an experimental substrate in which Ru was exposed from a surface thereof and an experimental substrate in which bare silicon was exposed from the surface were used. The experimental substrate in which Ru is exposed from the surface is a substrate in which a Ru film is formed by a CVD method. The experimental substrate used in the experiment is a small substrate in a square shape with the length of a side of 3 cm in plan view, as with the previously-described experiment.

The experimental substrate in which Ru is exposed from the surface is processed in advance with IPA and a contact angle of pure water for the experimental substrate is 60°. The experimental substrate in which Si is exposed from the surface is processed in advance with hydrofluoric acid with 0.5% of a mass percent concentration, and a contact angle of pure water for the experimental substrate is 62°.

In the experiment, diluted IPA which was formulated in five different concentrations of IPA was dropped onto an experimental substrate to measure a contact angle of diluted IPA at each different concentration of IPA for the surface of the experimental substrate. The contact angle of diluted IPA at each of the five different concentrations of IPA was measured in each of the experimental substrates.

Figure 33:
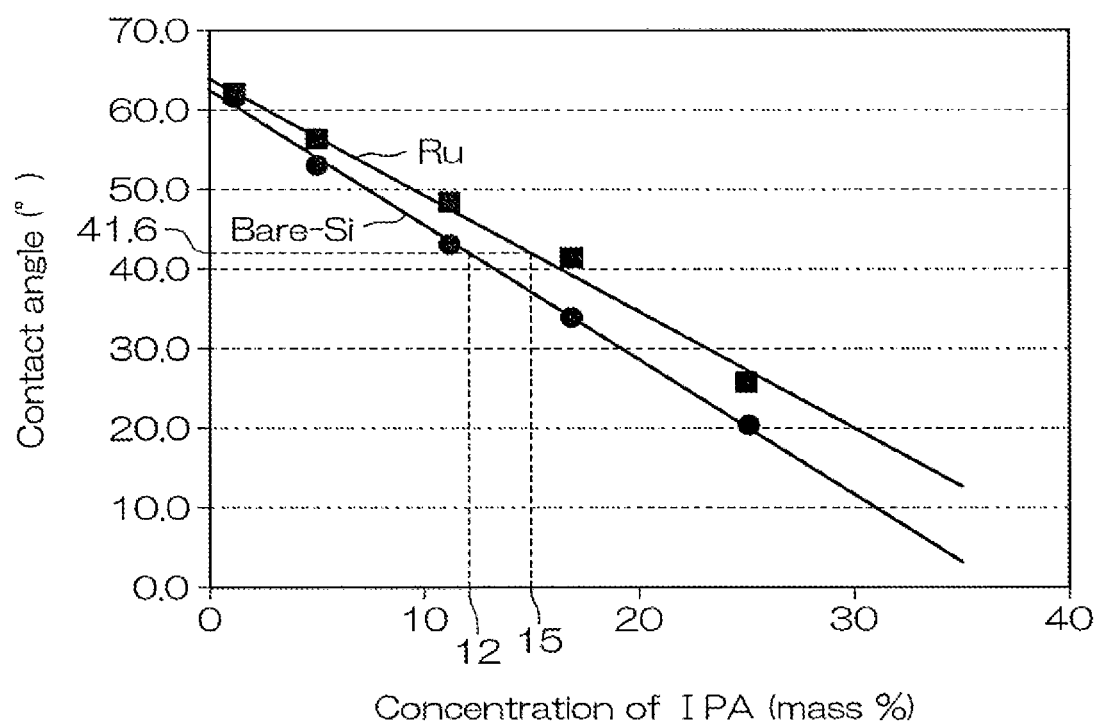
FIG. 33 is a graph which shows a relationship between a concentration of IPA in diluted IPA and a contact angle of the diluted IPA for a surface an experimental substrate.

FIG. 33 is a graph which shows a relationship between the concentrations of IPA in diluted IPA and the contact angle of diluted IPA for the surface of the experimental substrate. The horizontal axis of FIG. 33 indicates a concentration (mass percent concentration) of IPA in diluted IPA. The vertical axis of FIG. 33 indicates a contact angle of diluted IPA for the surface of the experimental substrate.

As shown in FIG. 33, even the experimental substrate in which any one of Ru and Si was exposed from the surface of the experimental substrate was decreased in contact angle according to an increase in concentration of IPA in diluted IPA. The experiment has yielded such effects that, in the experimental substrate in which Ru is exposed from the surface, the contact angle becomes less than 41.7° when the concentration of IPA is not less than about 12%. Such effects have been also yielded that, in the experimental substrate in which bare silicon is exposed from the surface, the contact angle becomes less than 41.7° when the concentration of IPA is not less than about 15%. Therefore, the experiment has suggested a possibility that, when the concentration of IPA is not less than about 12%, the surface of the substrate may be sufficiently hydrophilized.

<Experiment of Peeling Processing Film by Using Diluted IPA>

Hereinafter, a description will be given of the results of a processing film peeling experiment in which the processing film is peeled off by using diluted IPA.

In the experiment, a substrate in which Si was exposed from a surface thereof was used as an experimental substrate. The experimental substrate used in the experiment is also a small substrate in a square shape with the length of one side of 3 cm in plan view, as with the previously-described experiment. The experimental substrate is processed in advance with IPA, and the contact angle of pure water for the experimental substrate is 23°.

In the experiment, a processing liquid was dropped onto the surface of the experimental substrate to form a processing film, diluted IPA was dropped onto the surface of the experimental substrate on which the processing film was formed, and conditions of removing the processing film were microscopically observed.

Figure 34:
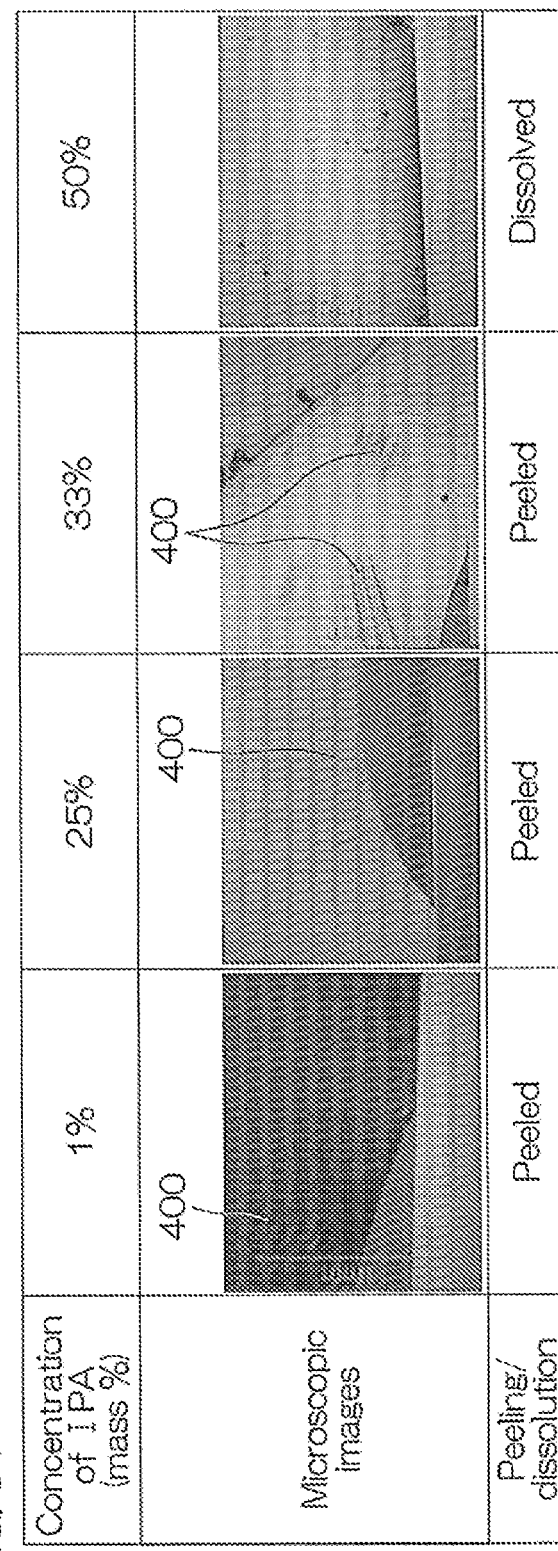
FIG. 34 are microscopic images for describing conditions of a surface of an experimental substrate when diluted IPA is dropped on the experimental substrate where a processing film is formed on the surface thereof.

FIG. 34 shows microscopic images for describing conditions of the surface of the experimental substrate when diluted IPA was dropped onto an experimental substrate in which a processing film was formed on a surface thereof. As shown in FIG. 34, when the mass percent concentrations of IPA in diluted IPA are 1%, 25% and 33%, the processing film is peeled off by diluted IPA. In detail, when the mass percent concentrations of IPA in diluted IPA are 1%, 25% and 33%, diluted IPA enters between the processing film and the experimental substrate to develop wrinkles 400 on the processing film. On the other hand, when the mass percent concentration of IPA in diluted IPA is 50%, the processing film is dissolved by diluted IPA. Therefore, the experiment has revealed that, when the concentration of IPA is not less than 1% and not more than 33%, the processing film can be peeled from the surface of the substrate.

The experiment has also revealed that, when the concentration of IPA is not less than 50%, the processing film is dissolved so as not to be peeled. It is thus presumed that the processing film is disposed to be easily dissolved in an organic solvent such as IPA rather than in water.

<Details of Processing Liquid>

Hereinafter, a description will be given of each component in the processing liquid used in the above-described preferred embodiments.

Hereinafter, expressions of "$C_{x\sim y}$," "$C_x\sim C_y$," and "$C_x$," etc., indicate the number of carbons in a molecule or a substituent. For example, $C_{1\sim 6}$ alkyl indicates an alkyl chain (methyl, ethyl, propyl, butyl, pentyl, hexyl, etc.) having not less than one and not more than six carbons.

When a polymer has plural types of repeating units, these repeating units are copolymerized. Unless specifically mentioned otherwise, the copolymerization may be any one of alternating copolymerization, random copolymerization, block copolymerization, graft copolymerization or a mixture of them. When a polymer and a resin are expressed by a structural formula, n, m, etc., which are written together in parentheses indicate the number of repetitions.

<Low Solubility Component>

The (A) low solubility component contains at least one of novolac, polyhydroxystyrene, polystyrene, a polyacrylic acid derivative, a polymaleic acid derivative, polycarbonate, a polyvinyl alcohol derivative, a polymethacrylic acid derivative and a copolymer of a combination of the above. The (A) low solubility component may preferably contain at least one of novolac, polyhydroxystyrene, a polyacrylic acid derivative, polycarbonate, a polymethacrylic acid derivative and a copolymer of a combination of the above. More preferably, the (A) low solubility component may contain at least one of novolac, polyhydroxystyrene, polycarbonate and a copolymer of a combination of the above. Novolac may be phenol novolac.

The processing liquid may contain one or a combination of two or more of the above-described preferable examples as the (A) low solubility component. For example, the (A) low solubility component may contain both novolac and polyhydroxystyrene.

The (A) low solubility component is formed into a film by being dried, and the film is peeled while still holding a removal object without being largely dissolved in the peeling liquid, which is one preferred mode. Permissible is a mode where a very small portion of the (A) low solubility component is dissolved by the peeling liquid.

Preferably, the (A) low solubility component does not contain fluorine and/or silicon and more preferably it contains neither element.

The copolymerization is preferably random copolymerization or block copolymerization.

Although not intended to restrict the scope of the claims in the present invention, the compounds expressed by the following Chemical Formulae 1~7 can be cited as specific examples of the (A) low solubility component.

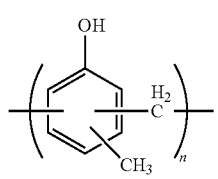

[Chemical Formula 1]

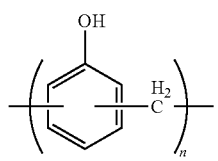

[Chemical Formula 2]

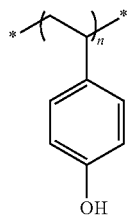

[Chemical Formula 3]

(Asterick* indicates bonding to an adjacent constituent unit.)

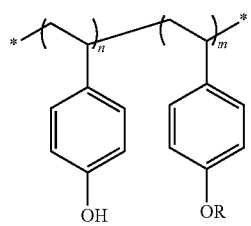

[Chemical Formula 4]

(R signifies a substituent such as a $C_{1\sim 4}$ alkyl, etc. Asterisk * indicates bonding to an adjacent constituent unit.)

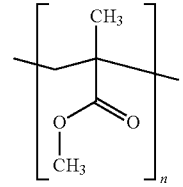

[Chemical Formula 5]

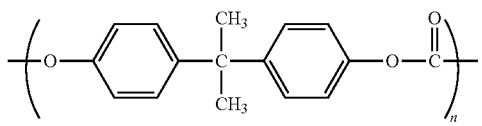

[Chemical Formula 6]

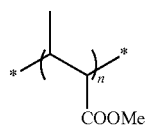

[Chemical Formula 7]

(Me signifies a methyl group. Asterick* indicates bonding to an adjacent constituent unit.)

A weight average molecular weight (Mw) of the (A) low solubility component is preferably 150~500,000, more preferably 300~300,000, even more preferably 500~100,000 and yet even more preferably 1,000~50,000.

The (A) low solubility component can be obtained by synthesis. It can also be purchased. In the case of purchase, the following can be cited as examples of suppliers. The (A) polymer can also be synthesized by a supplier.

Novolac: Showa Kasei Kogyo Co., Ltd., Asahi Yukizai Corporation, Gunei Chemical Industry Co., Ltd., Sumitomo Bakelite Co., Ltd.

Polyhydroxystyrene: Nippon Soda Co., Ltd., Maruzen Petrochemical Co., Ltd., Toho Chemical Industry Co., Ltd.

Polyacrylic acid derivative: Nippon Shokubai Co., Ltd.

Polycarbonate: Sigma-Aldrich

Polymethacrylic acid derivative: Sigma-Aldrich

In comparison to a total mass of the processing liquid, the (A) low solubility component is 0.1~50 mass %, preferably 0.5~30 mass %, more preferably 1~20 mass % and even more preferably 1~10 mass %. In other words, based on the total 0 mass of the processing liquid as 100 mass % which is a reference, the (A) low solubility component is 0.1~50 mass %. That is, "in comparison to" can be rephrased as "based on." The same applies hereinafter, unless specifically mentioned otherwise.

<High Solubility Component>

The (B) high solubility component is a (B') crack promoting component. The (B') crack promoting component contains hydrocarbon, further contains a hydroxy group (—OH) and/or a carbonyl group (—C(=O)—). Where the (B') crack promoting component is a polymer, one type of constituent unit contains hydrocarbon in each unit and further has a hydroxy group and/or a carbonyl group. As the carbonyl group, carboxylic acid (—COOH), aldehyde, ketone, ester, amide and enone, etc., can be cited, and carboxylic acid is preferable.

Although not intended to restrict the scope of the claims or not bound by theory, when the processing liquid is dried, the processing film is formed on the substrate and the peeling liquid peels the processing film, the (B) high solubility component may produce a portion that may give rise to peeling of the processing film. Therefore, the (B) high solubility component is preferably higher in solubility in the peeling liquid than the (A) low solubility component. As a mode where the (B') crack promoting component contains ketone as the carbonyl group, cyclic hydrocarbon can be cited. As specific examples, 1,2-cyclohexanedione and 1,3-cyclohexanedione can be cited.

As a more specific mode, the (B) high solubility component is expressed by at least one of (B-1), (B-2) and (B-3) given below.

(B-1) contains 1~6 of Chemical Formula 8 given below as a constituent unit (preferably 1~4) and each constituent unit is a compound which is bonded by a linking group (linker $L_1$). Here, the linker $L_1$ may be a single bond or $C_{1\sim6}$ alkylene. The above $C_{1\sim6}$ alkylene bonds a constituent unit as a linker and is not limited to a divalent group. It is preferably a divalent to tetravalent group. The $C_{1\sim6}$ alkylene may be straight-chained or branched.

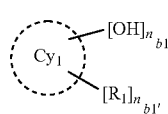

[Chemical Formula 8]

$Cy_1$ is a hydrocarbon ring with $C_{5\sim30}$, preferably phenyl, cyclohexane or naphthyl and more preferably phenyl. As a preferable mode, the linker $L_1$ bonds a plurality of $Cy_1$.

$R_1$ is independently $C_{1\sim5}$ alkyl and preferably, methyl, ethyl, propyl, or butyl.

The above $C_{1\sim5}$ alkyl may be straight-chained or branched.

$n_{b1}$ is 1, 2 or 3, preferably 1 or 2 and more preferably 1. $n_{b1'}$ is 0, 1, 2, 3 or 4 and preferably 0, 1 or 2.

Chemical Formula 9 given below is a chemical formula in which the constituent unit described in Chemical Formula 8 is expressed by using a linker $L_9$. The linker $L_9$ is preferably a single bond, methylene, ethylene or propylene.

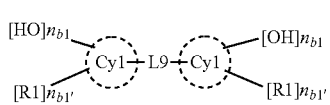

[Chemical Formula 9]

Although not intended to restrict the scope of the claims, 2,2-bis(4-hydroxyphenyl)propane, 2,2'-methylenebis(4-methylphenol), 2,6-bis[(2-hydroxy-5-methylphenyl)methyl]-4-methylphenol, 1,3-cyclohexanediol, 4,4'-dihydroxybiphenyl, 2,6-naphthalenediol, 2,5-di-tert-butylhydroquinone, 1,1,2,2-tetrakis (4-hydroxyphenyl)ethane can be cited as preferable examples of (B-1). These may be obtained by polymerization or condensation.

2,6-bis[(2-hydroxy-5-methylphenyl)methyl]-4-methylphenol shown in Chemical Formula 10 given below is taken as an example and will be described. This compound has three constituent units of Chemical Formula 8 in (B-1) and the constituent units are bonded by a linker $L_1$ (methylene). $n_{b1}=n_{b1}=1$ and R1 is methyl.

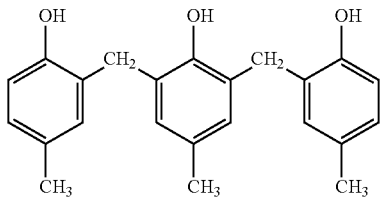

[Chemical Formula 10]

(B-2) is expressed by Chemical Formula 11 given below.

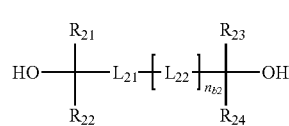

[Chemical Formula 11]

$R_{21}$, $R_{22}$, $R_{23}$ and $R_{24}$ are independently hydrogen or $C_{1\sim5}$ alkyl, preferably hydrogen, methyl, ethyl, t-butyl or isopropyl, more preferably, hydrogen, methyl or ethyl, and even more preferably, methyl or ethyl.

A linker $L_{21}$ and a linker $L_{22}$ are independently $C_{1\sim20}$ alkylene, $C_{1\sim20}$ cycloalkylene, $C_{2\sim4}$ alkenylene, $C_{2\sim4}$ alkinylene or $C_{6\sim20}$ arylene. These groups may be replaced with $C_{1\sim5}$ alkyl or hydroxyl. Here, alkenylene means a divalent hydrocarbon with one or more double bonds, and alkinylene means a divalent hydrocarbon group with one or more triple bond. The linker $L_{21}$ and the linker $L_{22}$ are preferably $C_{2\sim4}$ alkylene, acetylene ($C_2$ alkinylene) or phenylene, more preferably, $C_{2\sim4}$ alkylene or acetylene and even more preferably acetylene.

$n_{b2}$ is 0, 1 or 2, preferably 0 or 1 and more preferably 0.

Although not intended to restrict the scope of the claims, 3,6-dimethyl 4-octyne-3,6-diol, 2,5-dimethyl 3-hexyne-2,5-diol can be cited as preferable examples of (B-2). As another embodiment, 3-hexyne-2,5-diol, 1,4-butynediol, 2,4-hexadiyne-1,6-diol, 1,4-butanediol, cis-1,4-dihydroxy-2-butene, 1,4-benzenedimethanol can be cited as preferable examples of (B-2).

The (B-3) contains the constituent unit expressed by Chemical Formula 12 given below and a polymer with a weight average molecular weight (Mw) of 500~10,000. Mw is preferably 600~5,000 and more preferably 700~3,000.

[Chemical Formula 12]

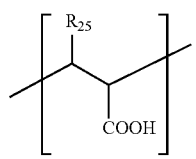

Here, $R_{25}$ is —H, —$CH_3$ or —COOH and preferably —H or —COOH. One (B-3) polymer may contain two or more constituent units, each of which is expressed by Chemical Formula 12.

Although not intended to restrict the scope of the claims, polymers of acrylic acid, maleic acid or combinations of them can be cited as preferable examples of the (B-3) polymer. Polyacrylic acids and maleic acid/acrylic acid copolymers are more preferable examples.

In the case of copolymerization, random copolymerization or block copolymerization is preferable, and random copolymerization is more preferable.

A description will be given, as an example, by citing a maleic acid/acrylic acid copolymer shown in Chemical Formula 13 below. The copolymer is contained in the (B-3) and has two types of constituent units expressed by Chemical Formula 12. In one constituent unit, $R_{25}$ is —H, and in another constituent unit, $R_{25}$ is —COOH.

[Chemical Formula 13]

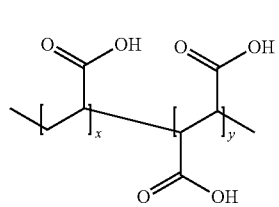

Obviously, the processing liquid may contain one or a combination of two or more of the above-described preferable examples as the (B) high solubility component. For example, the (B) high solubility component may contain both 2,2-bis(4-hydroxyphenyl) propane and 3,6-dimethyl-4-octyne-3,6-diol.

The (B) high solubility component may be 80~10,000 in molecular weight. The high solubility component is preferably 90~5000 in molecular weight and more preferably 100~3000. Where the (B) high solubility component is a resin, a polymeride or a polymer, the molecular weight is expressed by the weight average molecular weight (Mw).

The (B) high solubility component can be obtained by synthesis or purchase. As suppliers, Sigma-Aldrich, Tokyo Chemical Industry, Co., Ltd., and Nippon Shokubai Co., Ltd., can be cited.

In the processing liquid, the (B) high solubility component is preferably 1~100 mass % in comparison to the mass of the (A) low solubility component and more preferably 1~50 mass %. In the processing liquid, the (B) high solubility component is even more preferably 1~30 mass % in comparison to the mass of the (A) low solubility component.

<Solvent>

The (C) solvent preferably contains an organic solvent. The (C) solvent may have volatility. Having volatility means that the solvent is higher in volatility in comparison to water. For example, a boiling point at one atmospheric pressure of the (C) solvent is preferably 50~250° C. The boiling point at one atmospheric pressure of the solvent is more preferably 50~200° C. and even more preferably 60~170° C. The boiling point at one atmospheric pressure of the solvent is yet even more preferably 70~150° C. It is permissible for the (C) solvent to contain a small amount of pure water. The amount of pure water contained in the (C) solvent is preferably not more than 30 mass % in comparison to the entire (C) solvent. The amount of pure water contained in the solvent is more preferably not more than 20 mass % and even more preferably not more than 10 mass %. The amount of pure water contained in the solvent is yet even more preferably not more than 5 mass %. It is also a preferred embodiment that the solvent does not contain pure water (0 mass %). The pure water is preferably DIW.

As the organic solvent, an alcohol such as isopropanol (IPA), etc., an ethylene glycol monoalkyl ether such as ethylene glycol monomethyl ether, ethylene glycol monoethyl ether, etc., an ethylene glycol monoalkyl ether acetate such as ethylene glycol monomethyl ether acetate, ethylene glycol monoethyl ether acetate, etc., a propylene glycol monoalkyl ether such as propylene glycol monomethyl ether (PGME), propylene glycol monoethyl ether (PGEE), etc., a propylene glycol monoalkyl ether acetate such as propylene glycol monomethyl ether acetate (PGMEA), propylene glycol monoethyl ether acetate, etc., a lactic acid ester such as methyl lactate, ethyl lactate (EL), etc., an aromatic hydrocarbon such as toluene, xylene, etc., a ketone such as methyl ethyl ketone, 2-heptanone, cyclohexanone, etc., an amide such as N,N-dimethylacetamide, N-methylpyrrolidone, etc., or a lactone such as γ-butyrolactone, etc., can be cited. These organic solvents can be used alone or two or more types can be mixed and used.

As a preferred mode, the organic solvent contained in the (C) solvent is selected from IPA, PGME, PGEE, EL, PGMEA and any combination thereof. If the organic solvent is a combination of two types, a volume ratio thereof is preferably 20:80~80:20 and more preferably 30:70~70:30.

In comparison to the entire mass of the processing liquid, the (C) solvent is 0.1~99.9 mass %. In comparison to the entire mass of the processing liquid, the (C) solvent is preferably 50~99.9 mass % and more preferably 75~99.5 mass %. In comparison to the entire mass of the processing liquid, the (C) solvent is even more preferably 80~99 mass % and yet even more preferably 85~99 mass %.

<Other Additives>

The processing liquid of the present invention may further contain (D) other additives. As a mode of the present invention, the (D) other additives may include a surfactant, an acid, a base, an antibacterial agent, a bactericide, an antiseptic, and an antifungal agent (preferably, a surfactant) or may include a combination of any of the above.

As a mode of the present invention, in comparison to the mass of the (A) low solubility component in the processing liquid, the (D) other additives (the sum amount in a plurality of additives) is 0~100 mass (preferably 0~10 mass %, more preferably 0~5 mass % and even more preferably 0~3 mass %, and yet even more preferably 0~1 mass %). The processing liquid (D) which is free of other additives (0 mass %) is also a mode of the present invention.

<Corrosion Preventive Component>

As (F) corrosion preventive components, in addition to BTA, uric acid, caffeine, butelline, adenine, glyoxylic acid, glucose, fructose, mannose etc., are cited.

OTHER PREFERRED EMBODIMENTS

The present invention shall not be limited to the preferred embodiments described above but may be executed further in yet other embodiments.

The hydrophilization of the upper surface of the substrate W in the above-described first preferred embodiment may be, for example, carried out by such methods as UV irradiation, plasma processing, oxygen ashing, etc., that is, by a method other than processing by the first hydrophilizing liquid.

Further, in the above-described first preferred embodiment, the same organic solvent is used as the replacing liquid and the residue removing liquid. However, the organic solvent used as the replacing liquid and the organic solvent used as the residue removing liquid may be different from each other, if a nozzle for discharging the organic solvent as the replacing liquid and a nozzle for discharging the residue removing liquid are each provided. For example, methanol can be used as the replacing liquid, and IPA can be used as the residue removing liquid.

Further, in the above-described first preferred embodiment, the processing film 100 is partially dissolved by the peeling liquid, by which the penetrating hole 102 is formed and the peeling liquid reaches an interface between the processing film 100 and the substrate W via the penetrating hole 102. However, it is not always necessary to form a macroscopically visible penetrating hole 102. There may be a possibility that the high solubility solid 110 in the processing film 100 is dissolved by the peeling liquid, the peeling liquid reaches an interface between the processing film 100 and the substrate W via a space formed in the processing film 100.

In the above-described first preferred embodiment, the nozzle for discharging each processing fluid is not limited to that described above. For example, in the above-described preferred embodiments, the processing liquid, the hydrophilizing liquid and the peeling liquid are discharged from the moving nozzle toward the upper surface of the substrate W, and the rinse liquid, the organic solvent and the gas are discharged from the fixed nozzle (central nozzle 12) toward the upper surface of the substrate W. However, the rinse liquid, the organic solvent and the gas may be configured so as to be discharged from the moving nozzle. In addition to the rinse liquid, the organic solvent and the gas, the processing liquid, the hydrophilizing liquid and the peeling liquid may also be discharged from the central nozzle 12.

Further, in the fourth preferred embodiment, the upper surface of the substrate W may be hydrophilized in the prior hydrophilization step (Step S51) by a method such as UV irradiation, plasma processing and oxygen ashing, etc., other than processing by the second hydrophilizing liquid.

Further, in the substrate processing shown in FIG. 31, the same organic solvent is used as the replacing liquid and the residue removing liquid. However, the organic solvent used as the replacing liquid and the organic solvent used as the residue removing liquid may be different from each other, if a nozzle for discharging the organic solvent as the replacing liquid and a nozzle for discharging the residue removing liquid are each provided. For example, methanol can be used as the replacing liquid and IPA can be used as the residue removing liquid.

The nozzle for discharging each of the processing fluids (processing liquid, peeling liquid, rinse liquid, residue removing liquid, dissolving liquid, hydrophilizing liquid, heating medium, inert gas and replacing liquid) is not required to assume the modes shown in the above-described second to fourth preferred embodiments. For example, in the fourth preferred embodiment, such an configuration may also be possible that no first moving nozzle 9 is provided and the fourth moving nozzle 14 discharges the second hydrophilizing liquid and the dissolving liquid.

For example, where the second hydrophilizing liquid is SC1 and the dissolving liquid is ammonia water, a hydrogen peroxide solution can be mixed with the dissolving liquid to formulate the second hydrophilizing liquid. Therefore, only ammonia water is supplied to the fourth moving nozzle 14 and, thereby, the dissolving liquid can be discharged from the fourth moving nozzle 14. Ammonia water and a hydrogen peroxide solution are supplied to the fourth moving nozzle 14 and, thereby, SC1 can be discharged from the fourth moving nozzle 14.

An configuration that all the processing fluids are discharged from the moving nozzle or an configuration that all the processing fluids are discharged from the fixed nozzle disposed outside the substrate W in plan view makes it unnecessary to provide the facing member 6.

Further, in the above-described second to fourth preferred embodiments, the macroscopically visible penetrating hole 102 is not necessarily formed on the processing film 100. A space may be formed on the processing film 100 by dissolution of the high solubility solid 110, and the hydrophilizing liquid and the peeling liquid may pass through the space and reach an interface between the substrate W and the processing film 100.

The modified example of the second preferred embodiment shown in FIG. 21 is applicable to the substrate processing apparatus 1Q according to the third preferred embodiment and to the substrate processing apparatus 1R according to the fourth preferred embodiment. In other words, also in the peeling liquid supplying step (Step S24) of the substrate processing according to the third preferred embodiment and the peeling liquid supplying step (Step S24) of the substrate processing according to the fourth preferred embodiment, during the supply of the second peeling liquid to the upper surface of the substrate W, the opening degree of the organic solvent adjusting valve 93B and that of the pure water adjusting valve 94B can be adjusted to adjust the concentration of an organic solvent in the second peeling liquid which is supplied to the upper surface of the substrate W (organic solvent concentration adjusting step).

Further, in the substrate processing shown in FIG. 28 and FIG. 31, the dissolving liquid supplying step (Step S30) and the rinsing step (Step S31) can be omitted.

Further, in the substrate processing shown in FIG. 18, FIG. 23 and FIG. 28, the prior hydrophilization step (Step S50), the rinsing step (Step S51) and the replacing step (Step S52) can be executed.

In detail, in the substrate processing shown in FIG. 18, after the substrate carry-in step (Step S21), the prior hydrophilization step (Step S50), the rinsing step (Step S51) and the replacing step (Step S52) may be executed, and thereafter, the processing liquid supplying step (Step S22), the processing film forming step (Step S23), the peeling liquid supplying step (Step S24), the rinsing step (Step S25), the residue removing liquid supplying step (Step S26), the spin drying step (Step S27) and the substrate carry-out step (Step S28) may be executed in this order.

Similarly, in the substrate processing shown in FIG. 23, after the substrate carry-in step (Step S21), the prior hydrophilization step (Step S50), the rinsing step (Step S51) and the replacing step (Step S52) may be executed, and, thereafter, the processing liquid supplying step (Step S22), the processing film forming step (Step S23), the dissolving liquid supplying step (Step S30), the rinsing step (Step S31), the peeling liquid supplying step (Step S24), the rinsing step (Step S25), the residue removing liquid supplying step (Step S26), the spin drying step (Step S27) and the substrate carry-out step (Step S28) may be executed in this order.

Similarly, in the substrate processing shown in FIG. 28, after the substrate carry-in step (Step S21), the prior hydrophilization step (Step S50), the rinsing step (Step S51) and the replacing step (Step S52) may be executed and, thereafter, the processing liquid supplying step (Step S22), the processing film forming step (Step S23), the dissolving liquid supplying step (Step S30), the rinsing step (Step S31), the hydrophilizing liquid supplying step (Step S40), the rinsing step (Step S41), the peeling liquid supplying step (Step S24), the rinsing step (Step S25), the residue removing liquid supplying step (Step S26), the spin drying step (Step S27) and the substrate carry-out step (Step S28) may be executed in this order.

Further, in the substrate processing shown in FIG. 28, the rinsing step (Step S31) can be omitted where the hydrophilizing liquid has compatibility with the dissolving liquid, and the rinsing step (Step S41) can be omitted where the hydrophilizing liquid has compatibility with the peeling liquid. In the substrate processing shown in FIG. 23 and FIG. 31, the rinsing step (Step S31) can be omitted where the dissolving liquid has compatibility with the peeling liquid.

In the present specification, when a numeral range is indicated by using "~" or "–," unless specifically mentioned otherwise, the range includes both endpoints and the units are the same.

While preferred embodiments of the present invention have been described above, it is to be understood that variations and modifications will be apparent to those skilled in the art without departing from the scope and spirit of the present invention.

The scope of the present invention, therefore, is to be determined solely by the following claims.

What is claimed is:

1. A substrate processing method comprising:
a processing liquid supplying step of supplying a processing liquid toward a surface of a substrate;
a processing film forming step in which the processing liquid supplied to the surface of the substrate is solidified or cured to form, on the surface of the substrate, a processing film which holds a removal object present on the surface of the substrate;
a peeling removal step in which a peeling liquid is supplied toward the front surface of the substrate, to partially dissolve the processing film in the peeling liquid, to peel the processing film in a state of holding the removal object from the front surface of the substrate and to remove the peeled processing film outside the substrate; and
a residue removing step in which, after the peeling removal step, a residue removing liquid is supplied toward the surface of the substrate to remove a residue of the processing film remaining on the surface of the substrate; wherein
the peeling liquid is a liquid mixture of water and an organic solvent,
the residue removing liquid is an organic solvent composed of the same substance as the organic solvent in the liquid mixture,
the organic solvent is IPA,
a mass percent concentration of IPA in the liquid mixture is not less than 12% and not more than 33%, and
a contact angle of pure water associated with the peeling liquid comprising the IPA for the surface of the substrate is smaller than 41.7°.

2. The substrate processing method according to claim 1, wherein
the processing film is more easily dissolved in the organic solvent than in water.

3. The substrate processing method according to claim 1, wherein
the peeling removal step includes a step of forming a penetrating hole in the processing film by partially dissolving the processing film in the peeling liquid.

4. The substrate processing method according to claim 1, wherein
the processing liquid contains a solvent and a solute which is dissolved by the solvent,
the solute has a high solubility component and a low solubility component lower in solubility in the peeling liquid than the high solubility component,
the processing film forming step includes a step which forms the processing film having a high solubility solid formed by the high solubility component and a low solubility solid formed by the low solubility component, and
the peeling removal step includes a step in which the high solubility solid is dissolved by the peeling liquid and the processing film in a state of holding the removal object is peeled from the surface of the substrate.

5. The substrate processing method according to claim 1, wherein
the peeling removal step includes a peeling liquid entry step in which the peeling liquid enters between the surface of the substrate and the processing film.

6. The substrate processing method according to claim 1, wherein
the peeling removal step includes a hydrophilization step of hydrophilizing the surface of the substrate by the peeling liquid.

7. The substrate processing method according to claim 1, further comprising: a prior hydrophilization step of hydrophilizing the surface of the substrate before the processing liquid is supplied to the surface of the substrate.

* * * * *